(12) United States Patent
Furue et al.

(10) Patent No.: US 11,527,726 B2
(45) Date of Patent: Dec. 13, 2022

(54) ORGANIC ELECTROLUMINESCENCE DEVICE AND COMPOUND FOR ORGANIC ELECTROLUMINESCENCE DEVICE

(71) Applicant: Samsung Display Co., Ltd., Yongin-si (KR)

(72) Inventors: Ryuhei Furue, Yokohama (JP); Hirokazu Kuwabara, Yokohama (JP); Nobutaka Akashi, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 325 days.

(21) Appl. No.: 16/928,610

(22) Filed: Jul. 14, 2020

(65) Prior Publication Data

US 2021/0126202 A1    Apr. 29, 2021

(30) Foreign Application Priority Data

Oct. 24, 2019    (KR) .................. 10-2019-0133199

(51) Int. Cl.
*H01L 51/00*    (2006.01)

(52) U.S. Cl.
CPC ...... *H01L 51/0072* (2013.01); *H01L 51/0067* (2013.01); *H01L 51/0073* (2013.01); *H01L 51/0074* (2013.01)

(58) Field of Classification Search
CPC ............. H01L 51/0072; H01L 51/0067; H01L 51/0073; H01L 51/0074
See application file for complete search history.

(56) References Cited

U.S. PATENT DOCUMENTS

| | | |
|---|---|---|
| 2014/0054564 A1 | 2/2014 | Kim et al. |
| 2017/0069848 A1 | 3/2017 | Zeng et al. |
| 2017/0271598 A1 | 9/2017 | Zeng et al. |

FOREIGN PATENT DOCUMENTS

| | | |
|---|---|---|
| CN | 106432251 A | 2/2017 |
| DE | 10 2016 115 851 B3 | 7/2017 |
| JP | 6543211 B2 | 7/2019 |
| KR | 10-2014-0000611 A | 1/2014 |
| KR | 10-2014-0039622 A | 4/2014 |
| KR | 10-1745336 B1 | 6/2017 |
| KR | 10-2018-0083152 A | 7/2018 |
| WO | WO 2018/131877 A1 | 7/2018 |
| WO | WO 2018/207750 A1 | 11/2018 |

*Primary Examiner* — Victor A Mandala
*Assistant Examiner* — Colleen E Snow
(74) *Attorney, Agent, or Firm* — Lewis Roca Rothgerber Christie LLP

(57) ABSTRACT

An organic electroluminescence device including a first electrode, a second electrode, and an emission layer between the first electrode and the second electrode, wherein the emission layer includes a compound represented by Formula 1 to achieve high efficiency and an improved efficiency drop in a deep blue emission wavelength region:

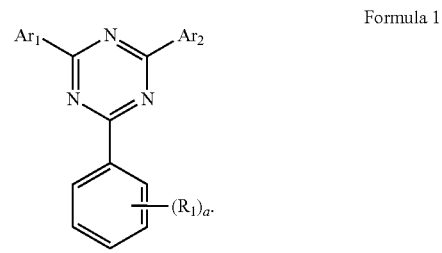

Formula 1

20 Claims, 2 Drawing Sheets

ORGANIC ELECTROLUMINESCENCE DEVICE AND COMPOUND FOR ORGANIC ELECTROLUMINESCENCE DEVICE

CROSS-REFERENCE TO RELATED APPLICATION

This application claims priority to and the benefit of Korean Patent Application No. 10-2019-0133199, filed on Oct. 24, 2019, the entire content of which is hereby incorporated by reference.

BACKGROUND

1. Field

One or more aspects of embodiments of the present disclosure herein relate to an organic electroluminescence device and a compound for an organic electroluminescence device.

2. Description of the Related Art

Recently, the development of organic electroluminescence displays as an image display device is being actively conducted. Unlike liquid crystal display devices and the like, organic electroluminescence displays are self-luminescent display devices, in which holes and electrons respectively injected from a first electrode and a second electrode recombine in an emission layer, and thus a luminescent material including an organic compound in the emission layer emits light to implement display of images.

In the application of an organic electroluminescence device to a display device, there is a demand (or desire) for an organic electroluminescence device having a low driving voltage, high luminous efficiency, and a long life, and development of materials for an organic electroluminescence device capable of stably attaining such characteristics is being continuously required (or desired).

In recent years, particularly in order to implement a highly efficient organic electroluminescence device, technologies pertaining to phosphorescence emission using triplet state energy or delayed fluorescence using triplet-triplet annihilation (TTA), in which singlet excitons are generated by collision of triplet excitons, are being developed, and thermally activated delayed fluorescence (TADF) materials using a delayed fluorescence phenomenon are being developed.

SUMMARY

One or more aspects of embodiments of the present disclosure are directed toward an organic electroluminescence device having an improved efficiency drop phenomenon.

One or more aspects of embodiments of the present disclosure are also directed toward a compound for an organic electroluminescence device having high efficiency characteristics.

Embodiments of the present disclosure provide a compound represented by Formula 1.

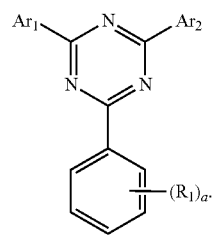

Formula 1

In Formula 1, any one selected from $Ar_1$ and $Ar_2$ may be a substituted or unsubstituted adamantyl group, the remaining one selected from $Ar_1$ and $Ar_2$ may be a substituted or unsubstituted adamantyl group, or a substituted or unsubstituted phenyl group, a may be an integer of 1 to 5, $R_1$ may be a hydrogen atom, a deuterium atom, a substituted or unsubstituted oxy group, a substituted or unsubstituted thio group, a substituted or unsubstituted alkyl group having 1 to 20 carbon atoms, a substituted or unsubstituted aryl group having 6 to 20 ring-forming carbon atoms, or a substituted or unsubstituted heteroaryl group having 2 to 20 ring-forming carbon atoms, and at least one $R_1$ may be represented by Formula 2.

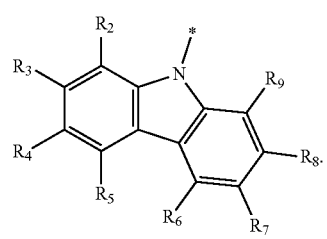

Formula 2

In Formula 2, $R_2$ to $R_9$ may each independently be a hydrogen atom, a deuterium atom, a substituted or unsubstituted oxy group, a substituted or unsubstituted thio group, a substituted or unsubstituted alkyl group having 1 to 20 carbon atoms, a substituted or unsubstituted aryl group having 6 to 20 ring-forming carbon atoms, or a substituted or unsubstituted heteroaryl group having 2 to 20 ring-forming carbon atoms, and at least one pair selected from $R_6$ and $R_7$, and R and $R_9$ may be bonded to each other to form a condensed heterocycle.

Formula 1 may be represented by Formula 1-1 or Formula 1-2.

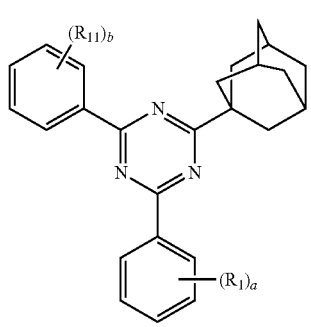

Formula 1-1

Formula 1-2

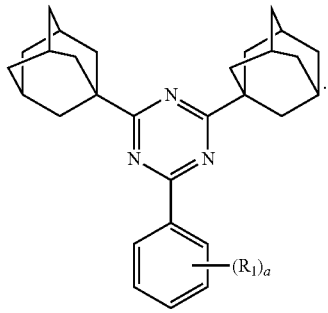

In Formulae 1-1 and 1-2, b may be an integer of 0 to 5, $R_{11}$ may be a hydrogen atom, a deuterium atom, a substituted or unsubstituted oxy group, a substituted or unsubstituted thio group, a substituted or unsubstituted alkyl group having 1 to 20 carbon atoms, a substituted or unsubstituted aryl group having 6 to 20 ring-forming carbon, or a substituted or unsubstituted heteroaryl group having 2 to 20 ring-forming carbon atoms, and a and $R_1$ are the same as defined in Formula 1.

Formula 1-1 may be represented by Formula 1-1A or Formula 1-1B.

Formula 1-1A

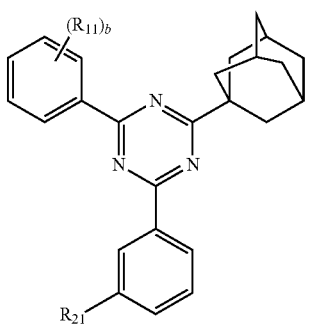

Formula 1-1B

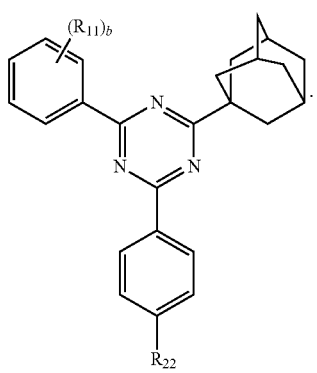

In Formulae 1-1A and 1-1B, b and $R_{11}$ are the same as defined in Formula 1-1, and $R_{21}$ and $R_{22}$ may each independently be represented by Formula 2.

Formula 1-2 may be represented by Formula 1-2A or Formula 1-2B.

Formula 1-2A

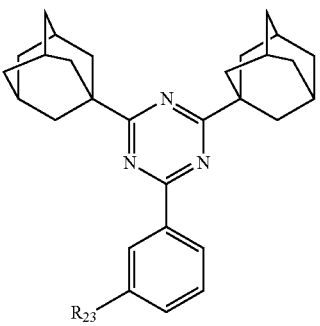

Formula 1-2B

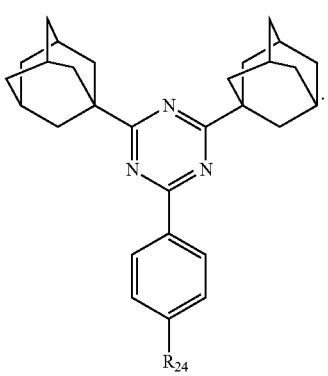

In Formulae 1-2A and 1-2B, $R_{23}$ and $R_{24}$ may each independently be represented by Formula 2.

Formula 2 may be represented by any one of Formulae 2-1 to 2-3.

Formula 2-1

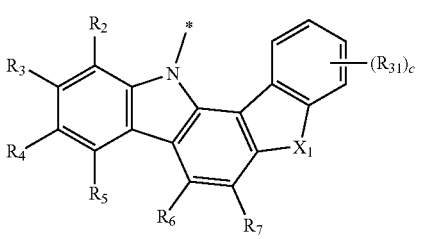

Formula 2-2

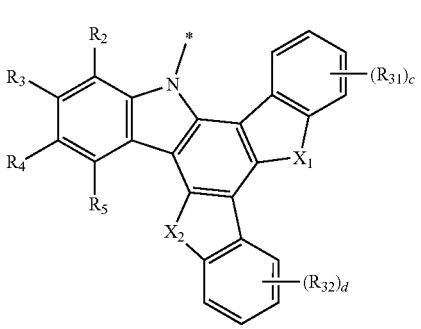

Formula 2-3

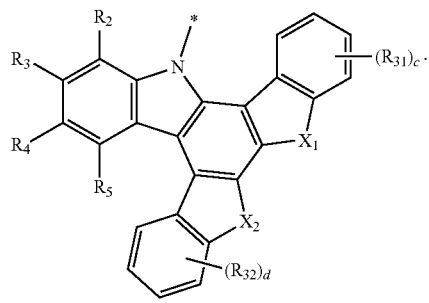

In Formulae 2-1 to 2-3, $X_1$ and $X_2$ may each independently be $NR_{13}$, O, or S, $R_{13}$ may be a hydrogen atom, a deuterium atom, a halogen atom, a substituted or unsubstituted alkyl group having 1 to 20 carbon atoms, an unsubstituted aryl group having 6 to 20 ring-forming carbon atoms, or an unsubstituted heteroaryl group having 2 to 20 ring-forming carbon atoms, c and d may each independently be an integer of 0 to 4, $R_6$, $R_7$, $R_{31}$ and $R_{32}$ may each independently be a hydrogen atom, a deuterium atom, a substituted or unsubstituted oxy group, a substituted or unsubstituted thio group, a substituted or unsubstituted alkyl group having 1 to 20 carbon atoms, a substituted or unsubstituted aryl group having 6 to 20 ring-forming carbon atoms, or a substituted or unsubstituted heteroaryl group having 2 to 20 ring-forming carbon atoms, and $R_2$ to $R_5$ are the same as defined in Formula 2.

Formula 2-1 may be represented by any one of Formulae 2-1A to 2-1C.

Formula 2-1A

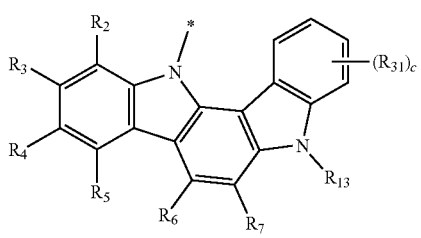

Formula 2-1B

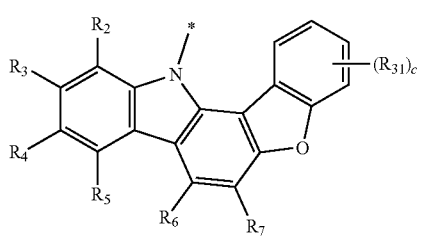

Formula 2-1C

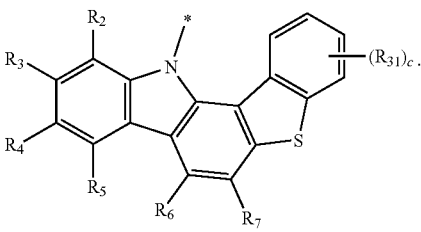

In Formulae 2-1A to 2-1C, $R_2$ to $R_7$, $R_{13}$, $R_{31}$, and c are the same as defined in Formula 2-1.

Formula 2-2 may be represented by any one of Formulae 2-2A to 2-2C.

Formula 2-2A

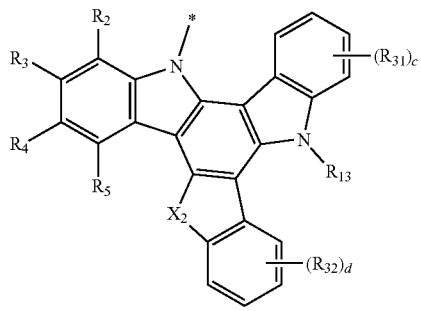

Formula 2-2B

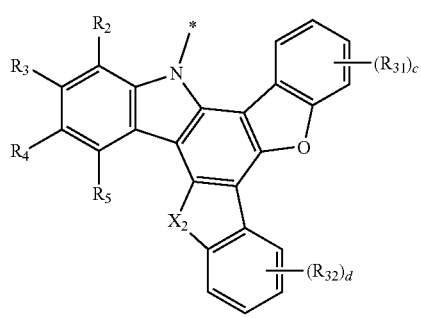

Formula 2-2C

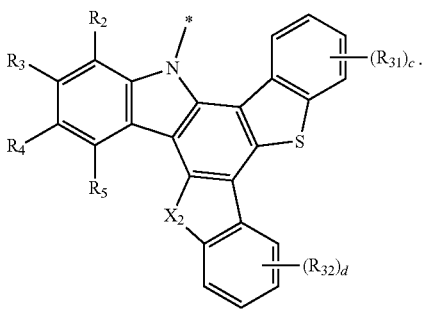

In Formulae 2-2A to 2-2C, $R_2$ to $R_5$, $R_{13}$, $R_{31}$, $R_{32}$, c, d, and $X_2$ are the same as defined in Formula 2-2.

Formula 2-3 may be represented by any one of Formulae 2-3A to 2-3C.

Formula 2-3A

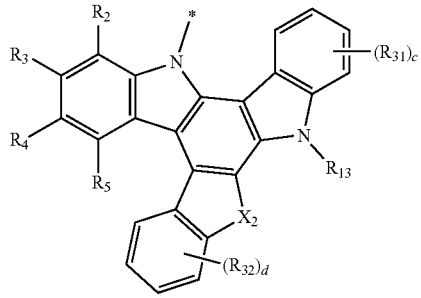

Formula 2-3B

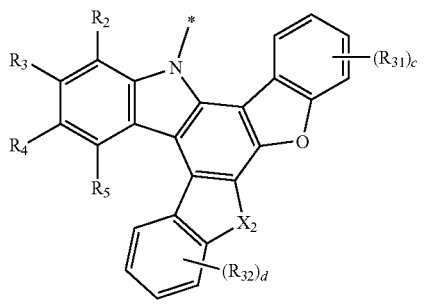

Formula 2-3C

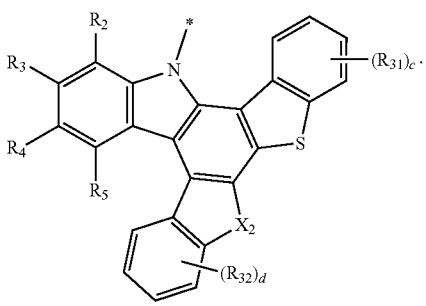

In Formulae 2-3A to 2-3C, $R_2$ to $R_5$, $R_{13}$, $R_{31}$, $R_{32}$, c, d, and $X_2$ are the same as defined in Formula 2-3.

A compound represented by Formula 1 may be a thermally activated delayed fluorescence material.

In other embodiments of the present disclosure, an organic electroluminescence device includes a first electrode, a second electrode on the first electrode, and an emission layer between the first electrode and the second electrode, wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides thereof, and containing the compound of the above-described embodiment.

The emission layer may emit delayed fluorescence.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
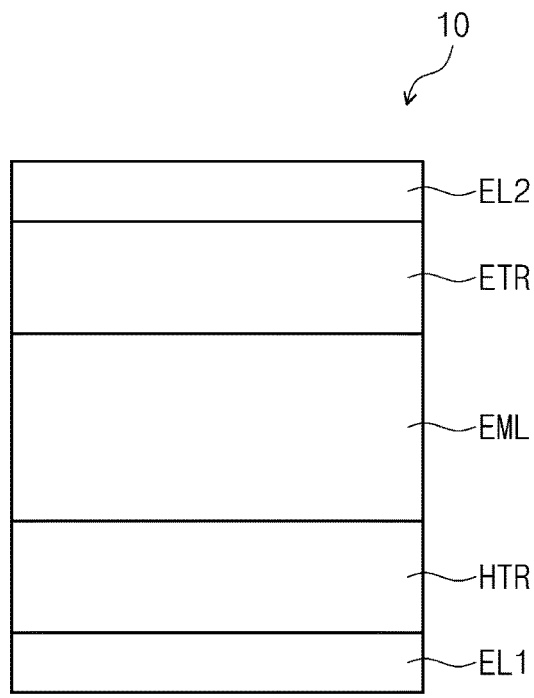
FIG. 1 is a cross-sectional view schematically illustrating an organic electroluminescence device according to an embodiment of the present disclosure.

The present disclosure may have various modifications and may be embodied in different forms, and example embodiments will be explained in more detail with reference to the accompany drawings. The present disclosure may, however, be embodied in different forms and should not be construed as limited to the embodiments set forth herein. Rather, all modifications, equivalents, and substituents which are included in the spirit and technical scope of the present disclosure should be included in the present disclosure.

It will be understood that when an element or layer is referred to as being "on", "connected to" or "coupled to" another element or layer, it can be directly on, connected or coupled to the other element or layer (without any intervening elements or layers therebetween) or intervening elements or layers may be present.

Like numbers refer to like elements throughout. Also, in the drawings, the thickness, the ratio, and the dimensions of elements are exaggerated for an effective description of technical contents.

The term "and/or," includes all combinations of one or more of which associated configurations may define. Expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure."

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and the like are used to describe the relationship of the configurations shown in the drawings. These terms are used as a relative concept and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", "include," and "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, an organic electroluminescence device according to an embodiment of the present disclosure and a compound of an embodiment included therein will be described with reference to the accompanying drawings.

FIGS. 1 to 4 are cross-sectional views schematically illustrating an organic electroluminescence device according to an embodiment of the present disclosure. Referring to FIGS. 1 to 4, in an organic electroluminescence device 10 according to an embodiment, a first electrode EL1 and a second electrode EL2 are positioned to face each other and an emission layer EML may be provided between the first electrode EL1 and the second electrode EL2.

The organic electroluminescence device 10 of an embodiment further includes a plurality of functional layers between the first electrode EL1 and the second electrode EL2, in addition to the emission layer EML. The plurality of functional layers may include a hole transport region HTR and an electron transport region ETR. For example, the organic electroluminescence device 10 according to an embodiment may include the first electrode EL1, the hole transport region HTR, the emission layer EML, the electron transport region ETR, and the second electrode EL2 that are stacked in this order. In some embodiments, the organic electroluminescence device 10 may include a capping layer CPL on the second electrode EL2.

The organic electroluminescence device 10 of an embodiment includes a compound of an embodiment that will be described in more detail later in the emission layer EML between the first electrode EL1 and the second electrode EL2.

Figure 2:
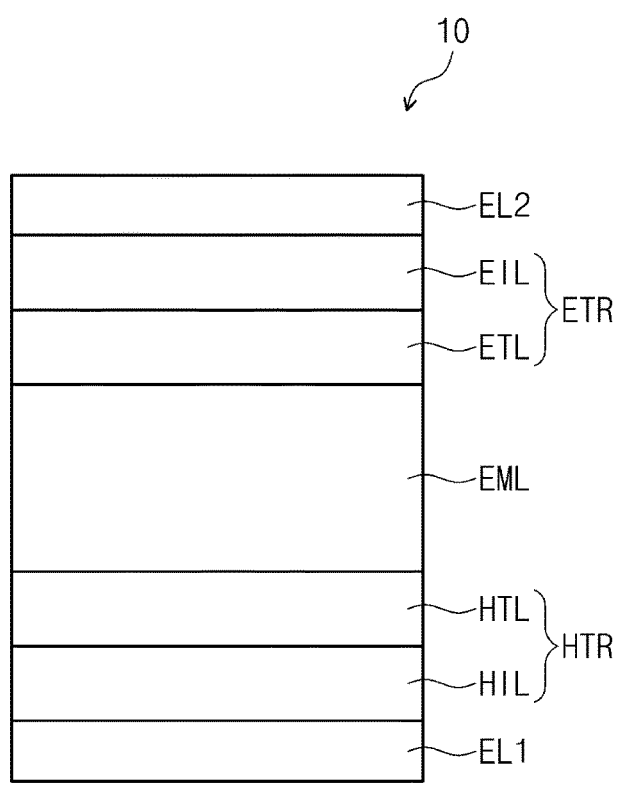
FIG. 2 is a cross-sectional view schematically illustrating an organic electroluminescence device according to an embodiment of the present disclosure.
Figure 3:
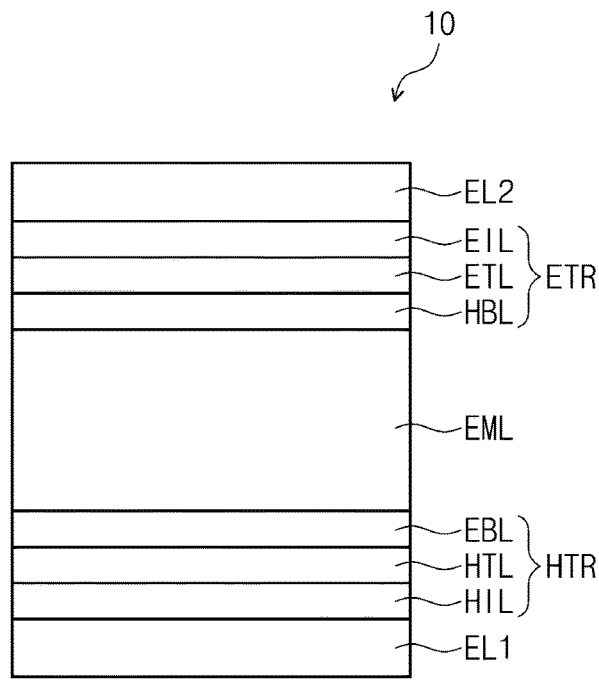
FIG. 3 is a cross-sectional view schematically illustrating an organic electroluminescence device according to an embodiment of the present disclosure.
Figure 4:
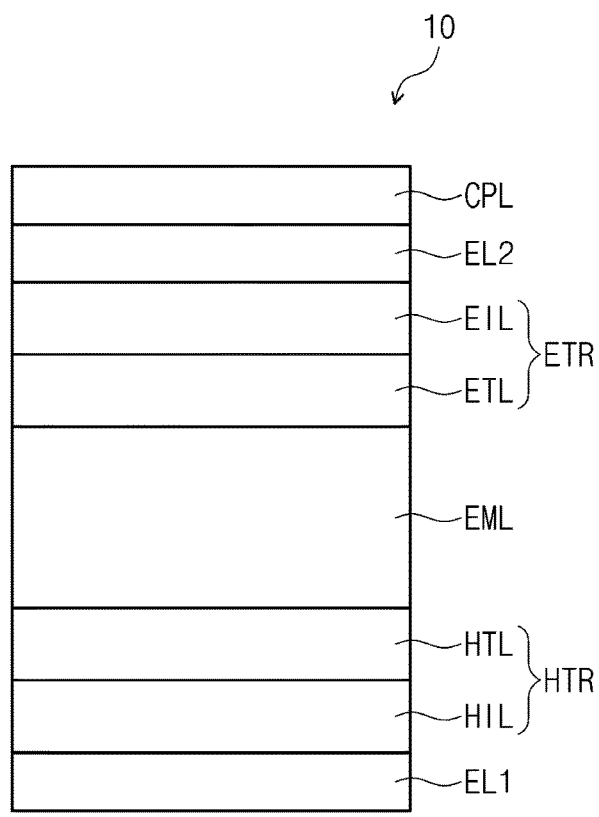
FIG. 4 is a cross-sectional view schematically illustrating an organic electroluminescence device according to an embodiment of the present disclosure.

Compared to FIG. 1, FIG. 2 illustrates a cross-sectional view of an organic electroluminescence device 10 of an embodiment in which a hole transport region HTR includes a hole injection layer HIL and a hole transport layer HTL, and an electron transport region ETR includes an electron injection layer EIL and an electron transport layer ETL. Compared to FIG. 1, FIG. 3 illustrates a cross-sectional view of an organic electroluminescence device 10 of an embodiment in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared to FIG. 2, FIG. 4 illustrates a cross-sectional view of an organic electroluminescence device 10 of an embodiment including a capping layer CPL on the second electrode EL2.

The first electrode EL1 has a conductivity. The first electrode EL1 may be formed of a metal alloy or any suitable conductive compound. The first electrode EL1 may be an anode. Also, the first electrode EL1 may be a pixel electrode. The first electrode EL1 may be a transmissive electrode, a transflective electrode, or a reflective electrode. When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In some embodiments, the first electrode EL1 may have a multilayer structure including a reflective layer or a transflective layer, and a transmissive layer formed of indium tin oxide (ITO), indium zinc oxide (IZO), zinc oxide (ZnO), indium tin zinc oxide (ITZO, etc. For example, the first electrode EL1 may have a three-layer structure of ITO/Ag/ITO, but is not limited thereto. The thickness of the first electrode EL1 may be from about 1,000 Å to about 10,000 Å, for example, from about 1,000 Å to about 3,000 Å.

The hole transport region HTR may be provided on the first electrode EL1. The hole transport region HTR may include at least one of a hole injection layer HIL, a hole transport layer HTL, a hole buffer layer, or an electron blocking layer EBL. The thickness of the hole transport region HTR may be, for example, about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of a hole injection layer HIL or a hole transport layer HTL, and may have a single layer structure formed of a hole injection material and a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in order from the first electrode EL1, but an embodiment is not limited thereto.

The hole transport region HTR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4',4'-tris(N,N-diphenylamino)triphenylamine (TDATA), 4,4',4"-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-I-yl)-N,N'-diphenyl-benzidine (NPD), triphenylamine-containingpolyetherketone (TPAPEK),4-isopropyl-4'-methyldiphenyliodonium tetrakis (pentafluorophenyl)borate,dipyrazino[2,3-f:2',3'-h]quinoxaline-2,3,6,7,10,11-hexacarbonitrile (HAT-CN), etc.

The hole transport layer HTL may further include, for example, carbazole derivatives (such as N-phenyl carbazole and/or polyvinyl carbazole), fluorine derivatives, N,N'-bis (3-methylphenyl)-N,N'-diphenyl-[1,1-biphenyl]-4,4'-diamine (TPD), triphenylamine derivatives (such as 4,4',4"-tris(N-carbazolyl)triphenylamine (TCTA)), N,N'-di(1-naphtalene-1-yl)-N,N'-diphenyl-benzidine (NPB), 4,4'-cyclohexylidene bis[N,N-bis(4-methylphenyl] benzenamine] (TAPC), 4,4'-bis[N,N'-(3-tolyl)amino]-3,3'-dimethylbiphenyl (HMTPD), 1,3-Bis(N-carbazolyl)benzene (mCP), etc.

The thickness of the hole transport region HTR may be from about 100 Å to about 10,000 Å, for example, from about 100 Å to about 5,000 Å. The thickness of the hole injection region HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. When the thicknesses of the hole transport region HTR, the hole injection layer HIL, the hole transport layer HTL, and the electron blocking layer EBL satisfy the-described ranges, satisfactory (or suitable) hole transport properties may be achieved without substantial increase of a driving voltage.

The hole transport region HTR may further include a charge generating material, in addition to the above-described materials to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, but is not limited thereto. Non-limiting examples of the p-dopant may include quinone derivatives (such as tetracyanoquinodimethane (TCNQ) and/or 2,3,5,6-tetrafluoro-7,7,8,8-tetracyanoquinodimethane (F4-TCNQ)), and metal oxides (such as tungsten oxide and/or molybdenum oxide).

As described above, the hole transport region HTR may further include at least one of a hole buffer layer or an electron blocking layer EBL, in addition to the hole injection layer HIL, the hole transport layer HTL. The hole buffer layer may compensate an optical resonance distance according to the wavelength of light emitted from the emission layer EML and may increase light emission efficiency. Materials which may be included in the hole transport region HTR may be used as materials which may be included in the hole buffer layer. The electron blocking layer EBL is a layer that serves to prevent or reduce electron injection from the electron transport region ETR to the hole transport region HTR.

The emission layer EML may be provided on the hole transport region HTR. The thickness of the emission layer EML may be, for example, from about 100 Å to about 1000 Å or from about 100 Å to about 300 Å. The emission layer EML may have a single layer formed of a single material, a single layer formed of a plurality of different materials, or a multilayer structure having a plurality of layers formed of a plurality of different materials.

The emission layer EML in the organic electroluminescence device 10 of an embodiment may include a compound according to an embodiment of the present disclosure.

In the description, the term "substituted or unsubstituted" may refer to a group that is unsubstituted or that is substituted with at least one substituent selected from the group consisting of a deuterium atom, a halogen atom, a cyano group, a nitro group, an amino group, a silyl group, oxy group, thio group, sulfinyl group, sulfonyl group, carbonyl group, a boron group, a phosphine oxide group, a phosphine sulfide group, an alkyl group, an alkenyl group, an alkoxy group, a hydrocarbon ring group, an aryl group, and a heterocyclic group (e.g., a heterocycle). In addition, each of the substituents described above may itself be substituted or unsubstituted. For example, a biphenyl group may be interpreted as an aryl group or a phenyl group substituted with a phenyl group.

In the description, examples of the halogen atom may include a fluorine atom, a chlorine atom, a bromine atom and/or an iodine atom.

In the description, the alkyl group may be a linear, branched or cyclic alkyl group. The carbon number of the alkyl group is 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, c-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., but is not limited thereto.

In the description, the aryl group may refer to a functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., but are not limited thereto.

In the description, the heteroaryl group may include at least one of B, O, N, P, Si, or S as a ring-forming hetero atom. When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include thiophene, furan, pyrrole, imidazole, thiazole, oxazole, oxadiazole, triazole, pyridine, bipyridine, pyrimidine, triazine, triazole, acridine, pyridazine, pyrazine, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophenyl, thienothiophene, benzofuran, phenanthroline, thiazole, isooxazole, oxadiazole, thiadiazole, phenothiazole, phenothiazine, dibenzosilole, dibenzofuran, etc., but are not limited thereto.

In the description, a thio group may include an alkylthio group and an arylthio group.

In the description, the alkyl group in the alkylthio group is the same as described herein.

In the description, the oxy group may include an alkoxy group and an aryl oxy group. The alkoxy group may be a linear, branched or cyclic chain. The number of carbons in the alkoxy group may be, for example, 1 to 20, or 1 to 10, but is not particularly limited thereto. Also, the number of carbons in the aryl oxy group may be, for example, 6 to 20, or 6 to 10, but is not particularly limited thereto. Examples of the oxy group may include, but are not limited to, methoxy group, ethoxy group, n-propoxy group, isopropoxy group, butoxy group, pentyloxy group, hexyloxy group, octyloxy group, nonyloxy group, decyloxy group, benzyloxy group, etc.

In the description, the aryl group in the aryl oxy group and the aryl thio group is the same as described herein.

In the description, "—*" refers to a position to be connected (e.g., a binding site).

The compound according to an embodiment of the present disclosure may be represented by Formula 1.

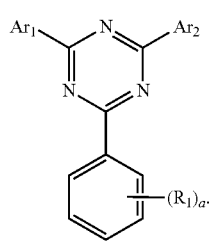

Formula 1

In Formula 1, any one selected from $Ar_1$ and $Ar_2$ may be a substituted or unsubstituted adamantyl group, the other one selected from $Ar_1$ and $Ar_2$ may be a substituted or unsubstituted adamantyl group, or a substituted or unsubstituted phenyl group. a may be an integer of 1 to 5.

When a is an integer of 2 or more, a plurality of $R_1$'s may be all the same as or different from each other.

$R_1$ may be a hydrogen atom, a deuterium atom, a substituted or unsubstituted oxy group, a substituted or unsubstituted thio group, a substituted or unsubstituted alkyl group having 1 to 20 carbon atoms, a substituted or unsubstituted aryl group having 6 to 20 ring-forming carbon atoms, or a substituted or a substituted or unsubstituted heteroaryl group having 2 to 20 ring-forming carbon atoms, and at least one $R_1$ may be represented by Formula 2.

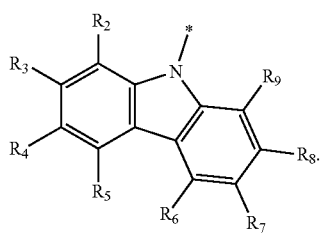

Formula 2

In Formula 2, $R_2$ to $R_9$ may each independently be a hydrogen atom, a deuterium atom, a substituted or unsubstituted oxy group, a substituted or unsubstituted thio group, a substituted or unsubstituted alkyl group having 1 to 20 carbon atoms, a substituted or unsubstituted aryl group having 6 to 20 ring-forming carbon atoms, or a substituted or unsubstituted heteroaryl group having 2 to 20 ring-forming carbon atoms. At least one pair selected from $R_6$ and $R_7$, and $R_8$ and $R_9$ is bonded to each other to form a condensed heterocycle.

The compound of an embodiment may be a triazine derivative in which three N's (nitrogen) and three C's (carbon) included in an aromatic ring are alternately arranged, where the triazine derivative includes an adamantyl group directly bonded to at least one of the three C's. A substituted or unsubstituted phenyl group may be bonded to the C atom to which the adamantyl group is not bonded. The phenyl group bonded to the C atom may include (e.g., may be substituted with) at least one condensed heterocycle. The condensed heterocycle has a structure in which a 5- to 7-membered aromatic ring is condensed, and may include two or three hetero atoms. At least one of the two or three hetero atoms is a nitrogen atom and the other hetero atoms may each independently be a nitrogen atom, an oxygen atom, or a sulfur atom.

The compound represented by Formula 1 may be represented by Formula 1-1 or Formula 1-2.

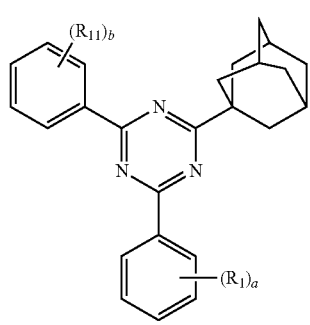

Formula 1-1

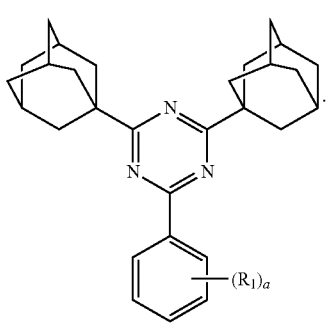

Formula 1-2

Formula 1-1 represents a case where one of $Ar_1$ and $Ar_2$ is an adamantyl group, and Formula 1-2 represents a case where both $Ar_1$ and $Ar_2$ are adamantyl groups. a and $R_1$ may be the same as described in Formula 1.

In Formulae 1-1 and 1-2, b is an integer of 0 to 5, and when b is an integer of 2 or more, a plurality of $R_{11}$'s may be all the same as or different from each other.

$R_{11}$ is a hydrogen atom, a deuterium atom, a substituted or unsubstituted oxy group, a substituted or unsubstituted thio group, a substituted or unsubstituted alkyl group having 1 to 20 carbon atoms, a substituted or unsubstituted aryl group having 6 to 20 ring-forming carbon, or a substituted or unsubstituted heteroaryl group having 2 to 20 ring-forming carbon atoms.

The compound represented by Formula 1-1 may be represented by Formula 1-1A or Formula 1-1B.

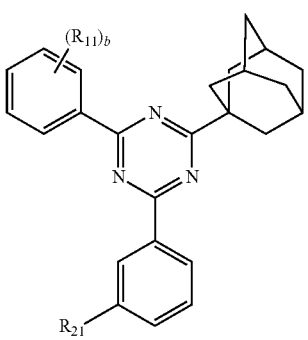

Formula 1-1A

Formula 1-1B

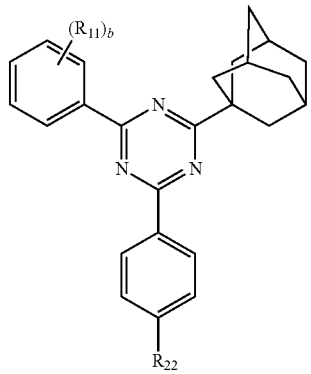

Formula 1-1A has a structure in which a triazine derivative and $R_{21}$ are bonded at meta positions with respect to a middle phenyl group, and Formula 1-1B has a structure in which a triazine derivative and $R_{22}$ are bonded at para positions with respect to the middle phenyl group.

In Formulae 1-1A and 1-1B, $R_{21}$ and $R_{22}$ may each independently be represented by Formula 2. For example, the compound of the present embodiments may be represented by Formula 1-1AA or Formula 1-1BB. However, an embodiment of the present disclosure is not limited thereto.

Formula 1-1AA

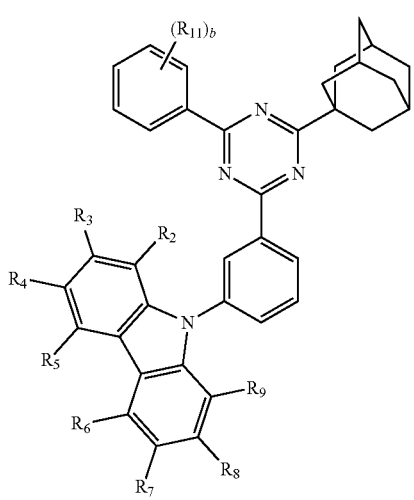

Formula 1-1BB

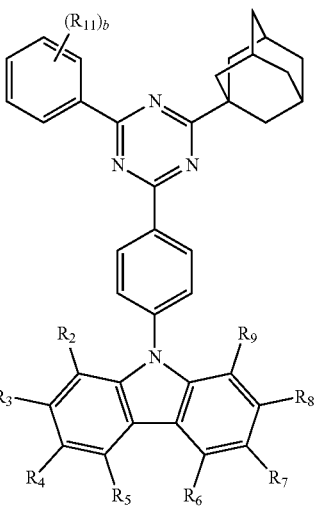

b and $R_{11}$ may be the same as described in Formula 1-1. $R_2$ to $R_9$ may be the same as described in Formula 2.

In some embodiments, the compound represented by Formula 1-2 may be represented by Formula 1-2A or Formula 1-2B.

Formula 1-2A

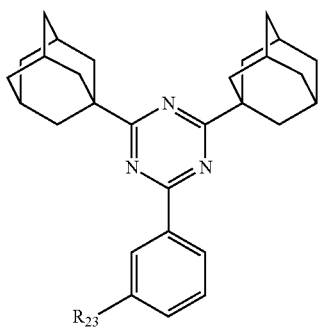

Formula 1-2B

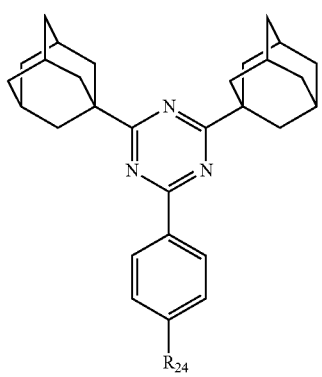

Formula 1-2A has a structure in which a triazine derivative and $R_{23}$ are bonded at meta positions with respect to a middle phenyl group, and Formula 1-2B has a structure in which a triazine derivative and $R_{24}$ are bonded at para positions with respect to the middle phenyl group.

In Formulae 1-2A and 1-2B, $R_{23}$ and $R_{24}$ are each independently represented by Formula 2. For example, Formula 1-2A or Formula 1-2B may be represented by Formula 1-2AA or Formula 1-2BB. However, an embodiment of the present disclosure is not limited thereto.

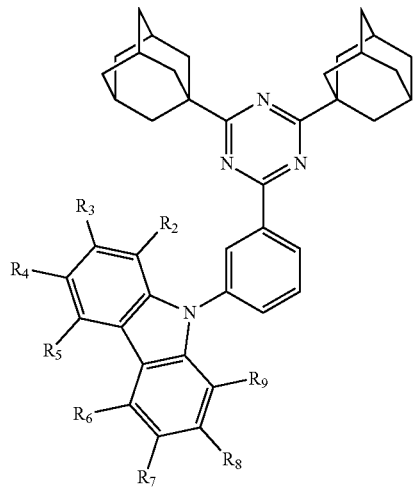

Formula 1-2AA

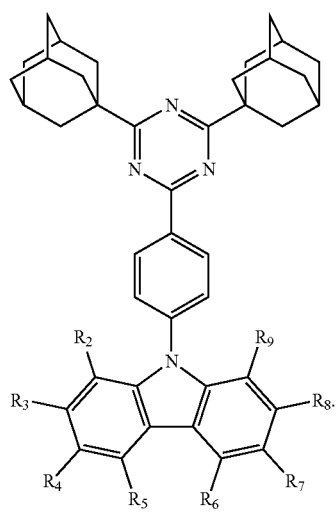

Formula 1-2BB $R_2$ to $R_9$ may be the same as described in Formula 2.

Formula 2 may be represented by any one of Formulae 2-1 to 2-3.

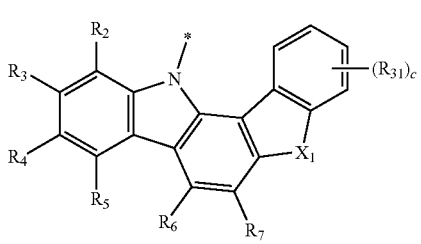

Formula 2-1

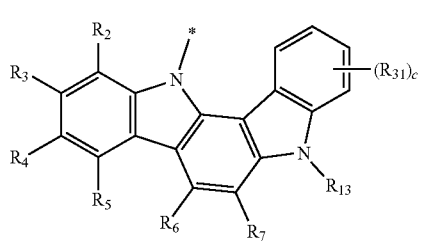

Formula 2-2

Formula 2-3

In Formula 2-1, $R_8$ and $R_9$ of Formula 2 form a condensed heterocycle, and in Formulae 2-2 and 2-3, $R_6$ and $R_7$, and $R_8$ and $R_9$ of Formula 2 each form a condensed heterocycle.

In Formulae 2-1 to 2-3, $X_1$ and $X_2$ may each independently be $NR_{13}$, O, or S. $R_2$ to $R_5$ may be the same as described in Formula 2.

$R_{13}$ may be a hydrogen atom, a deuterium atom, a halogen atom, a substituted or unsubstituted alkyl group having 1 to 20 carbon atoms, an unsubstituted aryl group having 6 to 20 ring-forming carbon atoms, or an unsubstituted heteroaryl group having 2 to 20 ring-forming carbon atoms.

c and d may each independently be an integer of 0 to 4. When c and/or d is an integer of 2 or more, a plurality of $R_{31}$'s or $R_{32}$'s may be all the same as or different from each other.

$R_6$, $R_7$, $R_{31}$ and $R_{32}$ may each independently be a hydrogen atom, a deuterium atom, a substituted or unsubstituted oxy group, a substituted or unsubstituted thio group, a substituted or unsubstituted alkyl group having 1 to 20 carbon atoms, a substituted or unsubstituted aryl group having 6 to 20 ring-forming carbon atoms, or a substituted or unsubstituted heteroaryl group having 2 to 20 ring-forming carbon atoms.

Formula 2-1 may be represented by any one of Formulae 2-1A to 2-1C.

Formula 2-1A

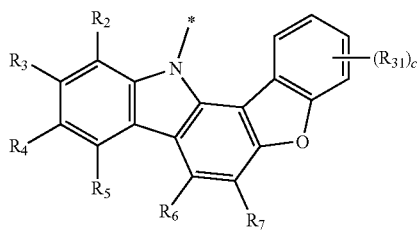

Formula 2-1B

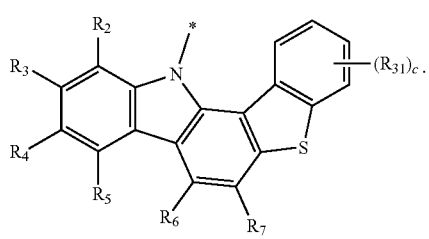

Formula 2-1C

Formula 2-1A represents a case where $X_1$ is $NR_{13}$, Formula 2-1B represents a case where $X_1$ is O, and Formula 2-1C represents a case where $X_1$ is S.

In Formulae 2-1A to 2-1C, $R_2$ to $R_7$, $R_{13}$, $R_{31}$, and c may be the same as described in Formula 2-1.

Formula 2-2 may be represented by any one of Formulae 2-2A to 2-2C described.

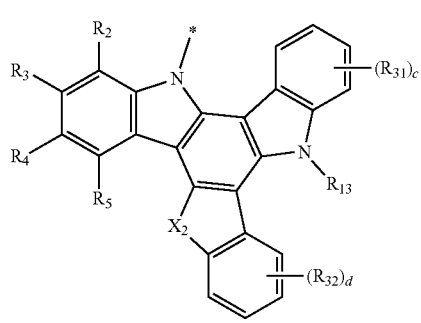

Formula 2-2A

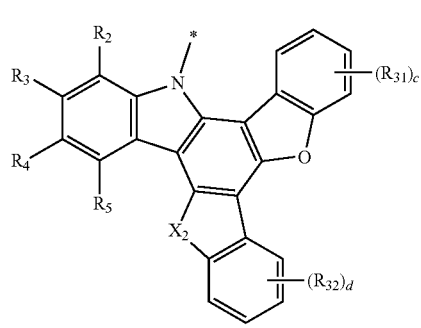

Formula 2-2B

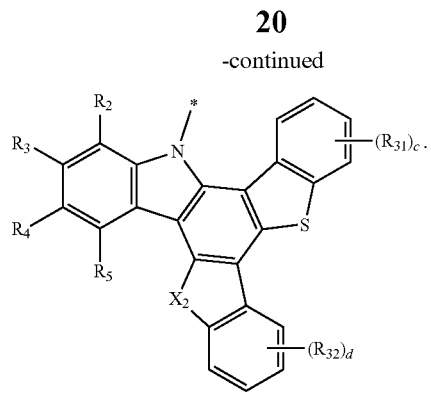

Formula 2-2C

Formula 2-2A represents a case where $X_1$ is $NR_{13}$, Formula 2-2B represents a case where $X_1$ is O, and Formula 2-2C represents a case where $X_1$ is S.

In Formulae 2-2A to 2-2C, $R_2$ to $R_5$, $R_{13}$, $R_{31}$, $R_{32}$, c, d, and $X_2$ may be the same as described in Formula 2-2.

Formula 2-3 may be represented by any one of Formulae 2-3A to 2-3C.

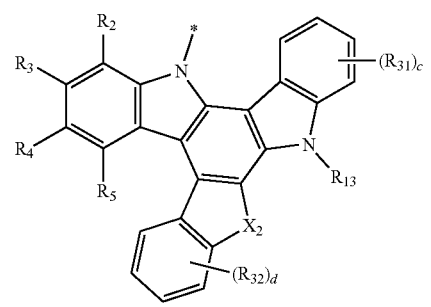

Formula 2-3A

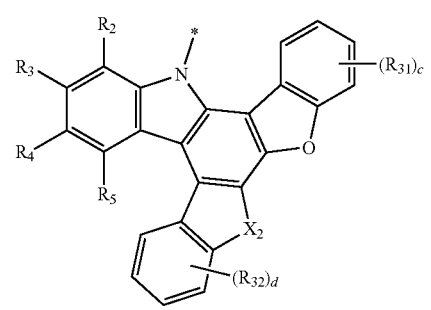

Formula 2-3B

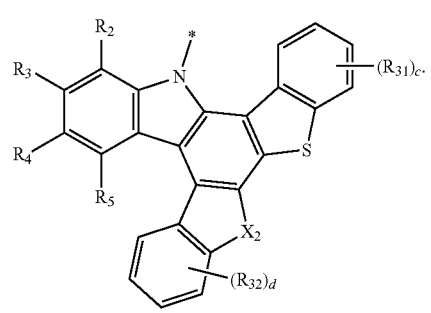

Formula 2-3C

Formula 2-3A represents a case where $X_1$ is $NR_{13}$, Formula 2-3B represents a case where $X_1$ is O, and Formula 2-3C represents a case where $X_1$ is S.

In Formulae 2-3A to 2-3C, $R_2$ to $R_5$, $R_{13}$, $R_{31}$, $R_{32}$, c, d, and $X_2$ may be the same as described in Formula 2-3.

The compound of an embodiment may have a structure in which one or two phenyl groups of the three phenyl groups linked to three carbons included in the triazine derivative are replaced with an unsubstituted adamantyl group. At least one of the phenyl groups linked to the triazine derivative may have heterocycle(s) as substituents. The compound according to an embodiment may be used as an emission material that emits deep blue light having an emission center wavelength in a wavelength region of about 470 nm or less. For example, the compound of an embodiment represented by Formula 1 may be an emission material having an emission center wavelength in a wavelength region of about 430 nm to about 490 nm.

The compound of an embodiment may be anyone of the compounds represented by Compound Group 1. The organic electroluminescence device 10 of an embodiment may include at least one of the compounds represented by Compound Group 1 in the emission layer EML.

Compound Group 1

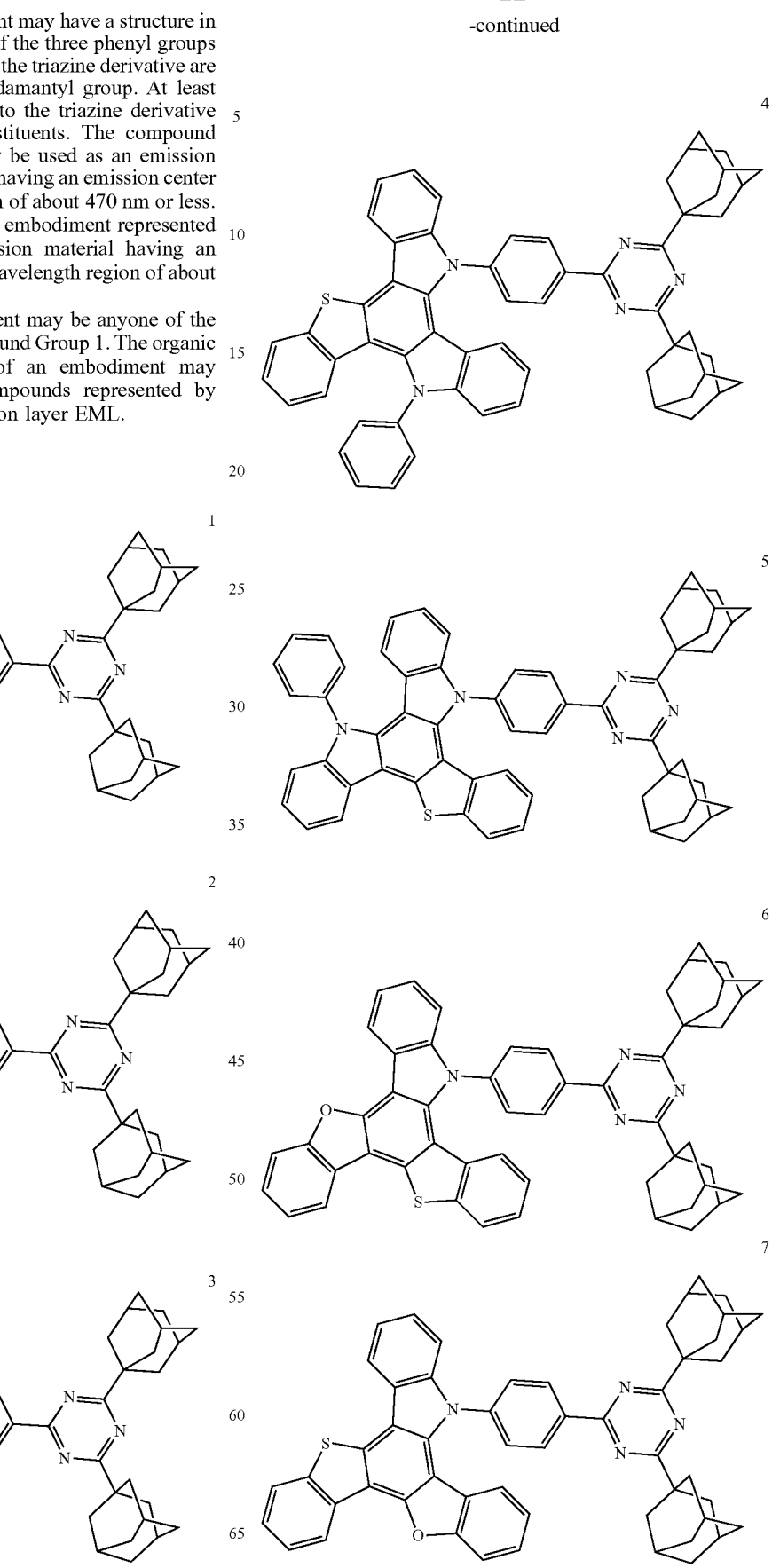

8
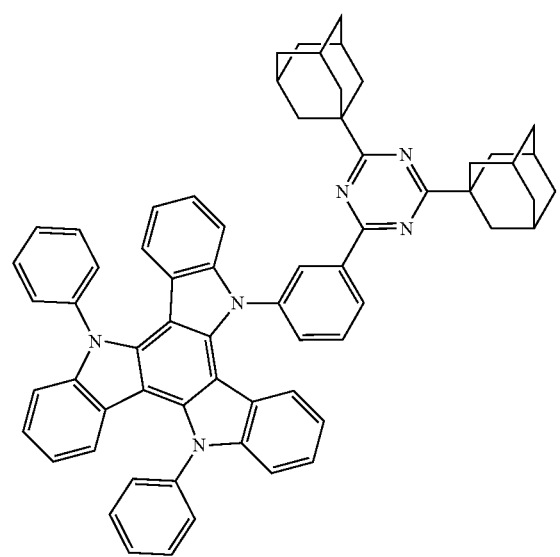
9
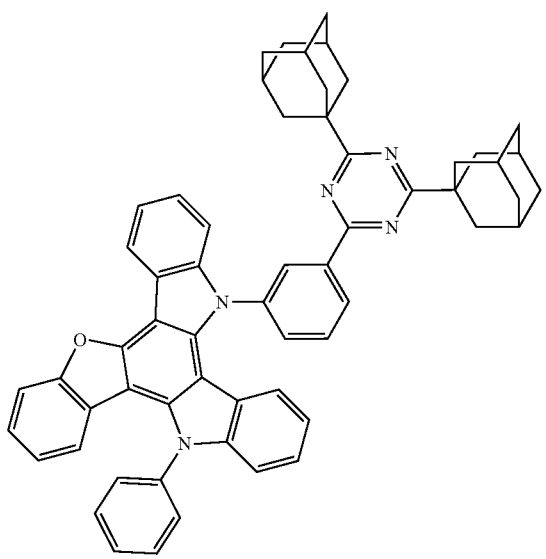
10
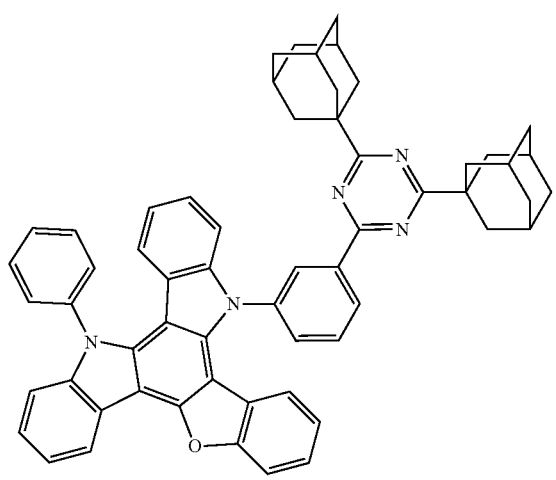
11
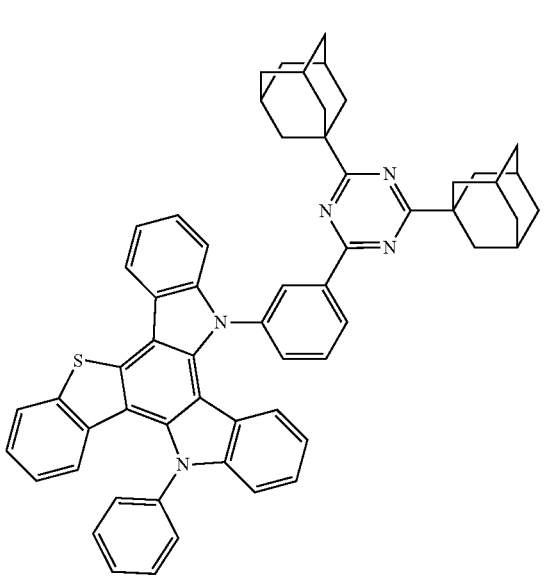
12
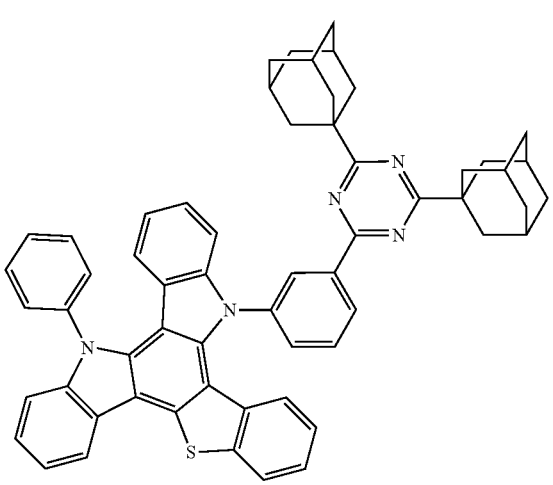
13
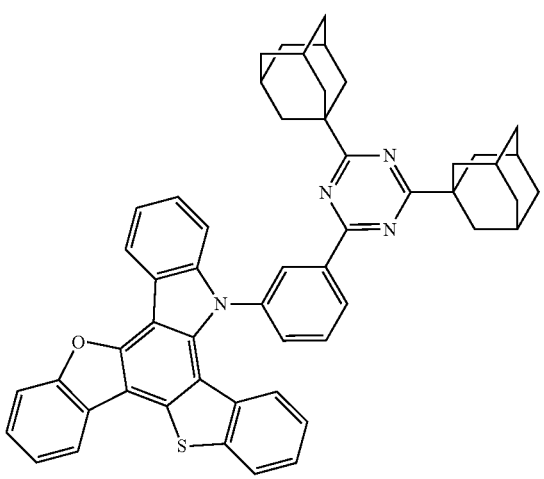

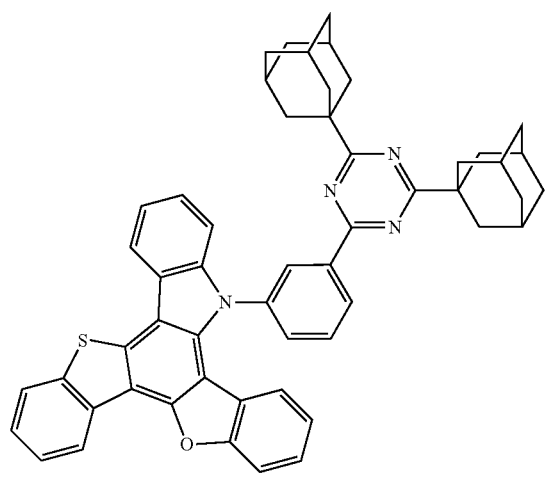
14
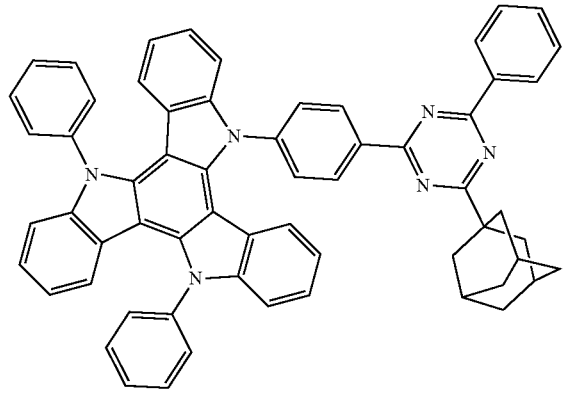
15
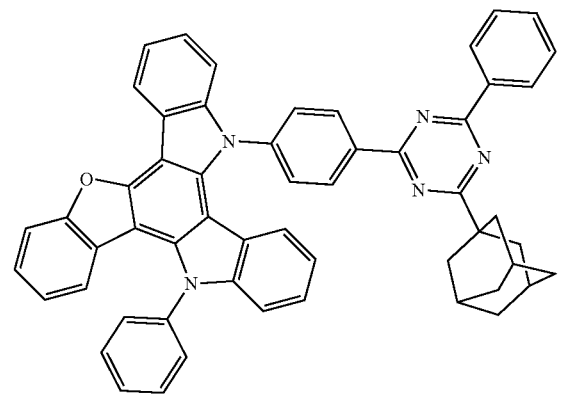
16
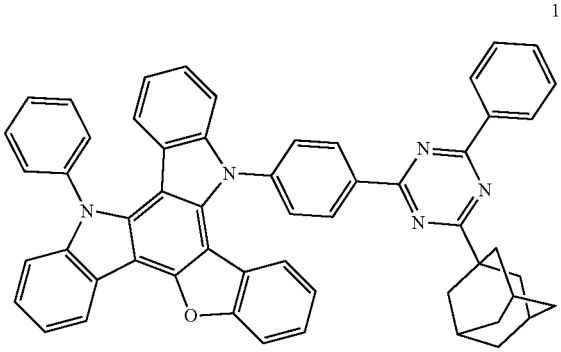
17
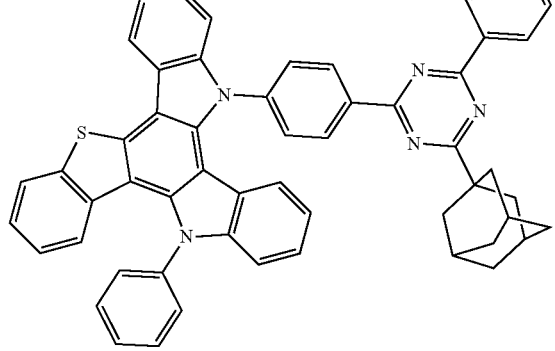
18
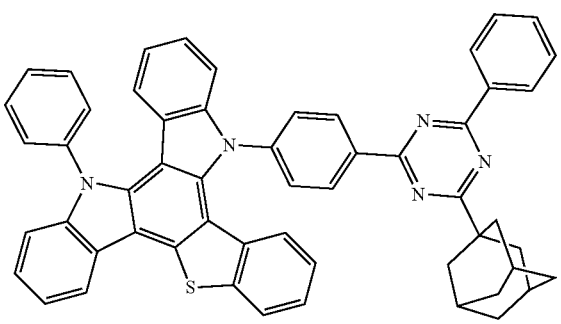
19
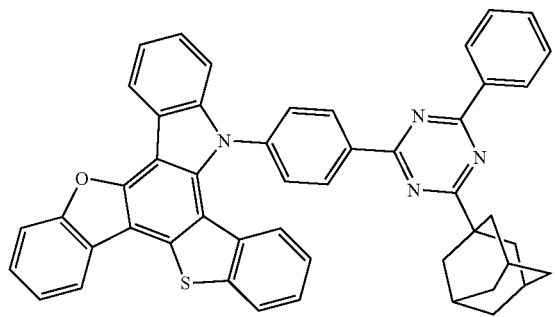
20

21
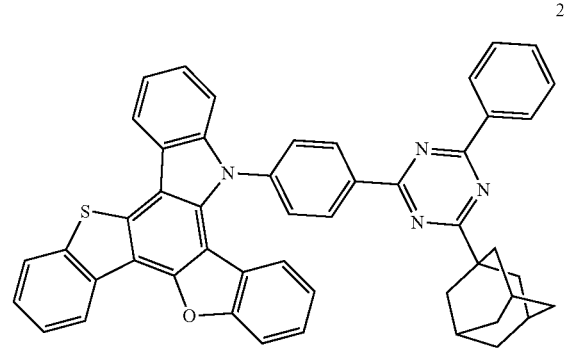
22
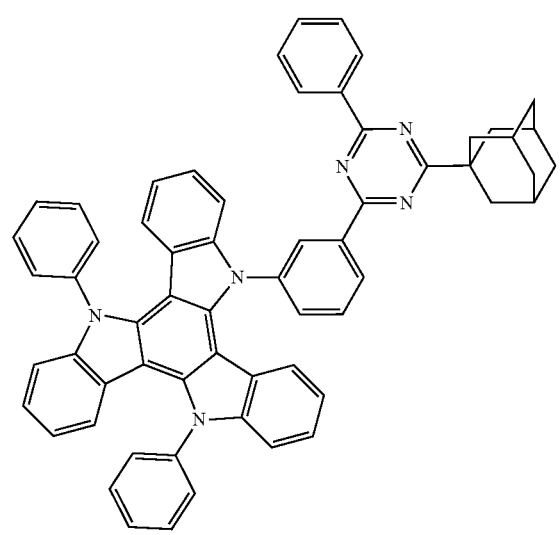
23
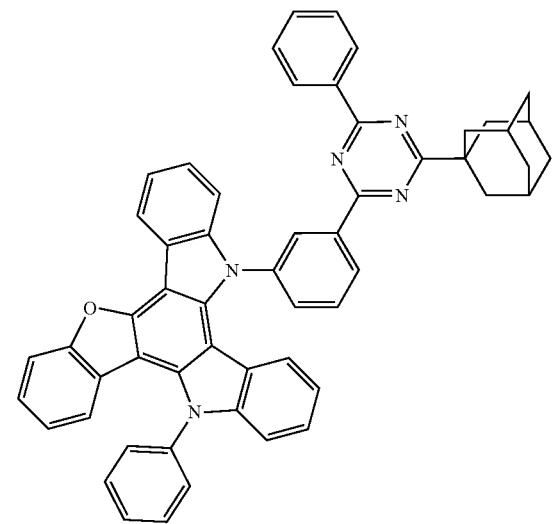
24
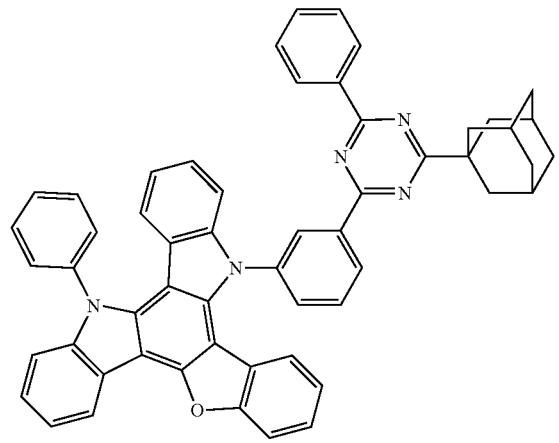
25
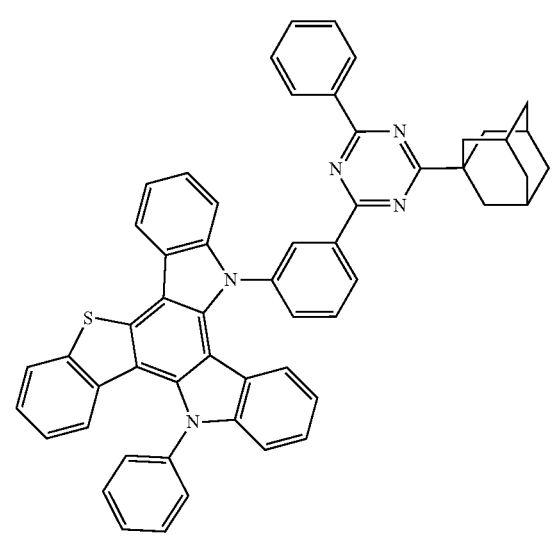
26
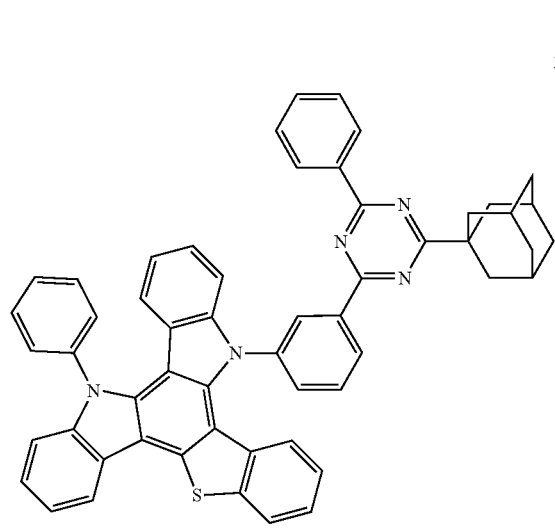

27
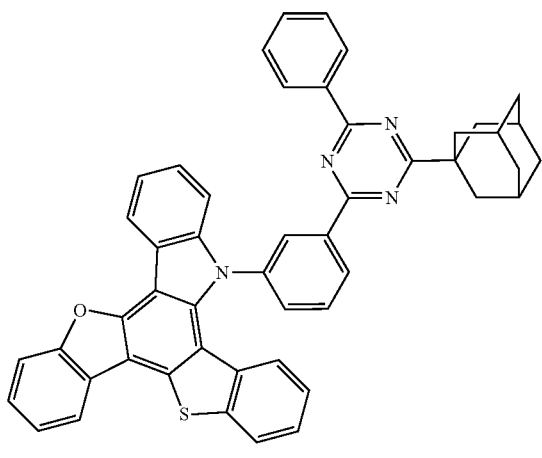
28
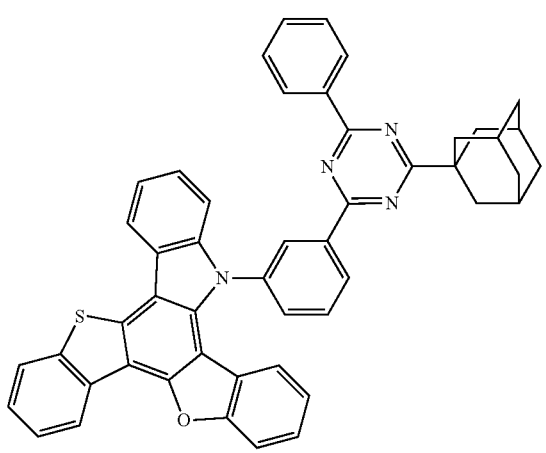
29
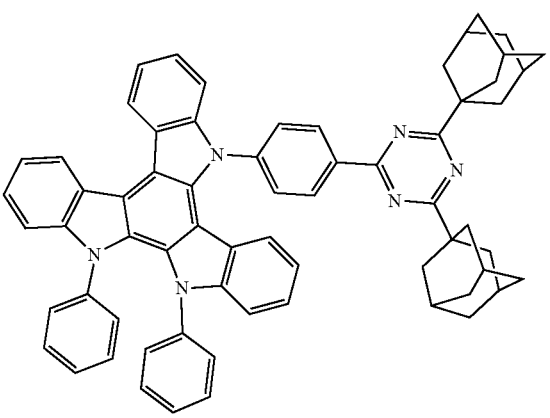
30
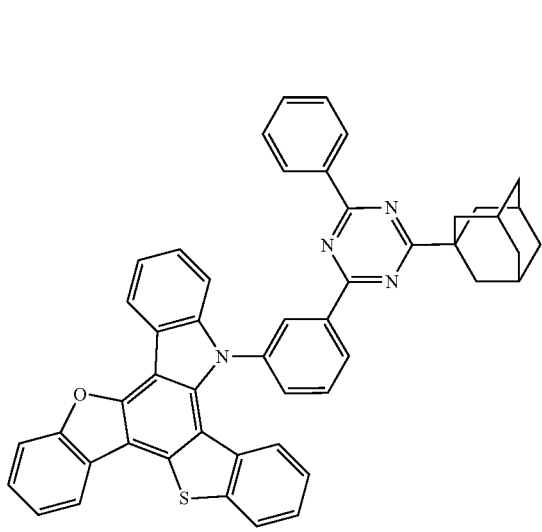
31
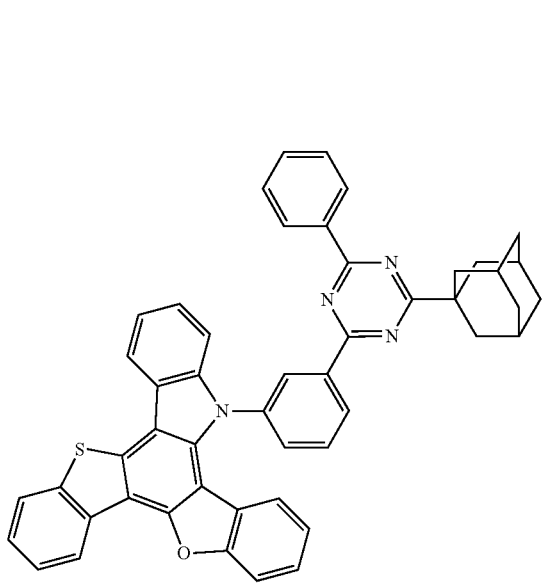
32
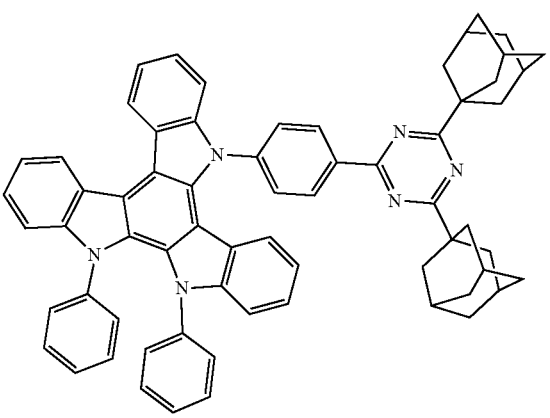
33
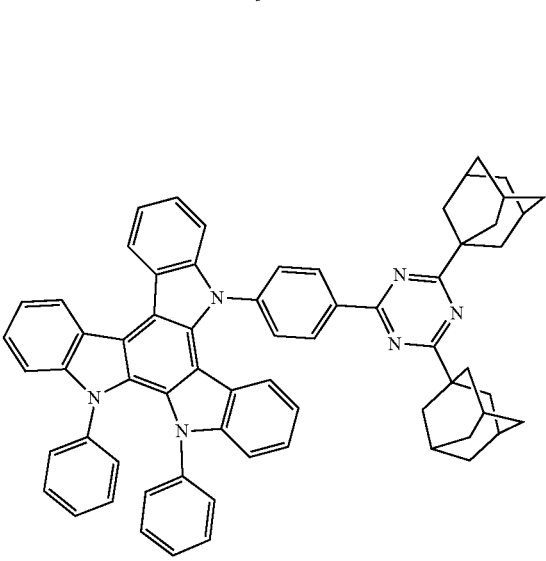

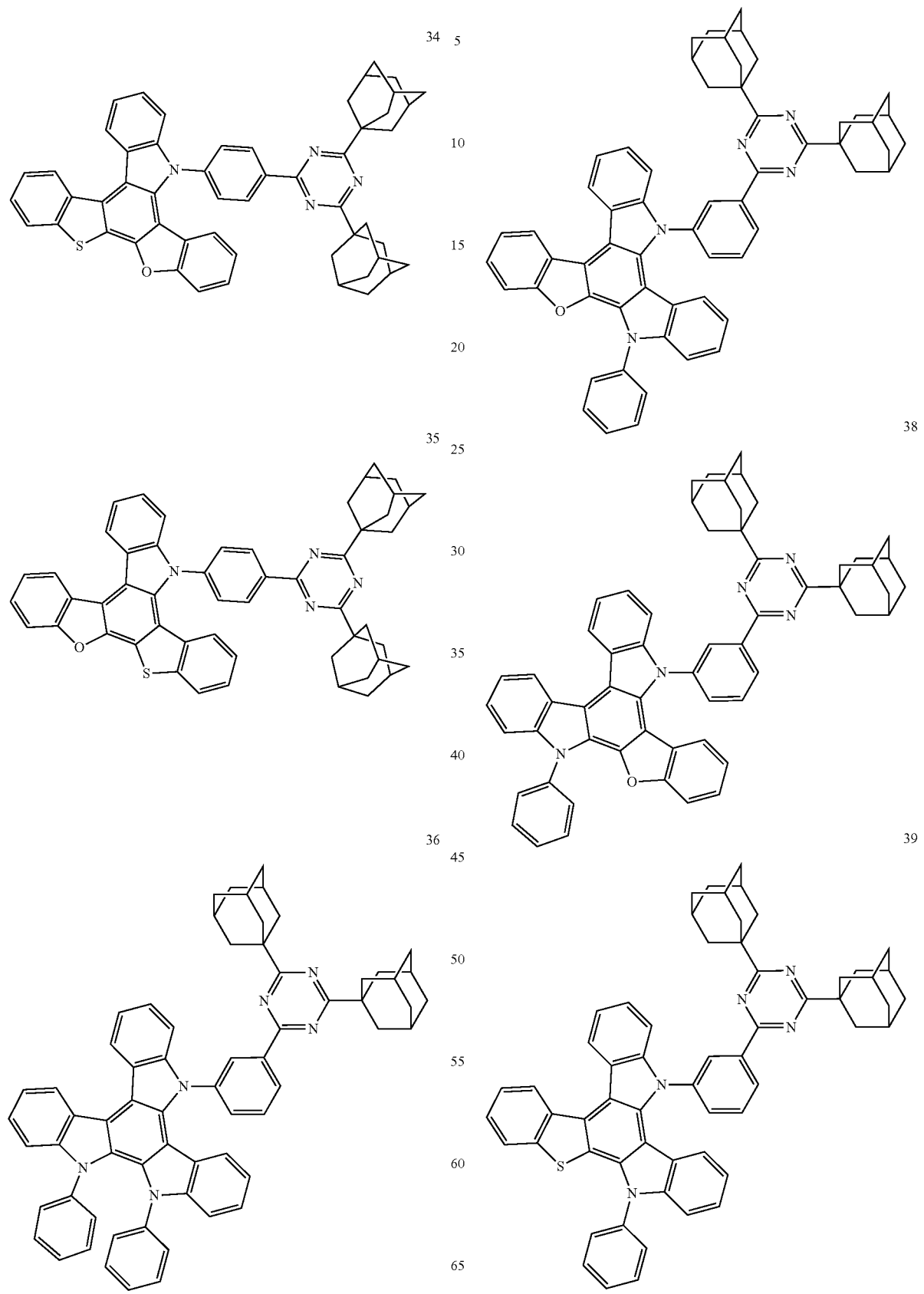

40
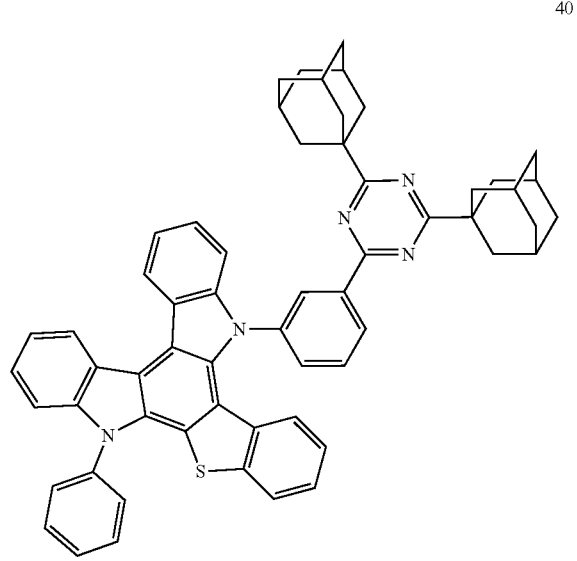
43
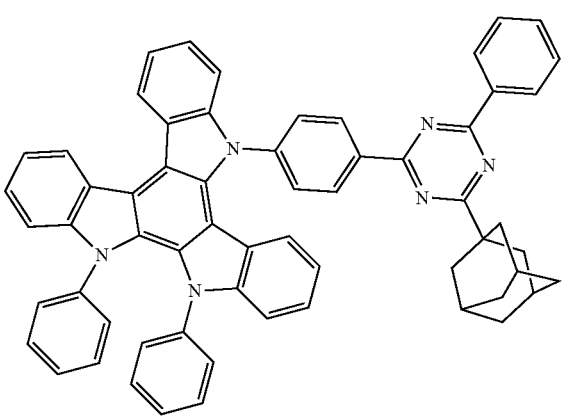
41
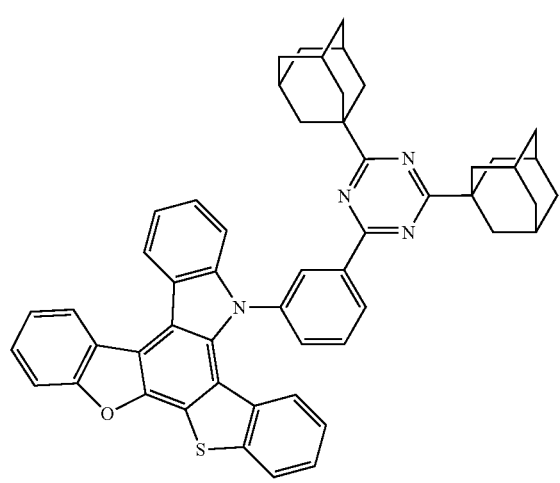
44
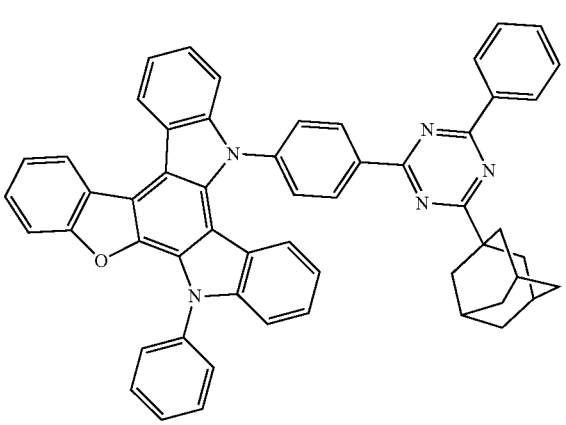
42
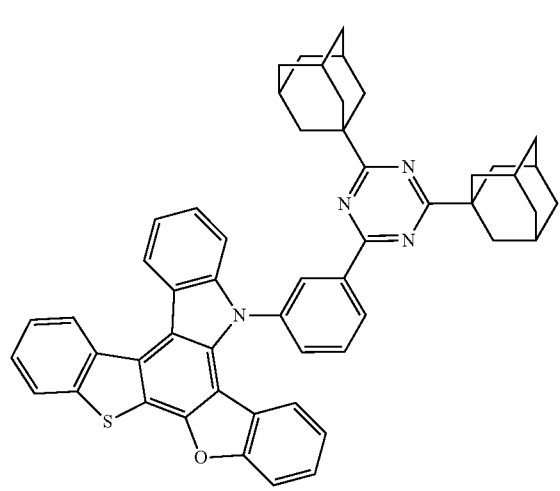
45
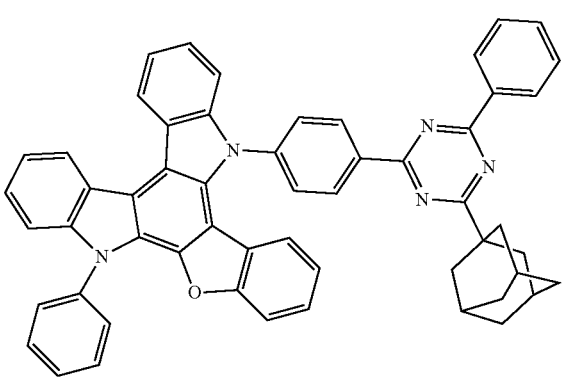

46
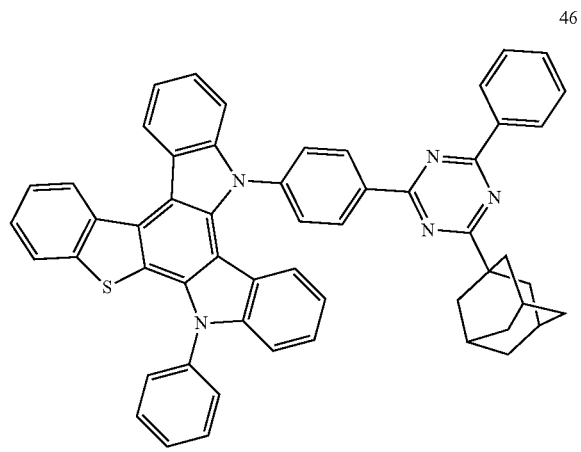
50
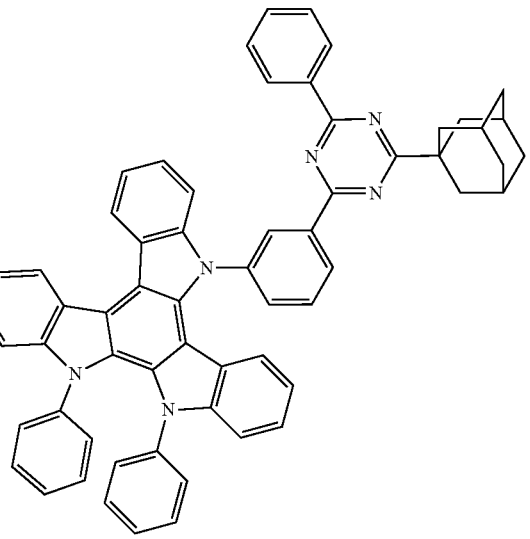
47
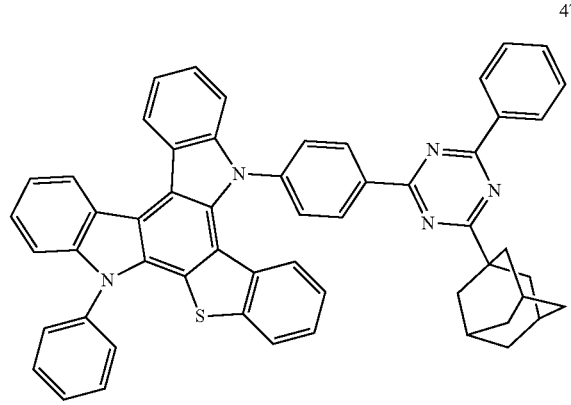
51
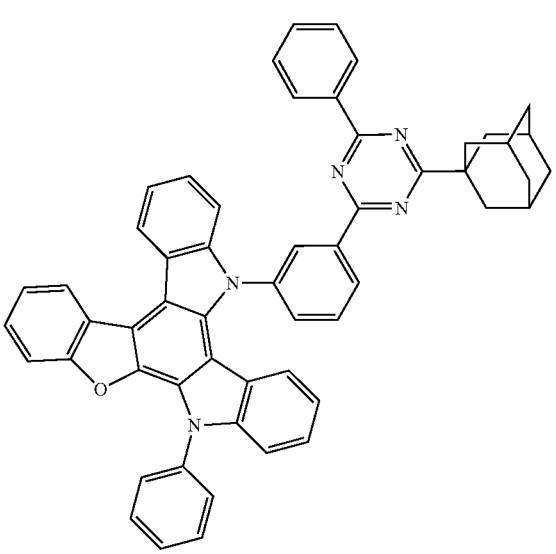
48
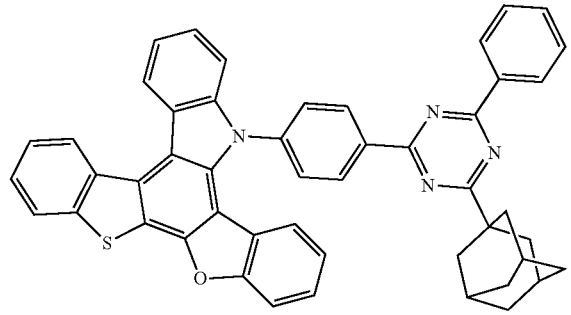
52
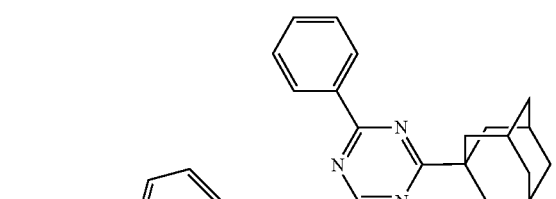
49
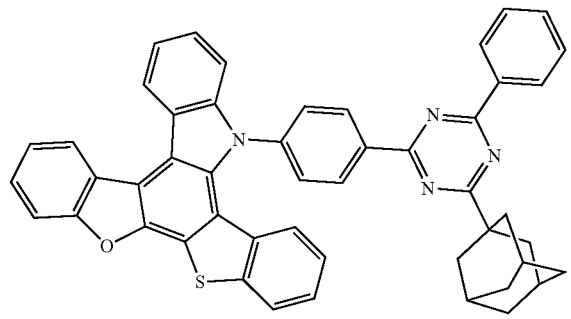
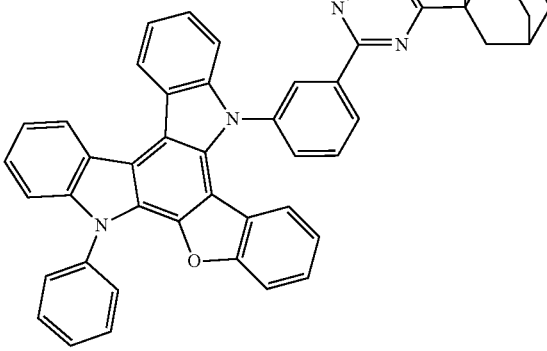

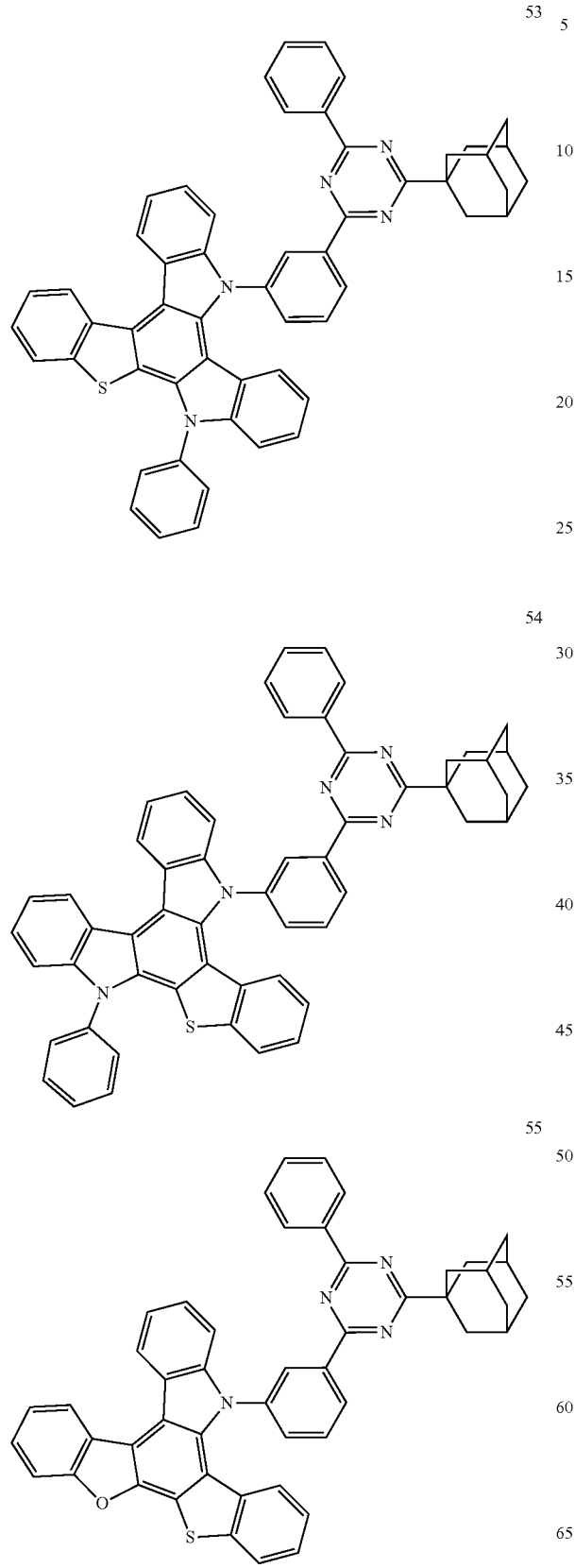

60
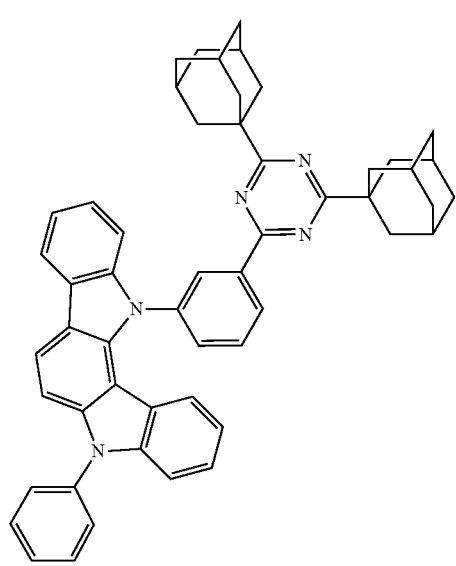
61
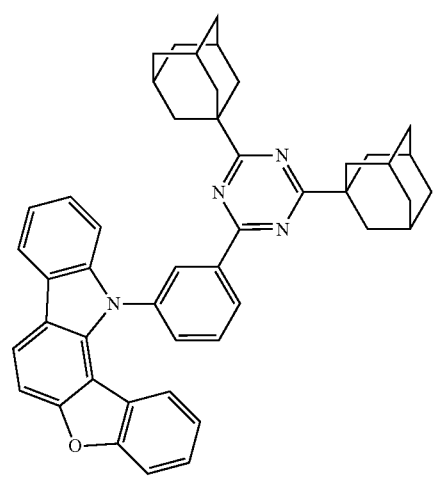
62
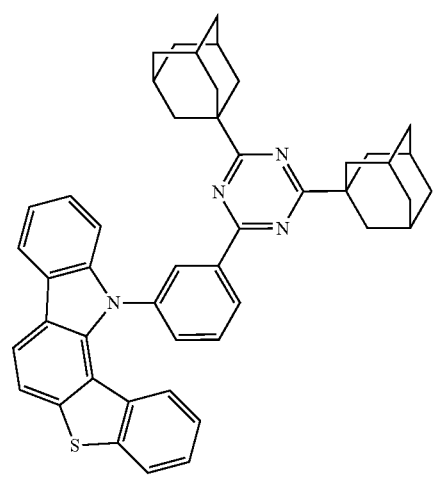
63
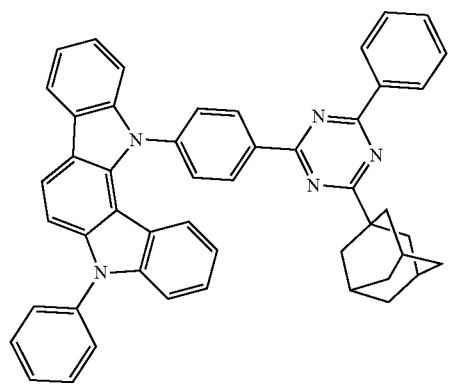
64
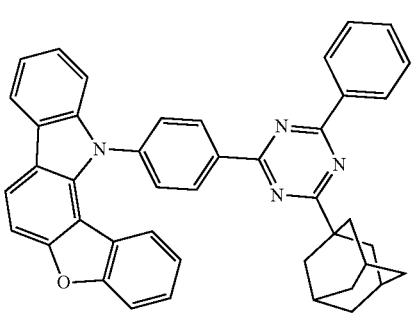
65
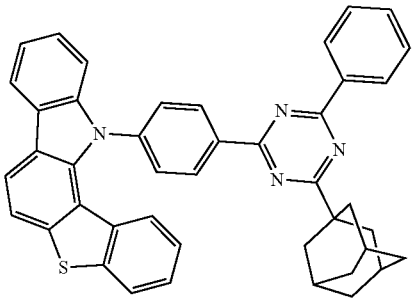
66
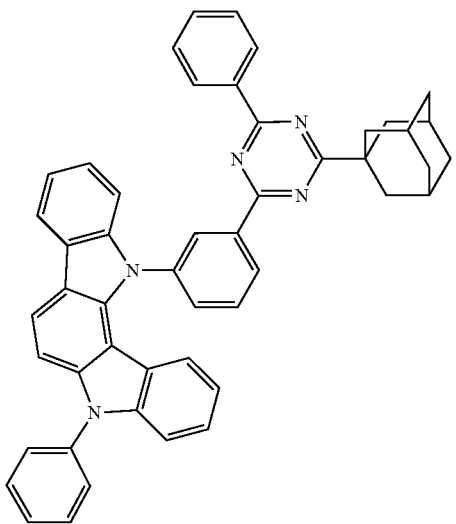

-continued

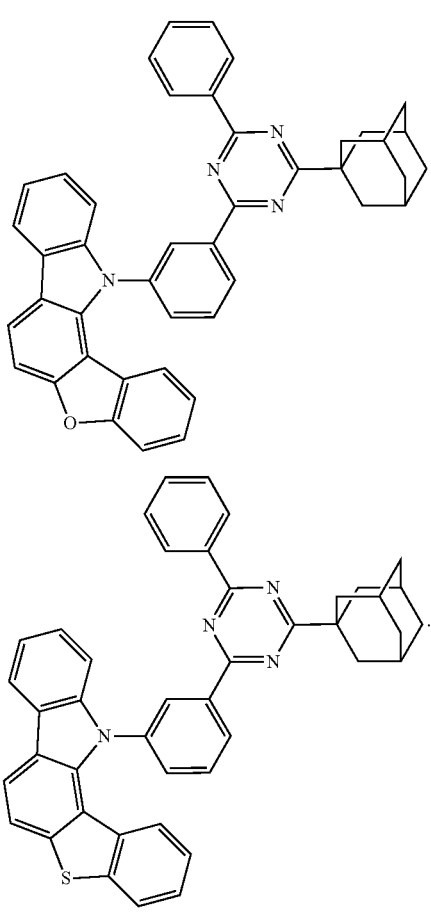

67

68

In the organic electroluminescence device 10 of an embodiment, the emission layer EML may emit delayed fluorescence. For example, the emission layer EML may emit thermally activated delayed fluorescence (TADF).

In some embodiments, the organic electroluminescence device 10 may include a plurality of emission layers. When the organic electroluminescence device 10 includes a plurality of emission layers, at least one emission layer EML may include the compound of the present embodiments.

In an embodiment, the emission layer EML includes a host and a dopant, and may include the compound of an embodiment as a dopant. For example, in the organic electroluminescence device 10 of an embodiment, the emission layer EML may include a host for delayed fluorescence and a dopant for delayed fluorescence, and the compound of the present embodiments may be the dopant for delayed fluorescence. The emission layer EML may include at least one of the compounds represented by Compound Group 1 as a thermally activated delayed fluorescence dopant.

In an embodiment, the emission layer EML may be a delayed fluorescence emission layer, and the emission layer EML may include any suitable host material and the compound of the present embodiments. For example, in an embodiment, the compound may be used as a TADF dopant.

In an embodiment, the emission layer EML may include any suitable host material. For example, in an embodiment, the emission layer EML may include tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-Tris (carbazol sol-9-yl) triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis (naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO3), octaphenylcyclotetrasiloxane (DPSiO4), 2,8-bis(diphenylphosphoryl)dibenzofuran (PPF), 3,3'-bis(N-carbazolyl)-1,1'-biphenyl (mCBP), and/or 1,3-Bis (carbazolyl-9-yl)benzene (mCP) as a host material, but an embodiment of the present disclosure is not limited thereto. For example, in addition to the presented host materials, suitable delayed fluorescence host materials may be included.

In the organic electroluminescence device 10 of an embodiment, the emission layer EML may further include any suitable dopant material. In an embodiment, the emission layer EML may further include styryl derivatives (for example, 1,4-bis[2-(3-N-ethylcarbazoryl)vinyl]benzene (BCzVB), 4-(di-p-tolylamino)-4"-[(di-p-tolylamino)styryl] stilbene (DPAVB), and/or N-(4-((E)-2-(6-((E)-4-(diphenylamino)styryl)naphthalen-2-yl)vinyl)phenyl)-N-phenyl-benzenamine (N-BDAVBi)), perylene and/or the derivatives thereof (for example, 2,5,8,11-tetra-t-butylperylene (TBP)), pyrene and/or the derivatives thereof (for example, 1,1-dipyrene, 1,4-dipyrenylbenzene, 1,4-bis(N,N-diphenylamino)pyrene, etc. as a dopant.

In the organic electroluminescence device 10 of an embodiment shown in FIGS. 1 to 4, the electron transport region ETR may be provided on the emission layer EML. The electron transport region ETR may include at least one of a hole blocking layer HBL, an electron transport layer ETL, or an electron injection layer EIL, but an embodiment is not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, and may have a single layer structure formed of an electron injection material and an electron transport material. In some embodiments, the electron transport region ETR may have a single layer structure formed of a plurality of different materials, or may have a structure in which an electron transport layer ETL/electron injection layer EIL, or a hole blocking layer HBL/electron transport layer ETL/electron injection layer EIL, are stacked in order from the emission layer EML, but is not limited thereto. The thickness of the electron transport region ETR may be, for example, from about 1000 Å to about 1,500 Å.

The electron transport region ETR may be formed using one or more suitable methods such as a vacuum deposition method, a spin coating method, a cast method, a Langmuir-Blodgett (LB) method, an inkjet printing method, a laser printing method, a laser induced thermal imaging (LITI) method, etc.

When the electron transport region ETR includes the electron transport layer ETL, the electron transport region ETR may include an anthracene-based compound. However, the present disclosure is not limited thereto, and the electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5- triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq2), 9,10-di(naphthalene-2-yl)anthracene (ADN), 1,3-Bis[3,5-di(pyridin-3-yl)phenyl]benzene (BmPyPhB) or a mixture thereof.

When the electron transport region ETR includes the electron injection layer EIL, the electron transport region ETR may include a halogenated metal (such as LiF, NaCl, CsF, RbCI, and/or Rbl), a lanthanide metal (such as Yb), a metal oxide (such as Li$_2$O and/or BaO), and/or Lithium quinolate (LiQ), but is not limited thereto. The electron injection layer EIL also may be formed of a mixture material of an electron transport material and an insulating organo metal salt. The organo metal salt may be a material having an energy band gap of about 4 eV or more. For example, the organo metal salt may include metal acetates, metal benzoates, metal acetoacetates, metal acetylacetonates, and/or metal stearates. The thickness of the electron injection layer EIL may be from about 1 Å to about 100 Å, and from about 3 Å to about 90 Å. When the thickness of the electron injection layer EIL satisfies the above-described range, satisfactory (or suitable) electron injection properties may be obtained without substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP) or 4,7-diphenyl-1,10-phenanthroline (Bphen), but is not limited thereto.

The second electrode EL2 may be provided on the electron transport region ETR. The second electrode EL2 may be a common electrode and/or a cathode. The second electrode EL2 may be a transmissive electrode, a transflective electrode or a reflective electrode. If the second electrode EL2 is the transmissive electrode, the second electrode EL2 may include a transparent metal oxide, for example, indium tin oxide (ITO), indium zinc oxide (IZO), zinc oxide (ZnO), and/or indium tin zinc oxide (ITZO).

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In some embodiments, the second electrode EL2 may have a multi-layer structure including a reflective layer or a transflective layer formed of any of the above-described materials, and a transparent conductive layer formed of indium tin oxide (ITO), indium zinc oxide (IZO), zinc oxide (ZnO), indium tin zinc oxide (ITZO), etc.

In some embodiments, the second electrode EL2 may be connected with an auxiliary electrode. When the second electrode EL2 is connected with the auxiliary electrode, the resistance of the second electrode EL2 may decrease.

The organic electroluminescence device 10 of an embodiment may further include a capping layer CPL on the second electrode EL2. The capping layer CPL may include, for example, α-NPD, NPB, TPD, m-MTDATA, Alq3, CuPc, N4,N4,N4',N4'-tetra (biphenyl-4-yl) biphenyl-4,4'-diamine (TPD15), 4,4',4"-Tris (carbazol sol-9-yl) triphenylamine (TCTA), N, N'-bis (naphthalen-1-yl), etc.

The organic electroluminescence device 10 according to an embodiment of the present disclosure includes the compound of an embodiment in the emission layer EML between the first electrode EL1 and the second electrode EL2, and may obtain superior luminous efficiency and an improved efficiency drop in a deep blue emission wavelength region. In addition, the compound according to an embodiment may be a thermally activated delayed fluorescence dopant, and the emission layer EML including the compound of an embodiment may emit thermally activated delayed fluorescence, thereby obtaining fair luminous efficiency characteristics.

Hereinafter, with reference to Examples and Comparative Examples, a compound according to an embodiment of this present disclosure and an organic electroluminescence device of an embodiment will be described in more detail. In addition, Examples shown below are illustrations only for the understanding of this present disclosure, and the scope of the present disclosure is not limited thereto.

EXAMPLES

1. Synthesis of Compounds of Examples

First, a method of synthesizing compounds according to the present embodiment will be described in more detail by showing example methods for synthesizing Compounds 1, 8, 15, 16, 18, 20, 29, 43, 57, and 63. In addition, below-described methods of synthesizing compounds are merely examples, and methods of synthesizing compounds according to embodiments of the present disclosure are not limited to examples given.

(1) Synthesis of Compound 1

Compound 1 according to an embodiment, for example, may be synthesized by Reaction Formula 1.

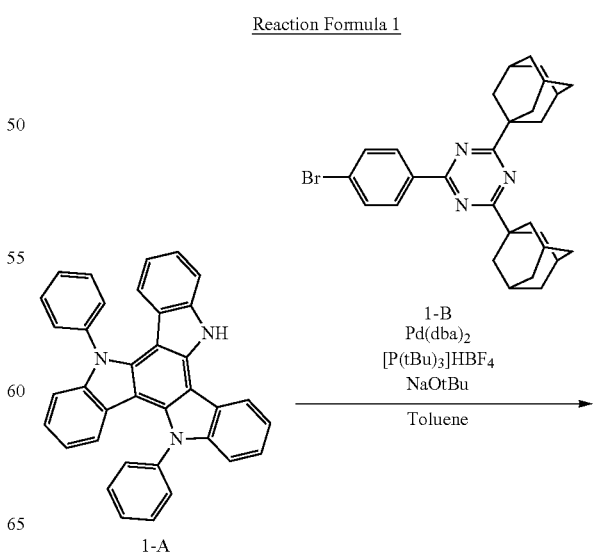

Reaction Formula 1

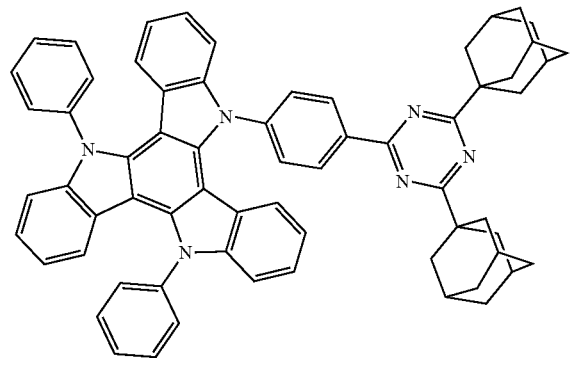

1

To reactant 1-A (4.0 g, 8.04 mmol), reactant 1-B (4.26 g, 8.44 mmol), bis(dibenzylidene acetone)palladium (0) (Pd (dba)$_2$, 0.15 g, 0.16 mmol), tri-tert-butyl phosphonium tetrafluoro borate (P(t-Bu)$_3$HBF$_4$), 0.19 g, 0.64 mmol), and sodium tert-butoxide (NaOt-Bu, 0.77 g, 12.1 mmol), toluene (200 ml) was added, and heated and stirred at about 80° C. for about 2 hours. Water was added to the reaction solution, and the resultant product was subjected to celite filtering and liquid separation to concentrate an organic layer. The concentrated solid was purified by silica gel column chromatography to obtain Compound 1 (6.30 g, yield 85%). The molecular weight of Compound 1 was m/z=921 (M$^+$+1) as measured by Fast Atom Bombardment-Mass Spectrometry (FAB-MS).

(2) Synthesis of Compound 8

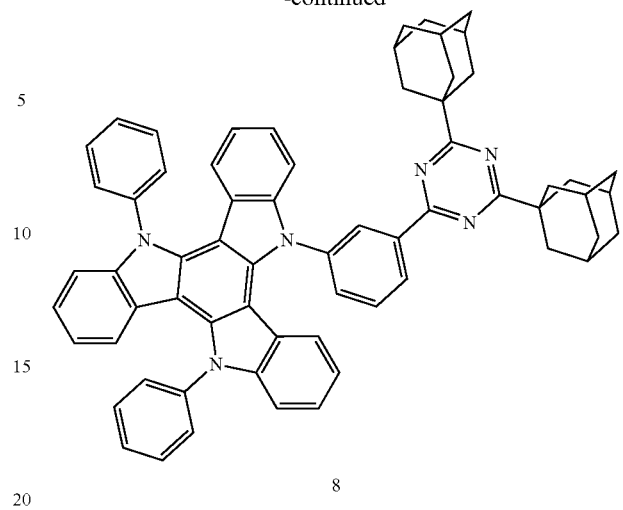

8

Compound 8 (5.06 g, yield 73%) was synthesized in substantially the same manner as used for the synthesis of Compound 1, except that reactant 1-D was used instead of reactant 1-B. The molecular weight of Compound 8 was m/z=863 (M$^+$+1) as measured by FAB-MS.

(3) Synthesis of Compound 15

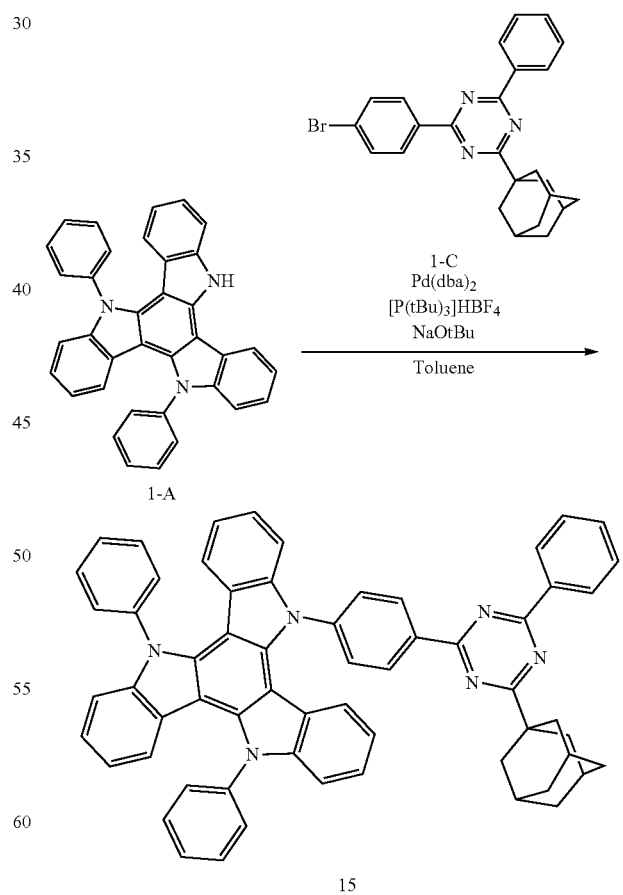

Compound 15 (5.13 g, yield 74%) was synthesized in substantially the same manner as used for the synthesis of Compound 1, except that reactant 1-C was used instead of reactant 1-B. The molecular weight of Compound 15 was m/z=863 (M$^+$+1) as measured by FAB-MS.

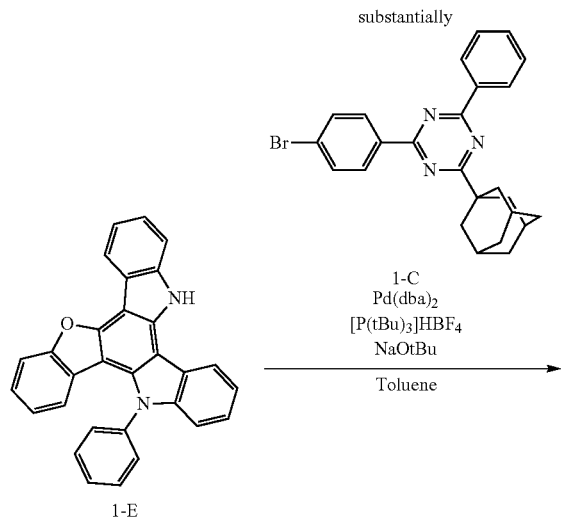

1-E

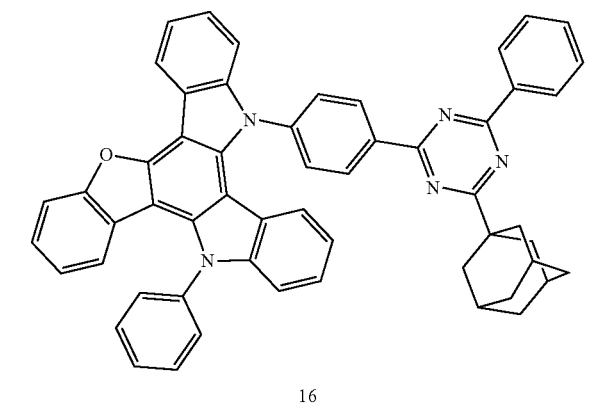

16

Compound 16 (5.22 g, yield 70%) was synthesized in substantially the same manner as used for the synthesis of Compound 1, except that reactant 1-E was used instead of reactant 1-A, and reactant 1-C was used instead of reactant 1-B. The molecular weight Compound 16 was m/z=788 (M$^+$+1) as measured by FAB-MS.

(5) Synthesis of Compound 18

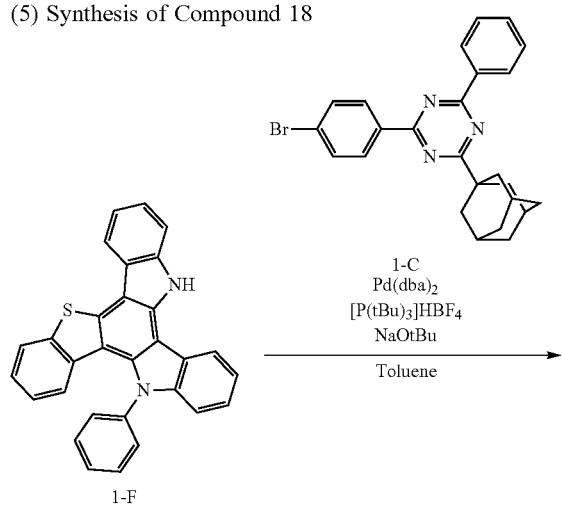

1-F

-continued

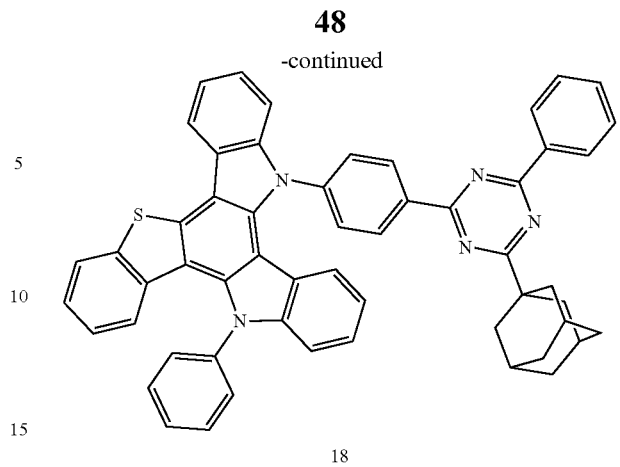

18

Compound 18 (4.77 g, yield 65%) was synthesized in substantially the same manner as used for the synthesis of Compound 1, except that reactant 1-F was used instead of reactant 1-A, and reactant 1-C was used instead of reactant 1-B. The molecular weight of Compound 18 was m/z=804 (M$^+$+1) as measured by FAB-MS.

(6) Synthesis of Compound 20

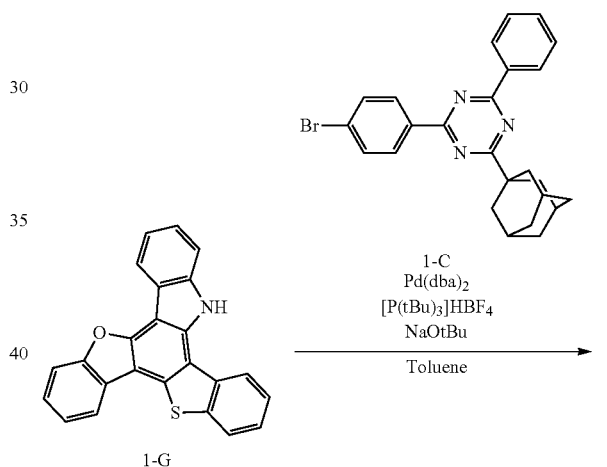

1-G

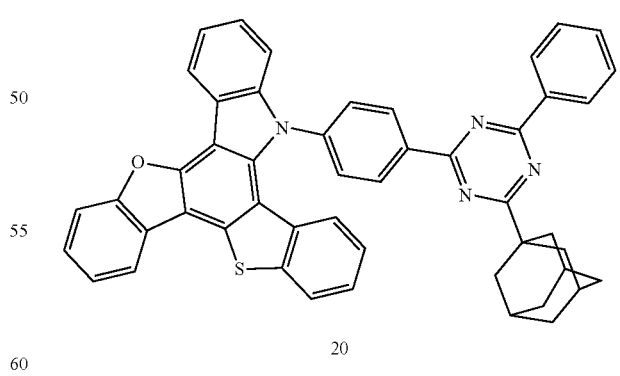

20

Compound 20 (5.21 g, yield 65%) was synthesized in substantially the same manner as used for the synthesis of Compound 1, except that reactant 1-G was used instead of reactant 1-A, and reactant 1-C was used instead of reactant 1-B. The molecular weight of Compound 20 was m/z=729 (M$^+$+1) as measured by FAB-MS.

(7) Synthesis of Compound 29

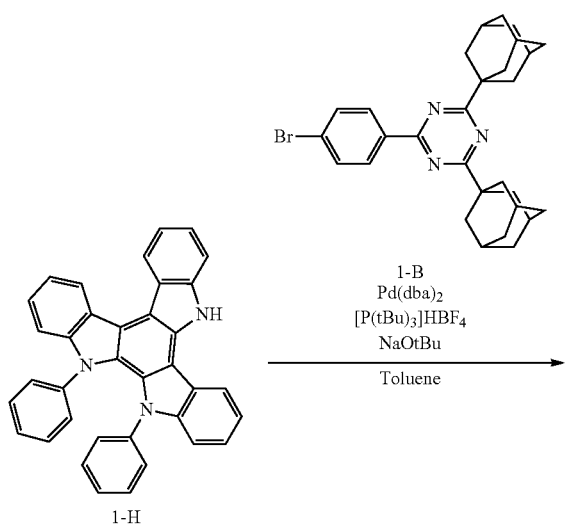

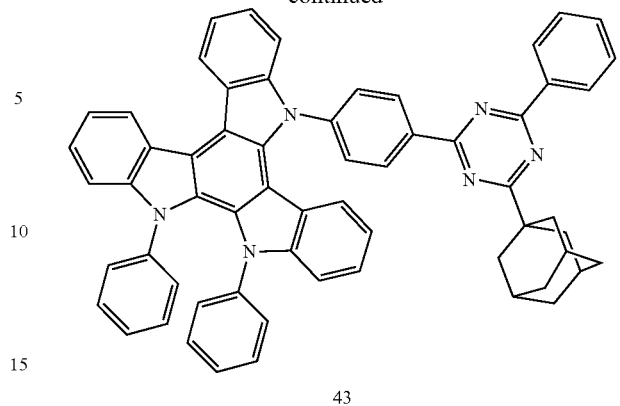

Compound 29 (5.11 g, 69% yield) was synthesized in substantially the same manner as used for the synthesis of Compound 1, except that reactant 1-H was used instead of reactant 1-A. The molecular weight of Compound 29 was m/z=921 (M$^+$+1) as measured by FAB-MS.

(8) Synthesis of Compound 43

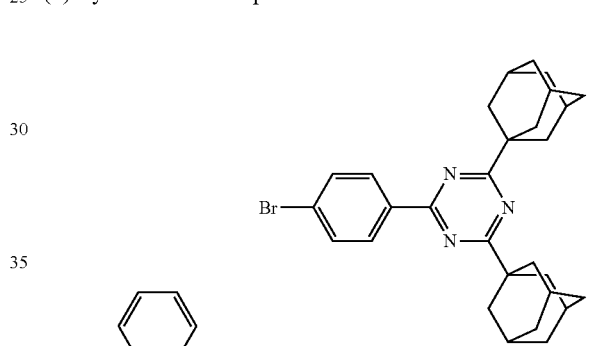

Compound 43 (4.54 g, yield 61%) was synthesized in substantially the same manner as used for the synthesis of Compound 1, except that reactant 1-H was used instead of reactant 1-A, and reactant 1-C was used instead of reactant 1-B. The molecular weight of Compound 43 was m/z=863 (M$^+$+1) as measured by FAB-MS.

(9) Synthesis of Compound 57

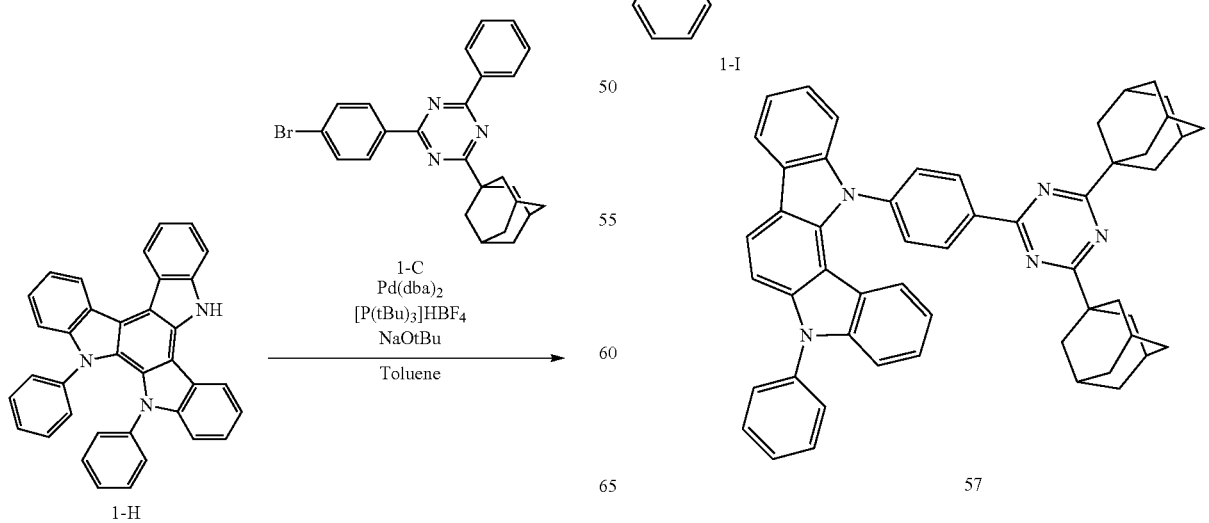

Compound 57 (7.28 g, yield 80%) was synthesized in substantially the same manner as used for the synthesis of Compound 1, except that reactant 1-1 was used instead of reactant 1-A. The molecular weight of Compound 57 was m/z=756 (M$^+$+1) as measured by FAB-MS.

(10) Synthesis of Compound 63

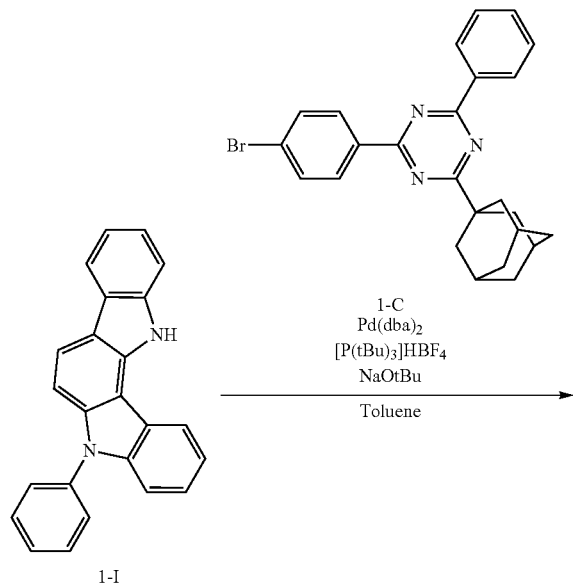

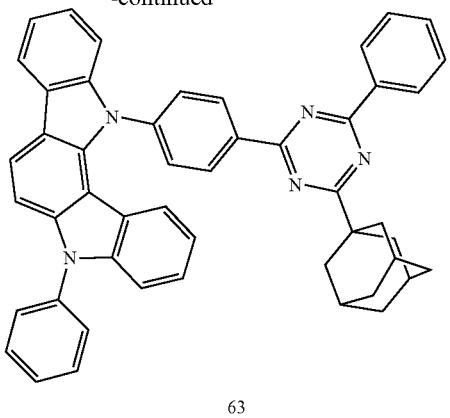

63

Compound 63 (6.80 g, yield 81%) was synthesized in substantially the same manner as used for the synthesis of Compound 1 except that reactant 1-1 was used instead of reactant 1-A, and reactant 1-C was used instead of reactant 1-B. The molecular weight of Compound 63 was m/z=698 (M$^+$+1) as measured by FAB-MS measurement.

2. Evaluation of Compounds, and Manufacture and Evaluation of Organic Electroluminescence Devices The luminous characteristics of compounds of the Synthesis Examples and organic electroluminescence devices of Examples including the compounds in an emission layer were evaluated as described below. A method of manufacturing an organic electroluminescence device for evaluation is described below.

Organic electroluminescence devices of Examples 1 to 10 were manufactured using the Compounds 1, 8, 15, 16, 18, 20, 29, 43, 57, and 63 described above as a dopant for an emission layer. Comparative Examples 1 to 4 are organic electroluminescence devices manufactured using Comparative Compounds C1, C2, C3, and C4 as a dopant for an emission layer, respectively.

The compounds used in Examples 1 to 10 and Comparative Examples 1 to 4 are shown in Table 1.

TABLE 1

Compound 1

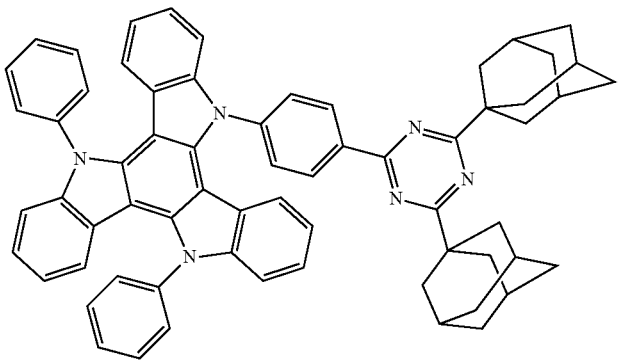

1

TABLE 1-continued
Compound 8
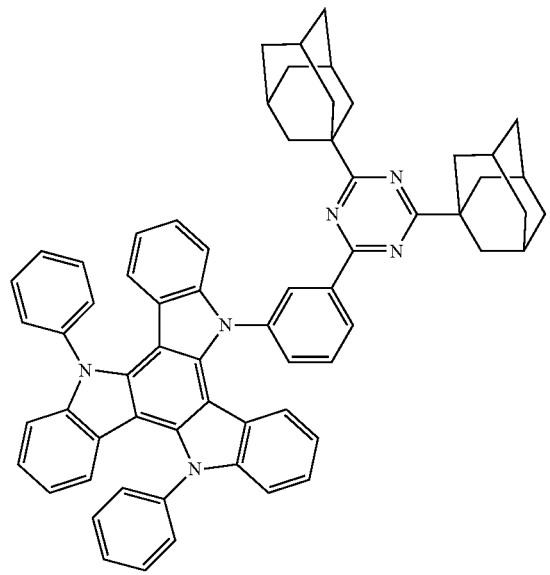
8
Compound 15
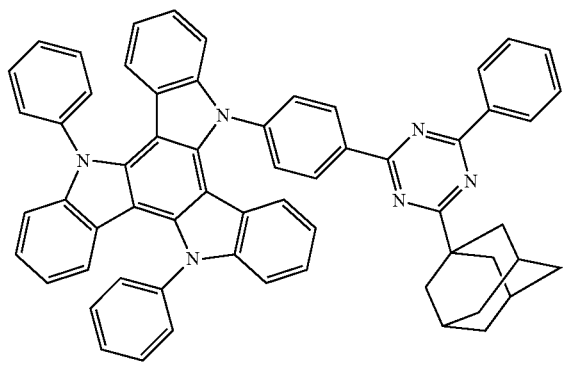
15
Compound 16
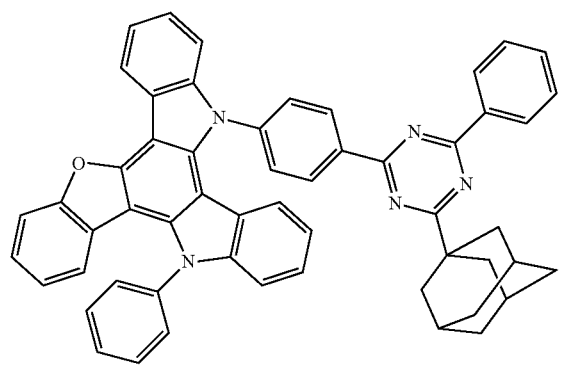 [SMILES: c1ccc(-c2nc(-c3ccc(-n4c5ccccc5c5c6oc7ccccc7c6c6sc7ccccc7c6c54)cc3)nc(C34CC5CC(CC(C5)C3)C4)n2)cc1]
16

TABLE 1-continued
Compound 18
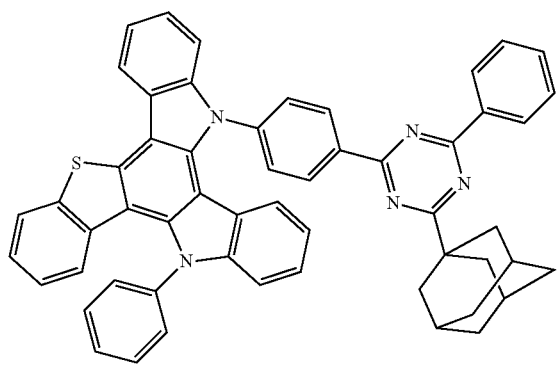
18
Compound 20
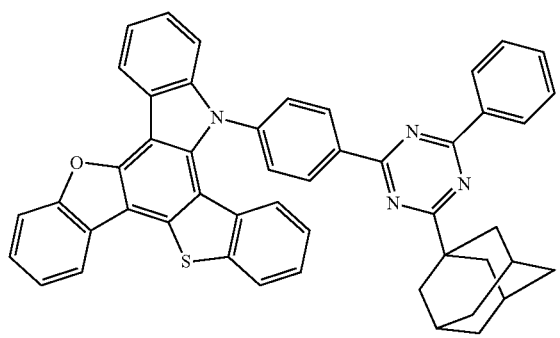
20
Compound 29
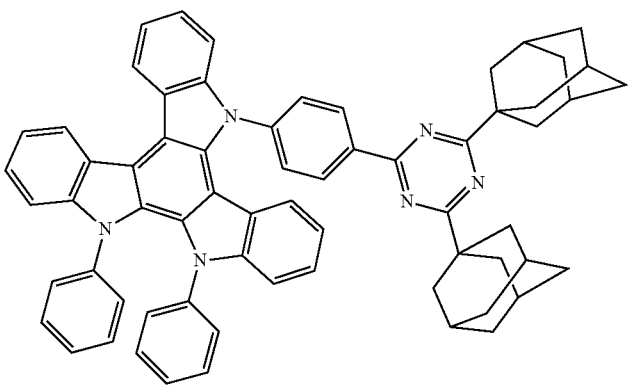
29
Compound 43
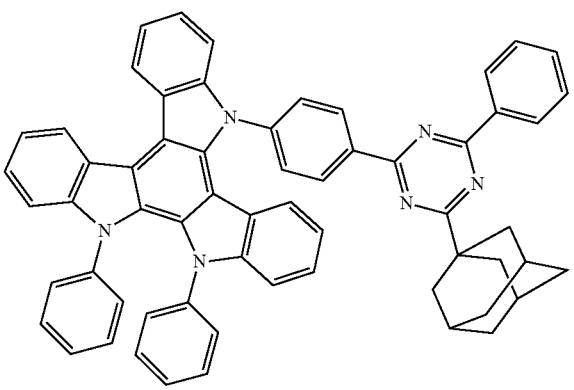
43

TABLE 1-continued
Compound 57
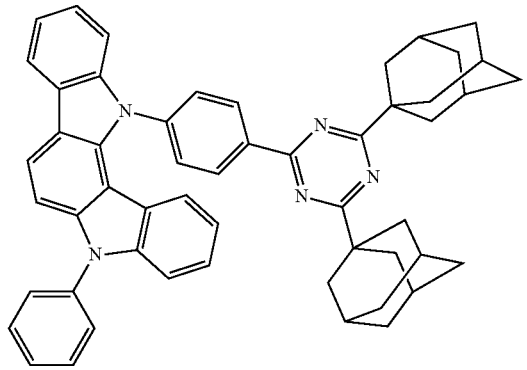
57
Compound 63
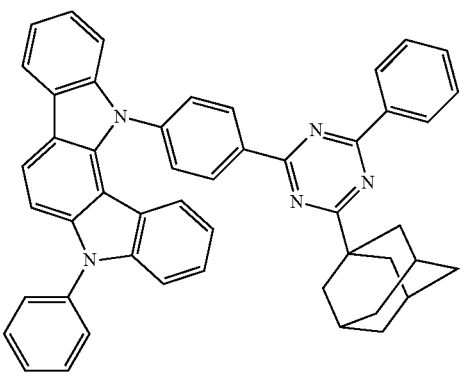
63
Comparative Compound C1
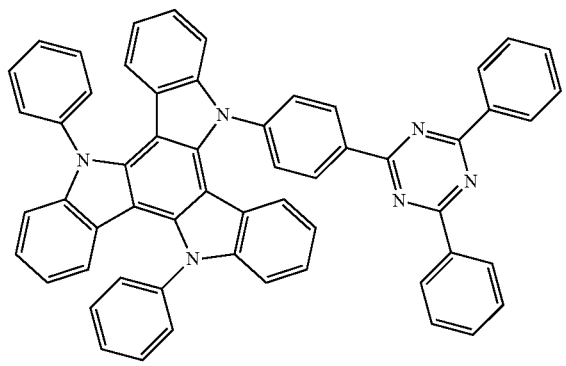
C1
Comparative Compound C2
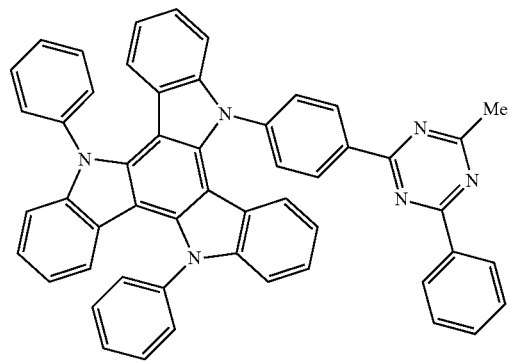
C2

TABLE 1-continued

Comparative Compound C3

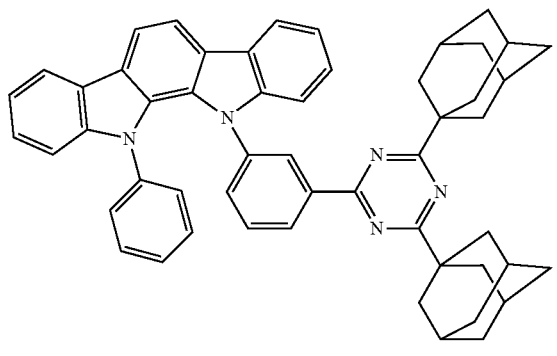

C3

Comparative Compound C4

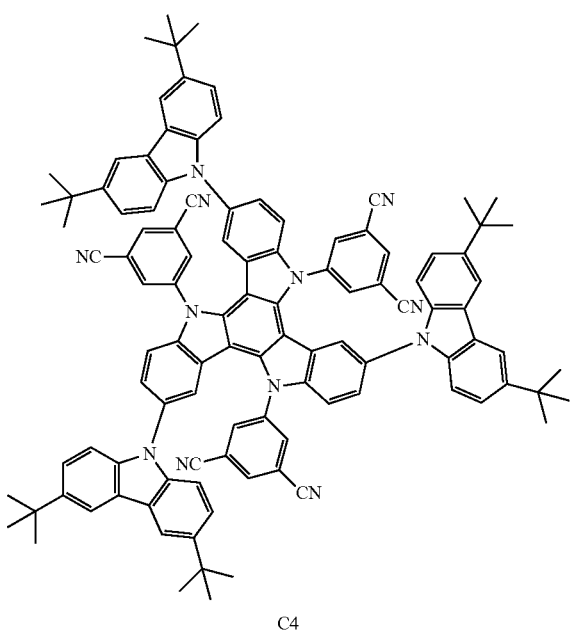

C4

Evaluation of Luminous Characteristics of Compounds

A toluene (5.0 mM) solution was prepared for evaluating luminous characteristics of Example Compounds and Comparative Example Compounds, and luminous characteristics were evaluated using a JASCO V-670 spectrometer. The emission spectrum at room temperature and 77K was measured. Table 2 shows the maximum emission wavelength λ max and the full width at half maximum (FWHM) measured at room temperature in the emission spectrum. In addition, PLQY (photoluminescence quantum yield) of 5.0 mM toluene solution for each compound was measured using HAMAMATSU Quantaurus-QY.

TABLE 2

| Compound | $\lambda_{max}$ (nm) | FWHM (nm) | PLQY (%) |
|---|---|---|---|
| Compound 1 | 459 | 62 | 85 |
| Compound 8 | 453 | 61 | 65 |
| Compound 15 | 463 | 63 | 79 |
| Compound 16 | 451 | 61 | 60 |
| Compound 18 | 456 | 65 | 63 |
| Compound 20 | 443 | 61 | 65 |
| Compound 29 | 454 | 56 | 82 |
| Compound 43 | 460 | 63 | 83 |
| Compound 57 | 445 | 62 | 76 |
| Compound 63 | 449 | 63 | 74 |
| Comparative Compound C1 | 522 | 78 | 89 |
| Comparative Compound C2 | 461 | 61 | 60 |
| Comparative Compound C3 | 440 | 58 | 30 |
| Comparative Compound C4 | 630 | 82 | 80 |

Referring to the results of Table 2, it is seen that Compounds 1, 8, 15, 16, 18, 20, 29, 43, 57, and 63 of the Examples exhibit a maximum emission wavelength of 465 nm or less and emit deep blue light therefrom.

In addition, it is seen that Compounds 1, 8, 15, 16, 18, 20, 29, 43, 57, and 63 of the Examples have a narrower half width (FWHM) in the emission spectrum compared to Comparative Example Compound C1 and Comparative Example Compound C4.

It is seen that Compounds 1, 8, 15, 16, 18, 20, 29, 43, 57, and 63 of the Examples have a larger value of PLOY than Comparative Example Compound C2 and Comparative Example Compound C3, thereby providing superior luminous efficiency.

It is seen that Comparative Example Compound C1 and Comparative Example Compound C4 emit light having a lower color purity than the Example Compounds by emitting long wavelength light and having wide half-width. Although Comparative Example Compound C2 and Comparative Example Compound C3 have a short wavelength light and a narrow half-width, their PLQY is lower compared to the Example Compounds.

Example Compounds containing one or two adamantyl groups have a weaker acceptor portion of the triazine derivative to emit short wavelength light, compared to Comparative Example Compound C1 and Comparative Example Compound C4, and to obtain a superior luminous efficiency, compared to Comparative Example Compound C2 and Comparative Example Compound C3.

Manufacture of Organic Electroluminescence Devices

On a glass substrate, ITO was patterned to a thickness of about 1500 Å and washed with ultra-pure water, cleaned with ultrasonic waves, irradiated with UV for 30 minutes, and then ozone-treated. Thereafter, HAT-CN was deposited to a thickness of 100 Å, α-NPD was deposited to a thickness of 800 Å, and mCP was deposited to a thickness of 50 Å to form a hole transport region.

Next, in the forming of each emission layer, the Example Compound or the Comparative Example Compound and mCBP were co-deposited at 1:99 to form a layer having a thickness of 200 Å. That is, the emission layers formed by co-deposition in Examples 1 to 10 were deposited by mixing the compounds 1, 8, 15, 16, 18, 20, 29, 43, 57, and 63 with mCBP, respectively, and the emission layers in Comparative Examples 1 to 4 were deposited by mixing Comparative Example Compounds C1, C2, C3, and C4 with mCBP, respectively.

Thereafter, a layer having a thickness of 300 Å was formed of TPBi on each of the emission layers, and a layer having a thickness of 5 Å was formed thereon of LiF to form an electron transport region. Then, a second electrode having a thickness of 1000 Å was formed of aluminum (Al).

In the Examples, the hole transport region, the emission layer, the electron transport region, and the second electrode were formed using a vacuum deposition apparatus.

Evaluation of Organic Electroluminescence Device Characteristics

Table 3 shows the evaluation results of the organic electroluminescence devices of Examples 1 to 10 and Comparative Examples 1 to 4. Table 3 shows the maximum emission wavelength ($\lambda_{max}$) and the external quantum efficiency ($EQE_{max}$) of the manufactured organic electroluminescence devices by comparison. In the characteristics evaluation results of the Examples and Comparative Examples shown in Table 3, the maximum emission wavelength ($\lambda_{max}$) indicates the wavelength representing the maximum value in the emission spectrum, and the external quantum efficiency ($EQE_{max}$, $1000_{nits}$) was obtained under a luminance of 1000 cd/m².

TABLE 3

| Device manufacturing Example | Dopant material | $\lambda_{max}$ (nm) | $EQE_{max, 1000nit}$ (%) |
|---|---|---|---|
| Example 1 | Compound 1 | 460 | 25.1 |
| Example 2 | Compound 8 | 454 | 14.8 |
| Example 3 | Compound 15 | 465 | 25.9 |
| Example 4 | Compound 16 | 453 | 9.8 |
| Example 5 | Compound 18 | 458 | 7.5 |
| Example 6 | Compound 20 | 445 | 7.2 |
| Example 7 | Compound 29 | 456 | 21.6 |
| Example 8 | Compound 43 | 462 | 22.8 |
| Example 9 | Compound 57 | 447 | 13.2 |
| Example 10 | Compound 63 | 451 | 14.5 |
| Comparative Example 1 | Comparative Example Compound C1 | 523 | 7.1 |
| Comparative Example 2 | Comparative Example Compound C2 | 463 | 6.9 |
| Comparative Example 3 | Comparative Example Compound C3 | 441 | 4.8 |
| Comparative Example 4 | Comparative Example Compound C4 | 630 | 3.2 |

Referring to the results of Table 3, the organic electroluminescence devices of Examples 1 to 3 and 7 to 10 emit short, deep blue light, having high efficiency compared to the organic electroluminescence devices of Comparative Examples 1 to 4. It is confirmed that the organic electroluminescence devices of Examples 4 to 6 emit short, deep blue light while having similar levels of luminous efficiency as compared with the organic electroluminescence devices of Comparative Examples 1 and 2. In addition, it is confirmed that Examples 4 to 6 show improved luminous efficiency values compared to Comparative Examples 3 and 4.

It is believed that in the case of the Example Compounds, inclusion of one or two adamantyl groups in the triazine derivative as a substituent reduced the conjugation and weakened the acceptor portion, thereby emitting short wavelength light.

Comparative Example Compound C1 used in the organic electroluminescence device of Comparative Example 1 included the triazine derivative of the acceptor portion that was not substituted with an adamantyl group, and thus had a longer emission wavelength compared to the Example Compounds.

Comparative Example 3 shows a low value of external quantum efficiency. Due to the steric hindrance of two adjacent phenyl groups in Comparative Example Compound C3, a large torsion angle in the donor portion and the acceptor portion was generated and an oscillator angle became smaller, causing the low external quantum efficiency.

In Comparative Example 4, because the $\Delta E_{ST}$ between the lowest singlet excitation energy level (S1) and the lowest triplet excitation energy level (T1) of the Comparative Example Compound C4 was large, TADF emission was not exhibited, thereby causing a low value of external quantum efficiency.

The Compounds of an embodiment include one or two unsubstituted adamantyl groups and a condensed heterocycle centered on (connected to) a triazine derivative, thereby emitting short, blue light and having high efficiency. In addition, the organic electroluminescence devices of an embodiment include the compounds of an embodiment in an emission layer to obtain an improved efficiency drop in a deep blue emission wavelength region.

An organic electroluminescence device of an embodiment may have an improved device characteristic of high efficiency in a deep blue wavelength region.

A compound of an embodiment may be included in an emission layer of an organic electroluminescence device to contribute to high efficiency of an organic electroluminescence device.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the present disclosure has been described with reference to example embodiments of the present disclosure, it will be understood that the present disclosure should not be limited to these example embodiments, but that various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims and their equivalents.

What is claimed is:

1. An organic electroluminescence device comprising:
a first electrode;
a second electrode on the first electrode; and
an emission layer between the first electrode and the second electrode,
wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides thereof,
wherein the emission layer comprises a compound represented by Formula 1:

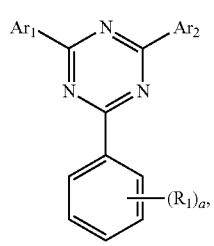

Formula 1 wherein, in Formula 1, any one selected from $Ar_1$ and $Ar_2$ is a substituted or unsubstituted adamantyl group, and the other one selected from $Ar_1$ and $Ar_2$ is a substituted or unsubstituted adamantyl group, or a substituted or unsubstituted phenyl group, a is an integer of 1 to 5, $R_1$ is a hydrogen atom, a deuterium atom, a substituted or unsubstituted oxy group, a substituted or unsubstituted thio group, a substituted or unsubstituted alkyl group having 1 to 20 carbon atoms, a substituted or unsubstituted aryl group having 6 to 20 ring-forming carbon atoms, or a substituted or unsubstituted heteroaryl group having 2 to 20 ring-forming carbon atoms, and at least one $R_1$ is represented by Formula 2:

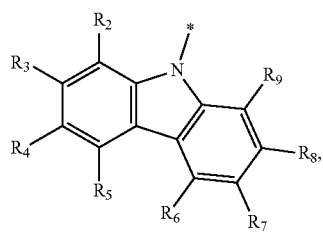

Formula 2 wherein, in Formula 2, $R_2$ to $R_9$ are each independently a hydrogen atom, a deuterium atom, a substituted or unsubstituted oxy group, a substituted or unsubstituted thio group, a substituted or unsubstituted alkyl group having 1 to 20 carbon atoms, a substituted or unsubstituted aryl group having 6 to 20 ring-forming carbon atoms, or a substituted or unsubstituted heteroaryl group having 2 to 20 ring-forming carbon atoms, and at least one pair selected from $R_6$ and $R_7$, and $R_8$ and $R_9$ is bonded to each other to form a condensed heterocycle.

2. The organic electroluminescence device of claim 1, wherein Formula 1 is represented by Formula 1-1 or Formula 1-2:

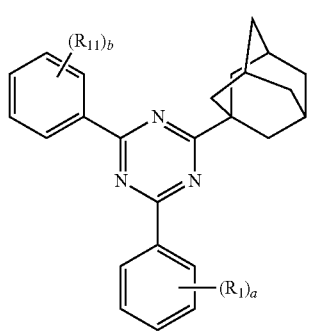

Formula 1-1

-continued

Formula 1-2

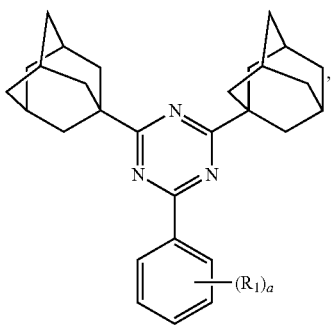

wherein, in Formulae 1-1 and 1-2, b is an integer of 0 to 5, $R_{11}$ is a hydrogen atom, a deuterium atom, a substituted or unsubstituted oxy group, a substituted or unsubstituted thio group, a substituted or unsubstituted alkyl group having 1 to 20 carbon atoms, a substituted or unsubstituted aryl group having 6 to 20 ring-forming carbon, or a substituted or unsubstituted heteroaryl group having 2 to 20 ring-forming carbon atoms, and a and $R_1$ are the same as defined in Formula 1.

3. The organic electroluminescence device of claim 2, wherein Formula 1-1 is represented by Formula 1-1A or Formula 1-1B:

Formula 1-1A

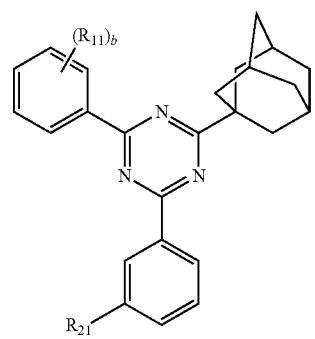

Formula 1-1B

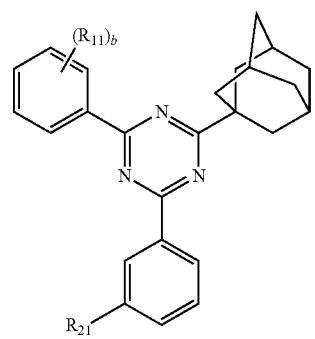

wherein, in Formulae 1-1A and 1-1B, b and $R_{11}$ are the same as defined in Formula 1-1, and $R_{21}$ and $R_{22}$ are each independently represented by Formula 2.

4. The organic electroluminescence device of claim 2, wherein Formula 1-2 is represented by Formula 1-2A or Formula 1-2B:

Formula 1-2A

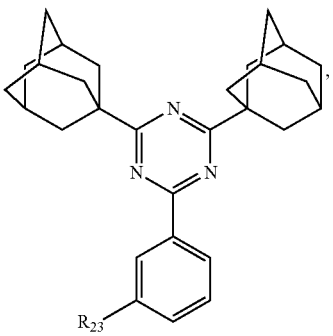

Formula 1-2B

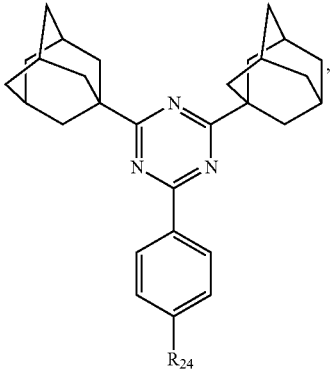

wherein, in Formulae 1-2A and 1-2B, $R_{23}$ and $R_{24}$ are each independently represented by Formula 2.

5. The organic electroluminescence device of claim 1, wherein Formula 2 is represented by any one of Formulae 2-1 to 2-3:

Formula 2-1

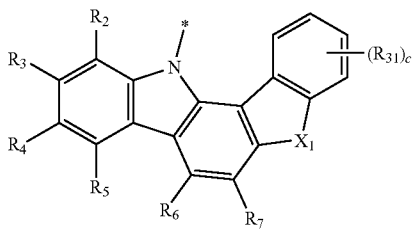

Formula 2-2

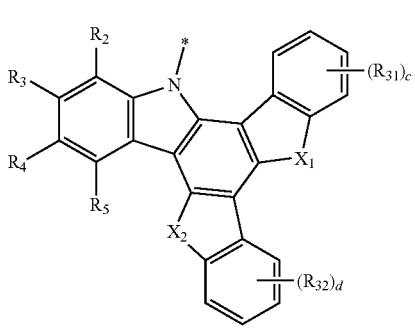

-continued

Formula 2-2

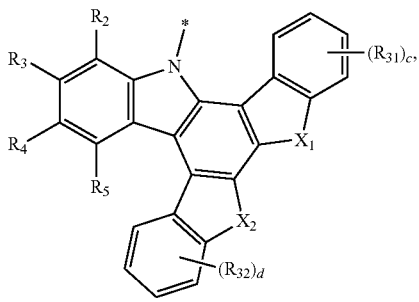

wherein, in Formulae 2-1 to 2-3, $X_1$ and $X_2$ are each independently $NR_{13}$, O, or S, $R_{13}$ is a hydrogen atom, a deuterium atom, a halogen atom, a substituted or unsubstituted alkyl group having 1 to 20 carbon atoms, an unsubstituted aryl group having 6 to 20 ring-forming carbon atoms, or an unsubstituted heteroaryl group having 2 to 20 ring-forming carbon atoms, c and d are each independently an integer of 0 to 4, $R_6$, $R_7$, $R_{31}$ and $R_{32}$ are each independently a hydrogen atom, a deuterium atom, a substituted or unsubstituted oxy group, a substituted or unsubstituted thio group, a substituted or unsubstituted alkyl group having 1 to 20 carbon atoms, a substituted or unsubstituted aryl group having 6 to 20 ring-forming carbon atoms, or a substituted or unsubstituted heteroaryl group having 2 to 20 ring-forming carbon atoms, and $R_2$ to $R_5$ are the same as defined in Formula 2.

6. The organic electroluminescence device of claim 5, wherein Formula 2-1 is represented by any one of Formulae 2-1A to 2-1C:

Formula 2-1A

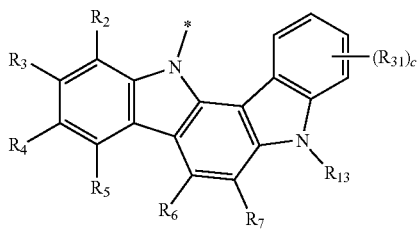

Formula 2-1B

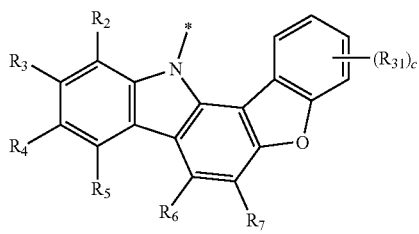

Formula 2-1C

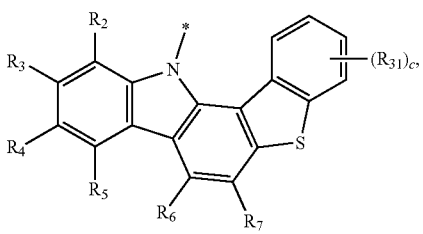

wherein, in Formulae 2-1A to 2-1C, $R_2$ to $R_7$, $R_{13}$, $R_{31}$, and c are the same as defined in Formula 2-1.

7. The organic electroluminescence device of claim 5, wherein Formula 2-2 is represented by any one of Formulae 2-2A to 2-20:

Formula 2-2A

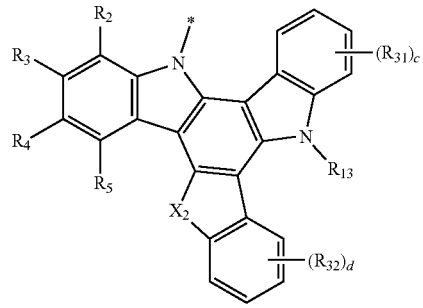

Formula 2-2B

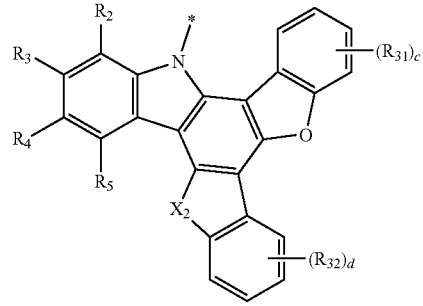

Formula 2-2C

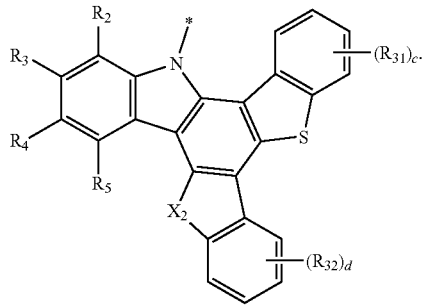

wherein, in Formulae 2-2A to 2-2C, $R_2$ to $R_5$, $R_{13}$, $R_{31}$, $R_{32}$, c, d, and $X_2$ are the same as defined in Formula 2-2.

8. The organic electroluminescence device of claim 5, wherein Formula 2-3 is represented by any one of Formulae 2-3A to 2-3:

Formula 2-3A

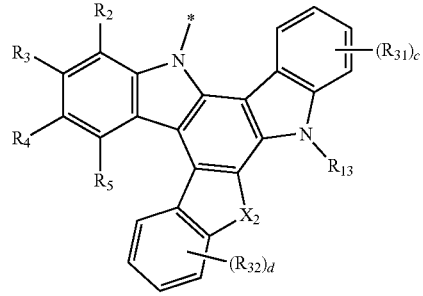

Formula 2-3B

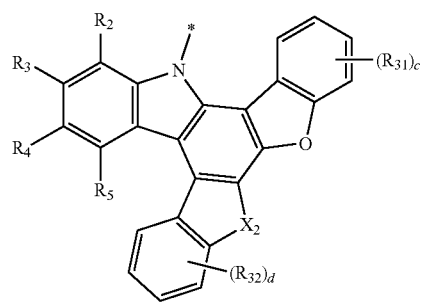

Formula 2-3C

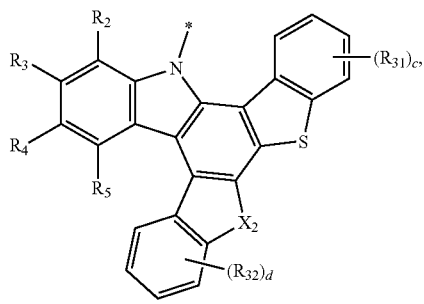

wherein, in Formulae 2-3A to 2-30, $R_2$ to $R_5$, $R_{13}$, $R_{31}$, $R_{32}$, c, d, and $X_2$ are the same as defined in Formula 2-3.

9. The organic electroluminescence device of claim 1, wherein the emission layer is to emit delayed fluorescence.

10. The organic electroluminescence device of claim 1, wherein the emission layer comprises at least one of the compounds of Compound Group 1:

Compound Group 1

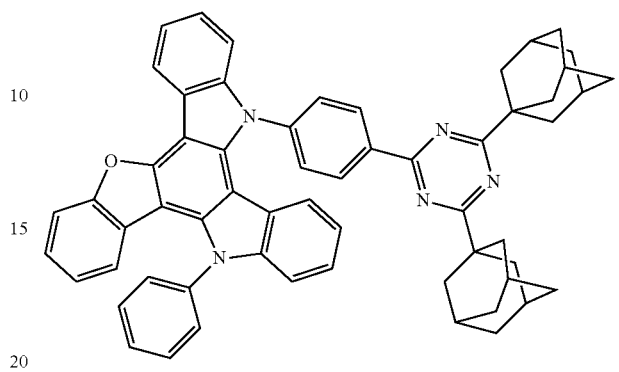

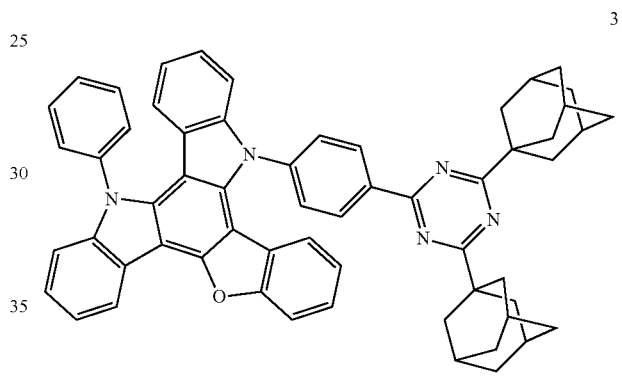

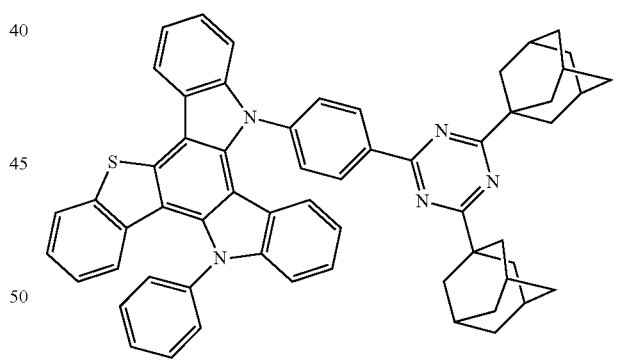

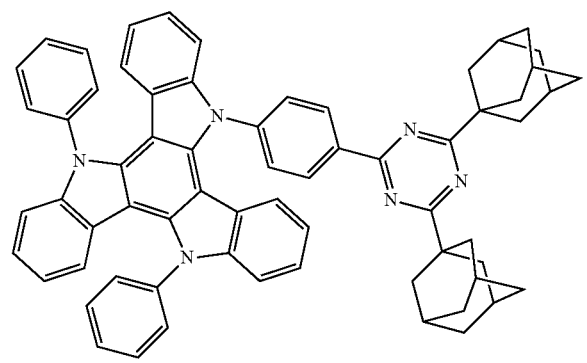

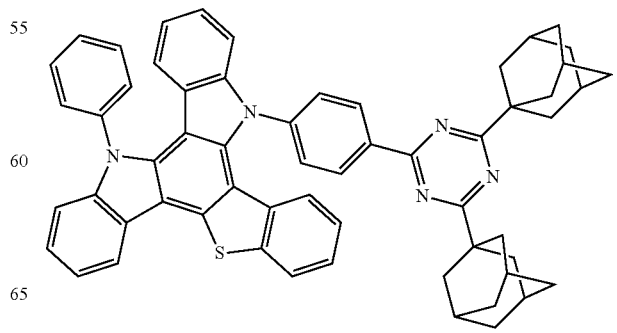

| 71 -continued | 72 -continued |
|---|---|
| 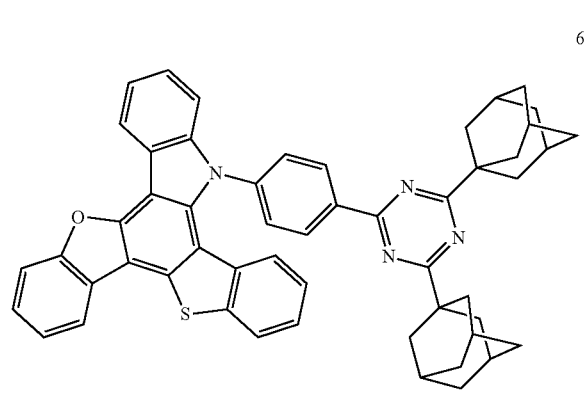 6 | 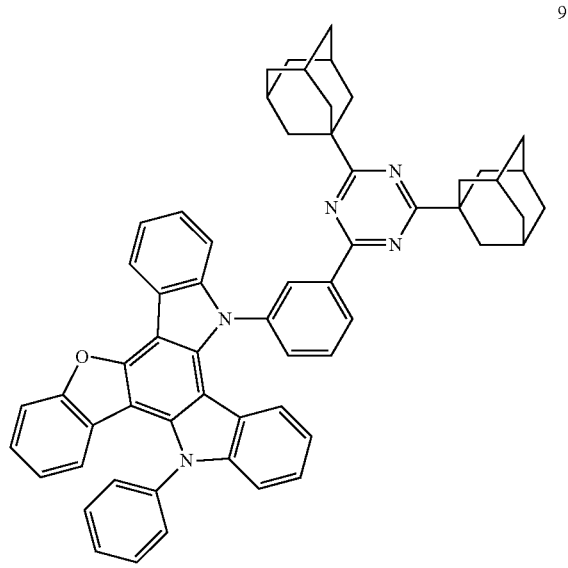 9 |
| 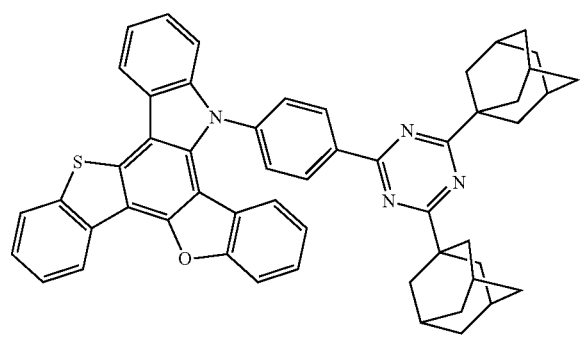 7 | 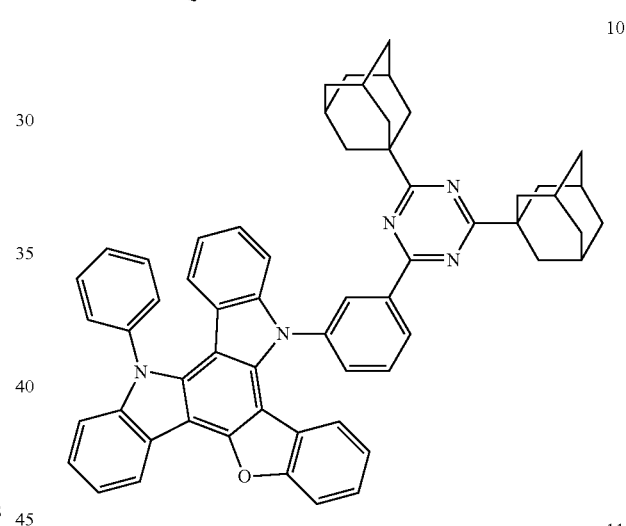 10 |
| 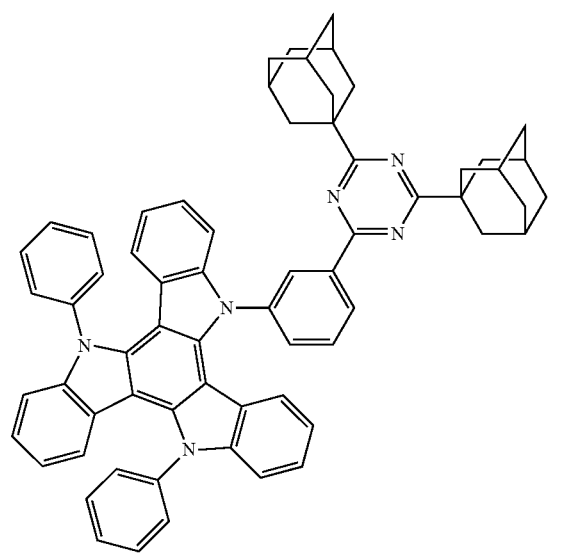 8 | 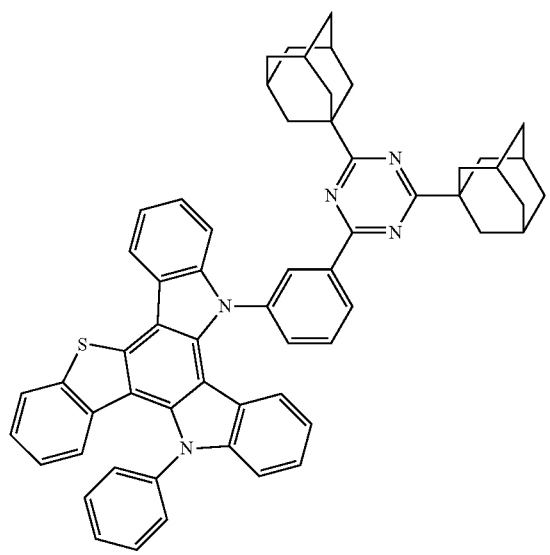 11 |

12
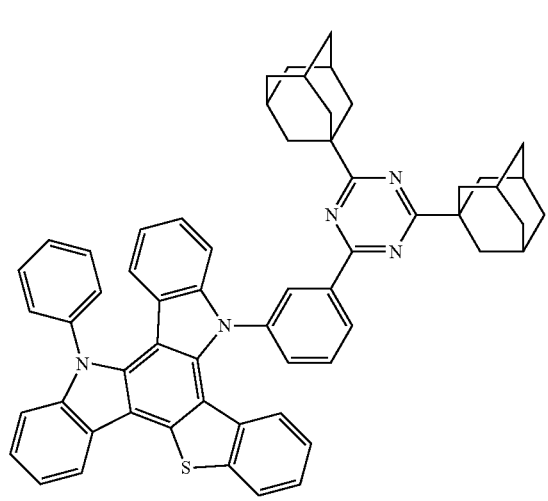
13
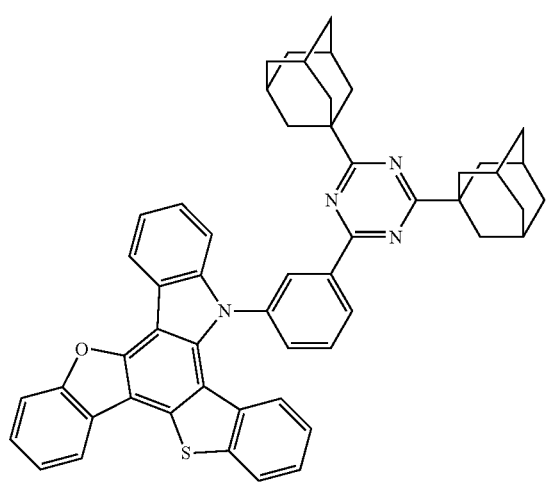
14
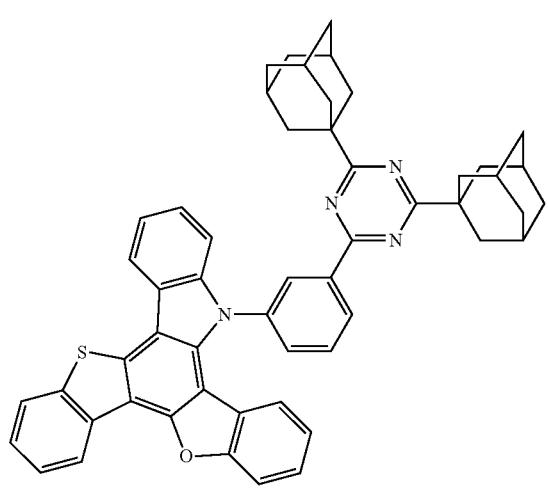
15
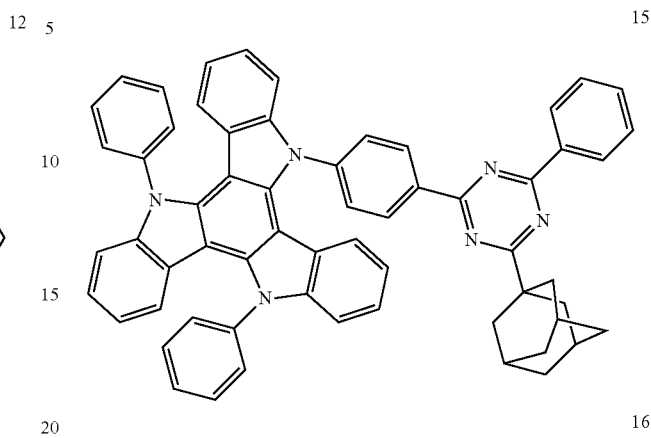
16
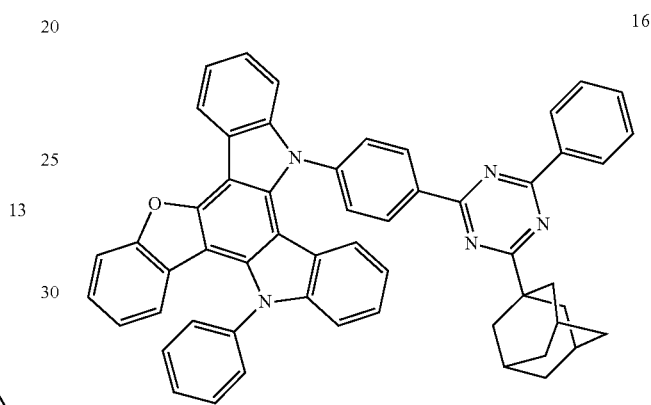
17
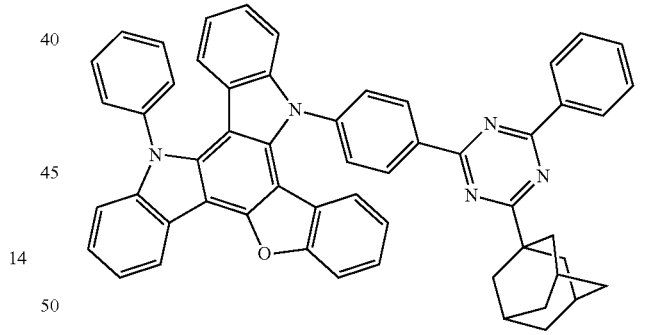
18
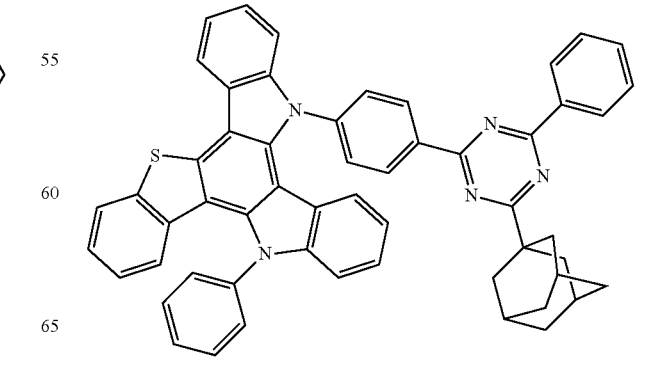

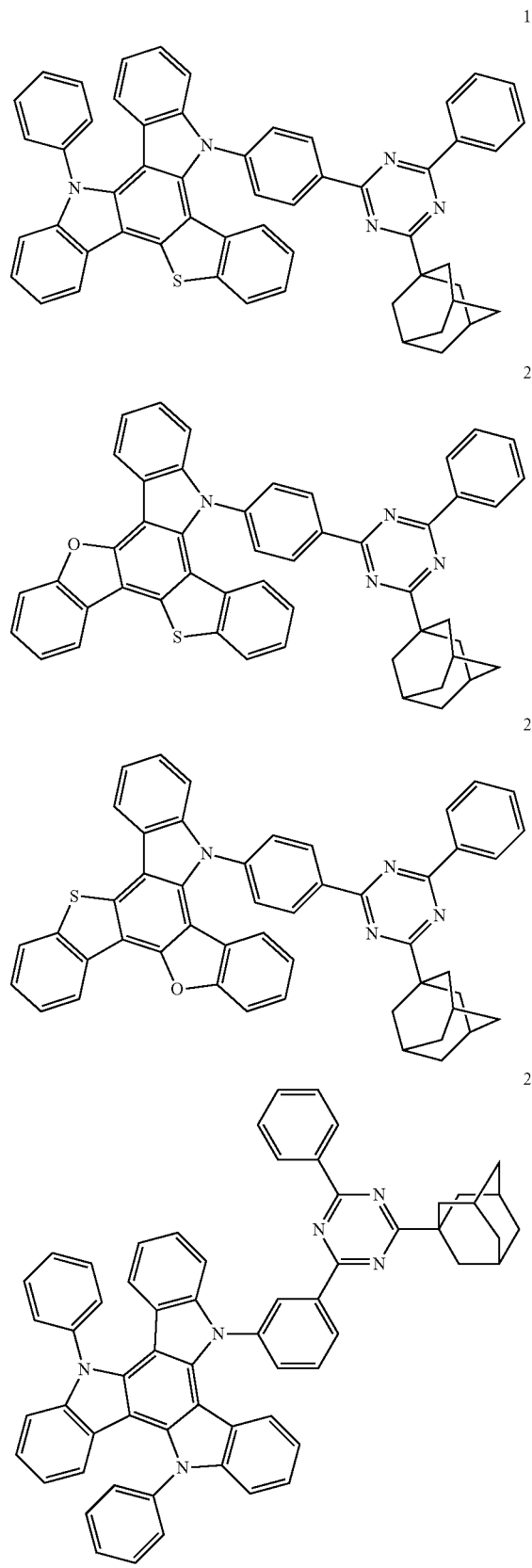
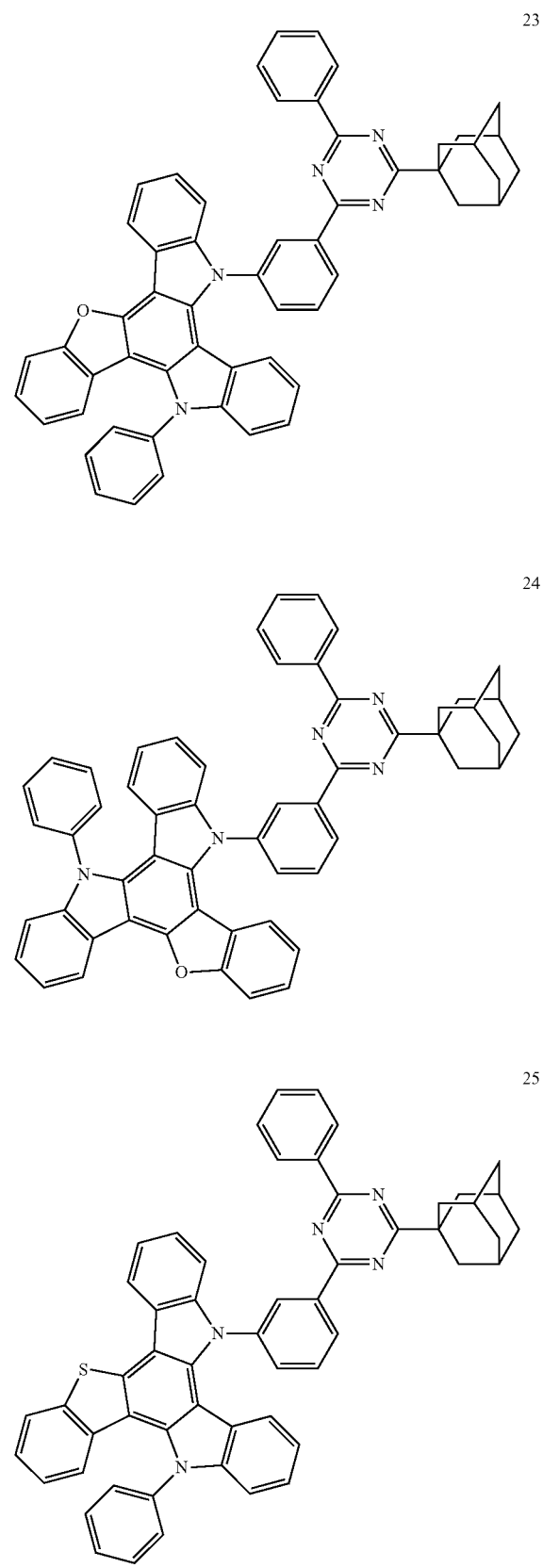

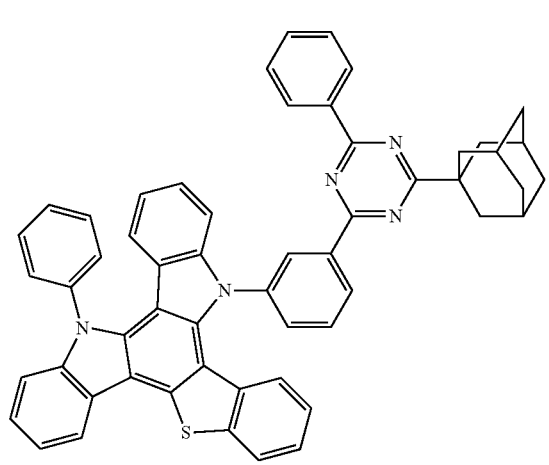
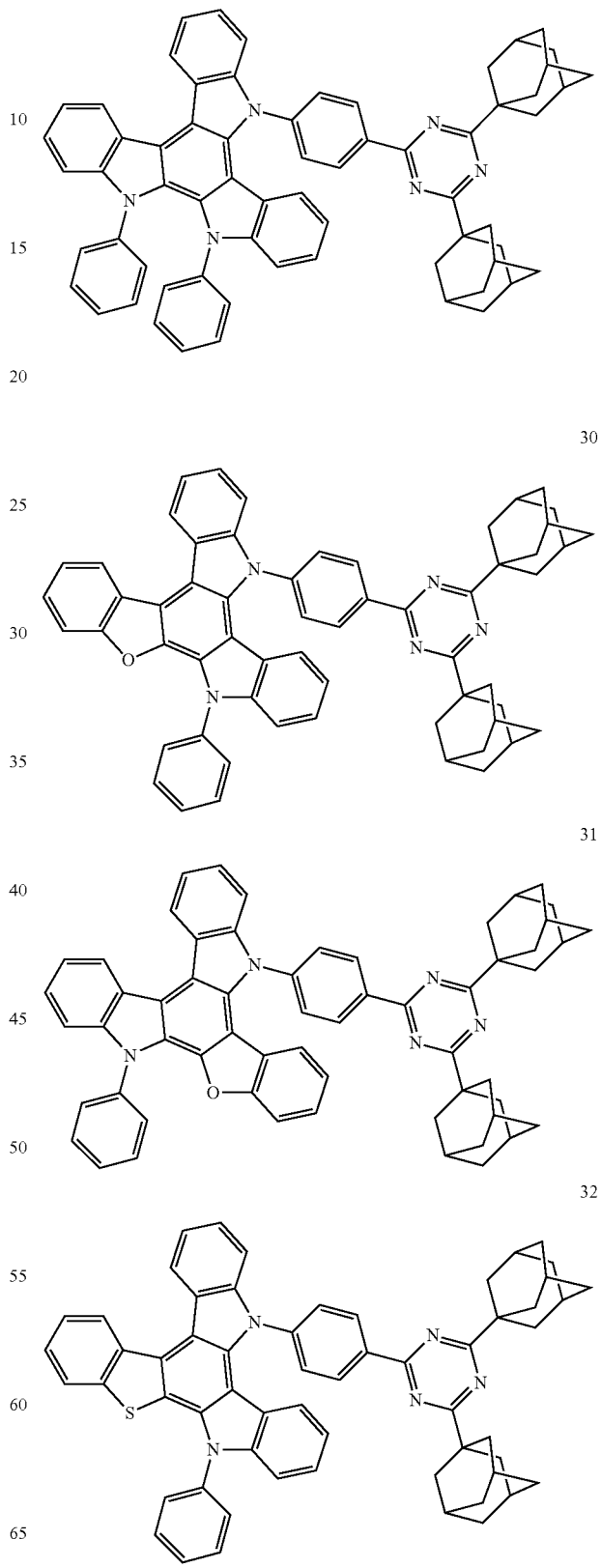

33
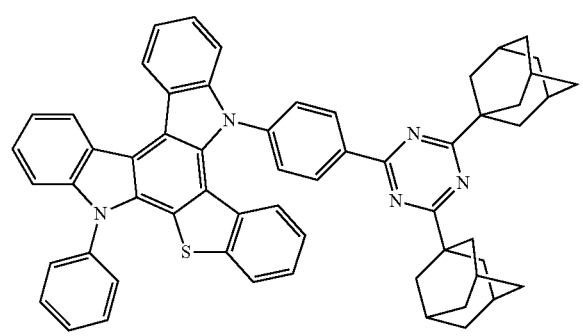
34
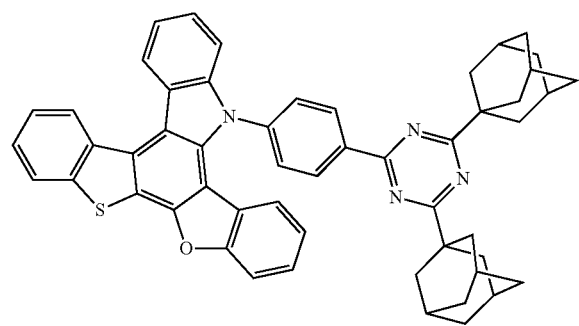
35
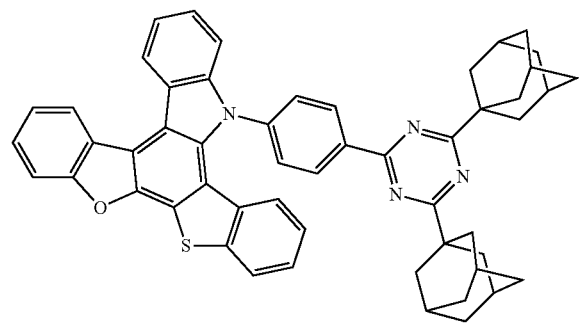
36
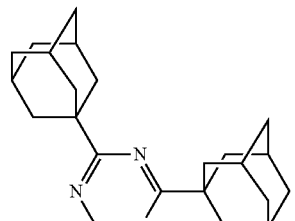
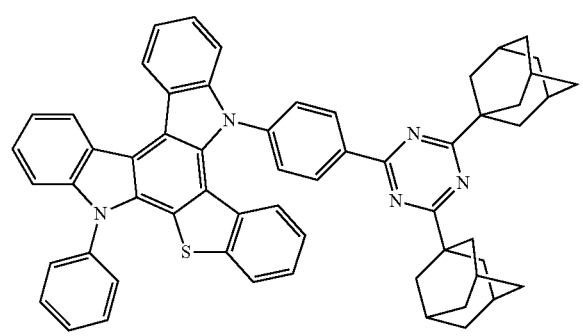
37
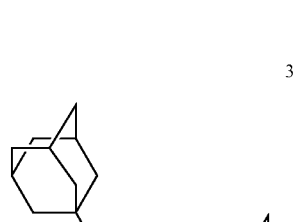
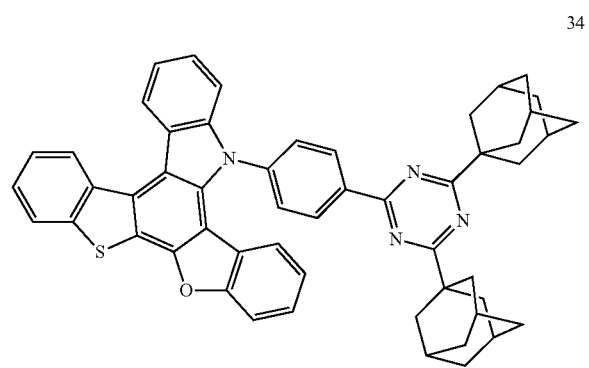
38
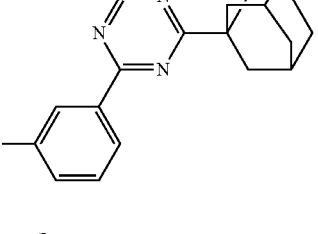
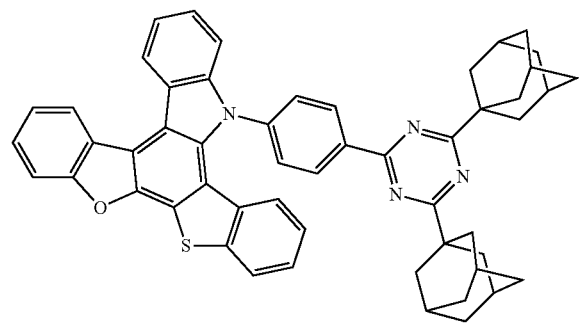

39
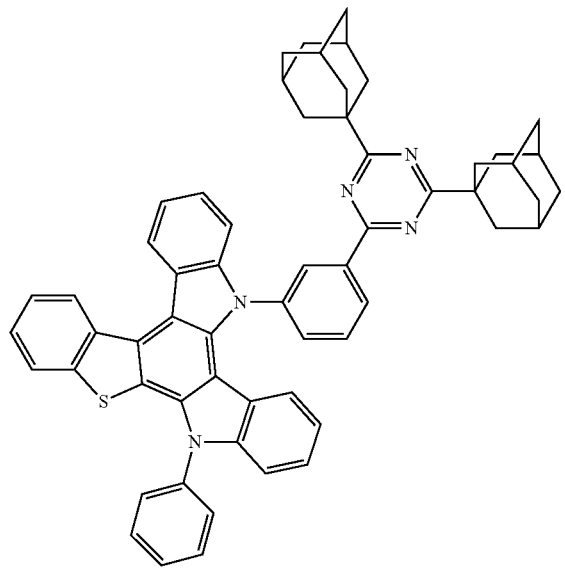
40
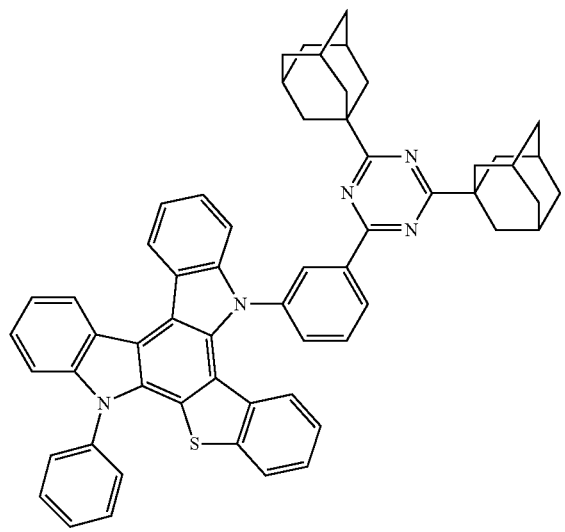
41
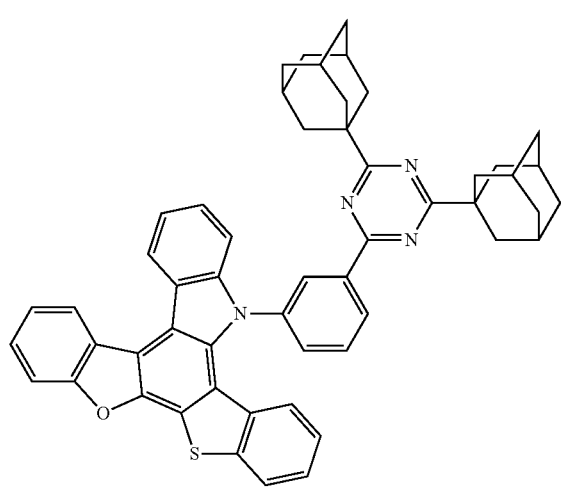
42
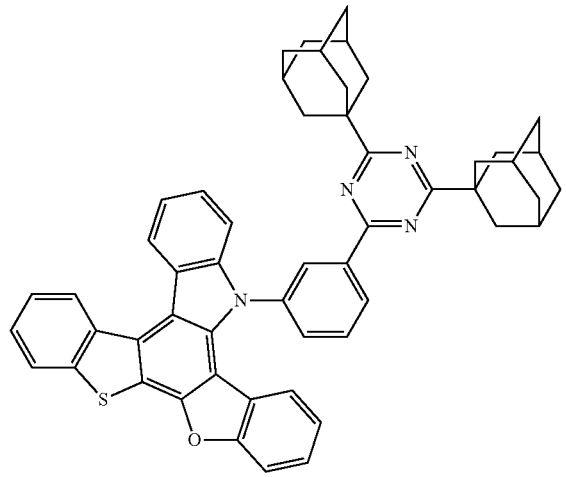
43
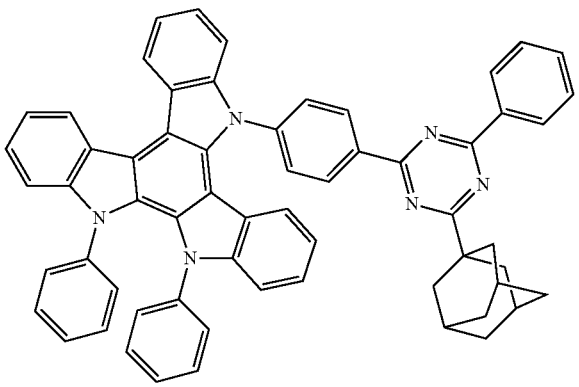
44
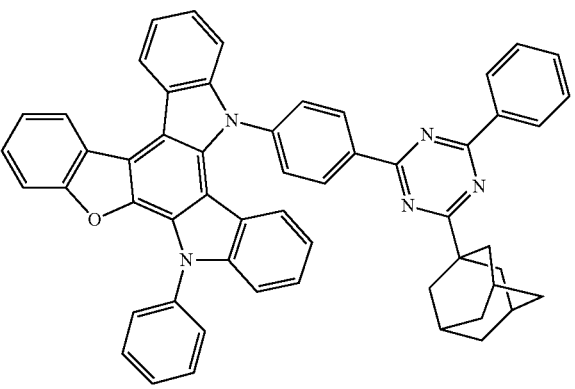

45
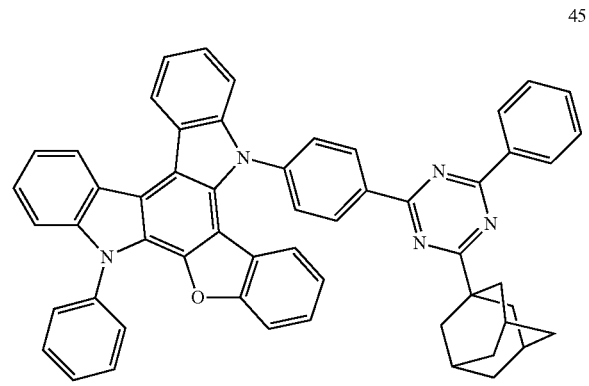
46
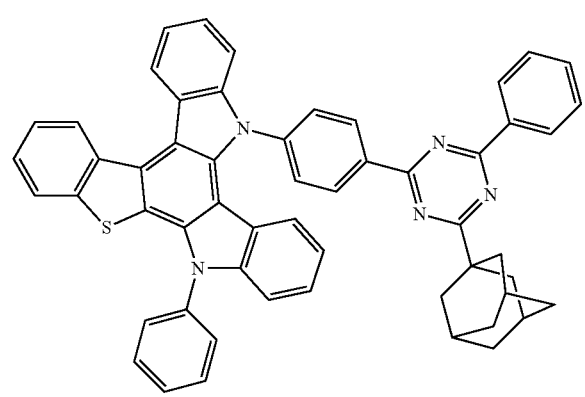
47
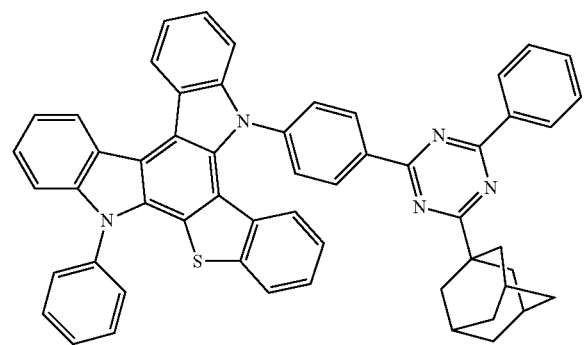
48
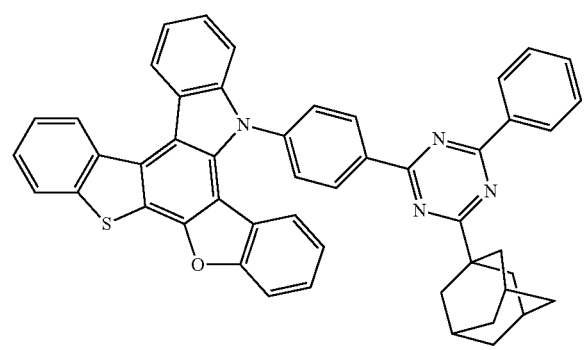
49
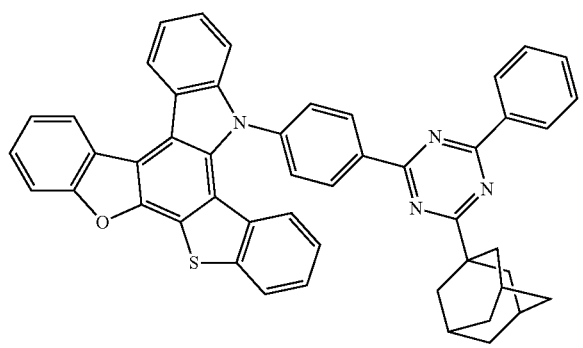
50
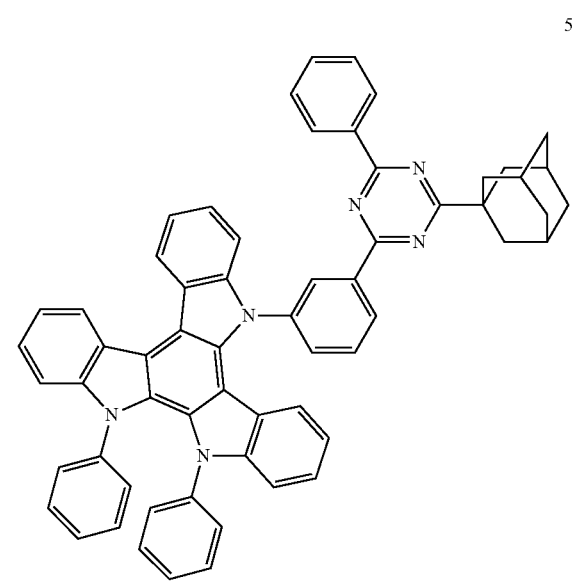
51
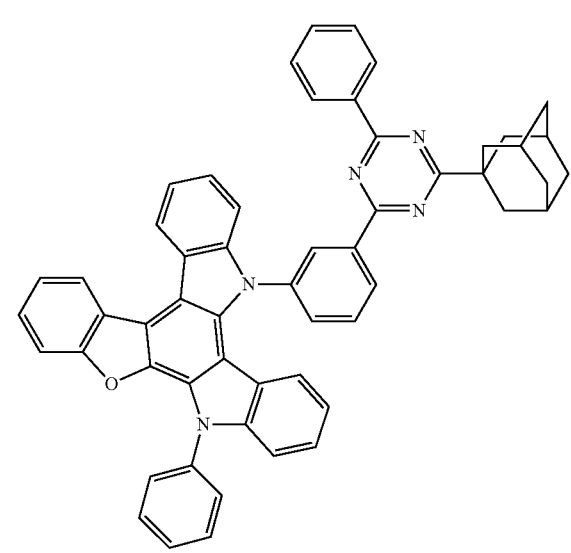

52
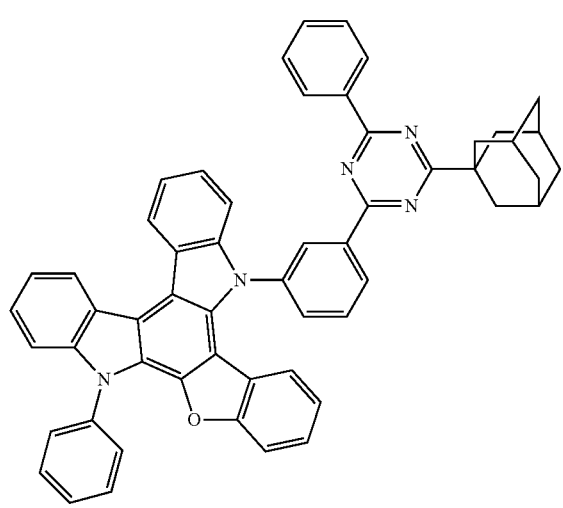
53
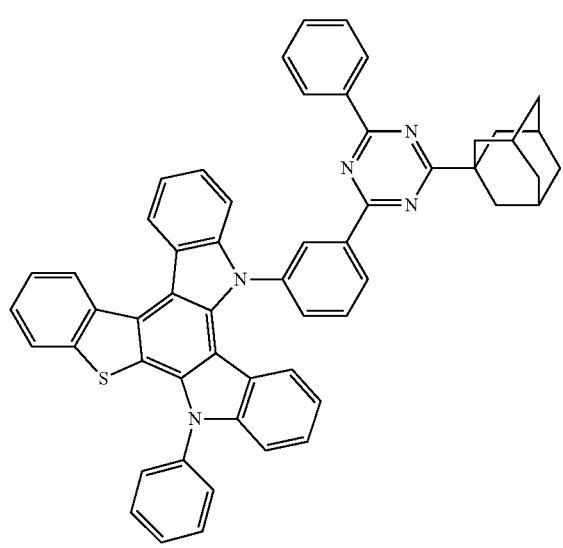
54
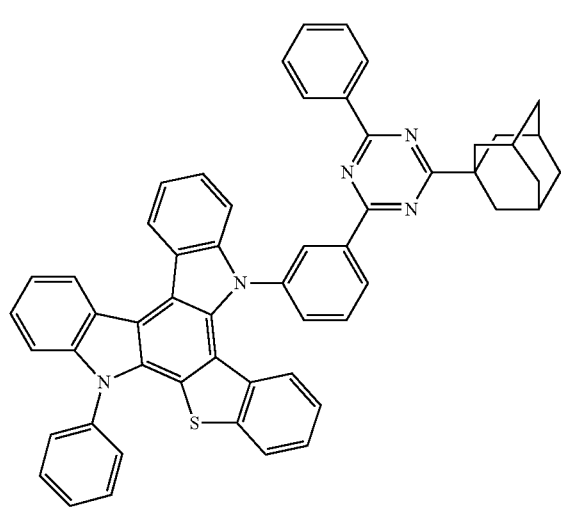
55
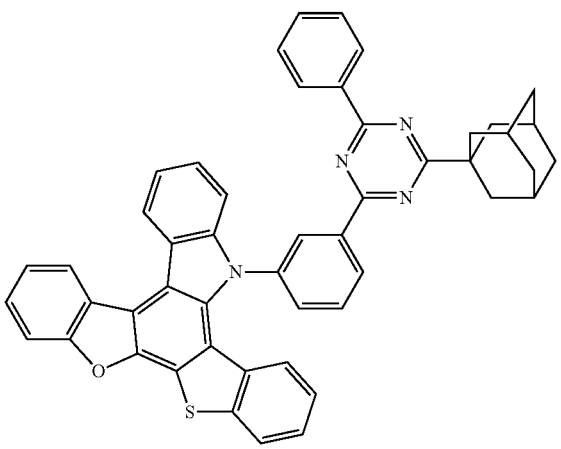
56
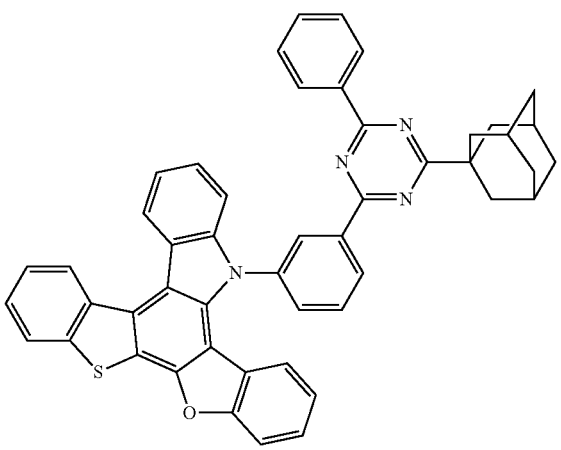
57
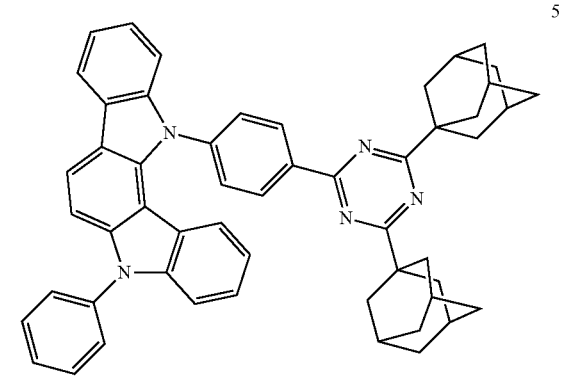
58
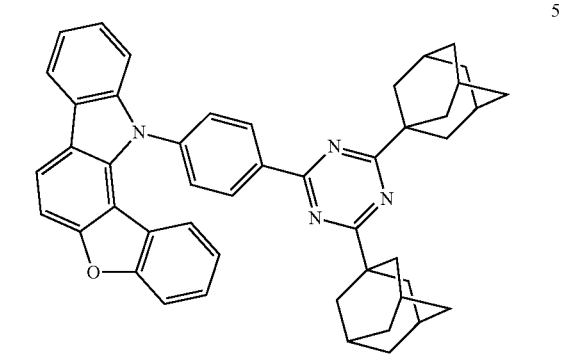

59
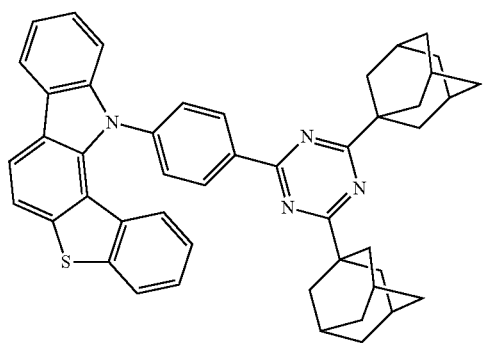
60
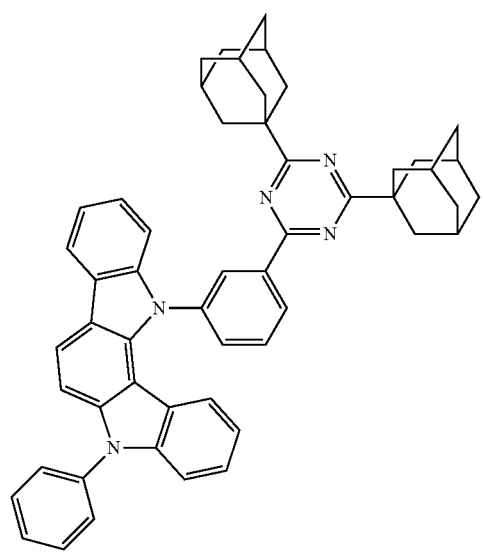
61
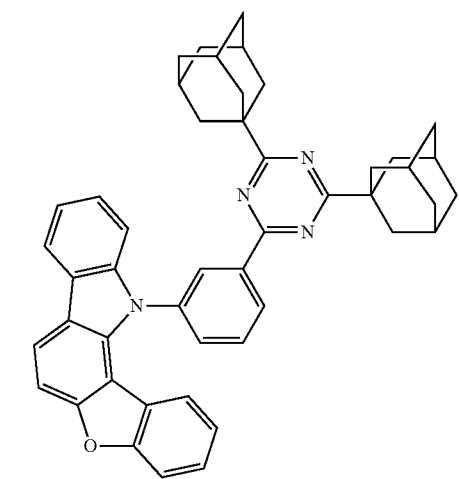
62
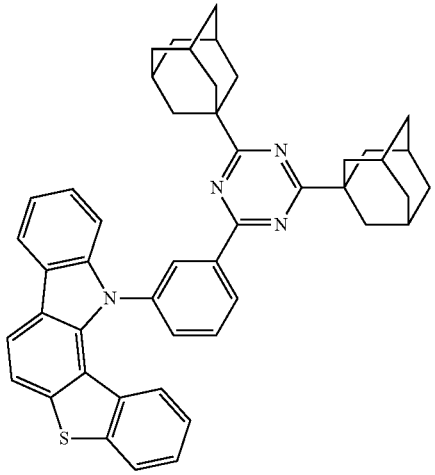
63
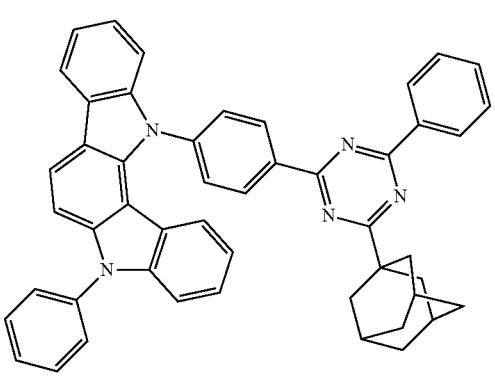
64
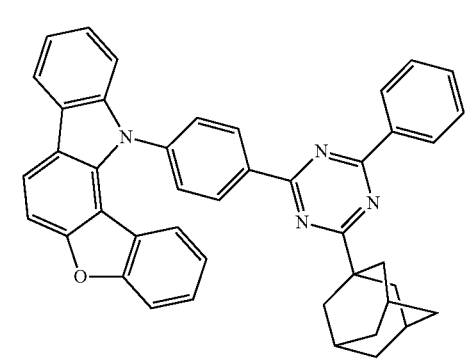
65
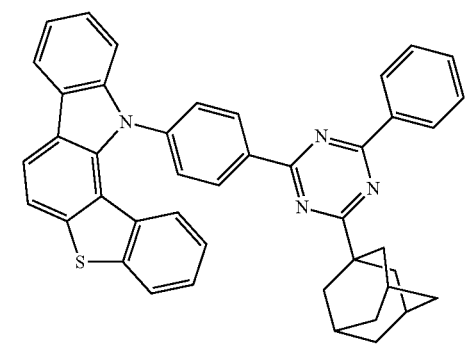

66

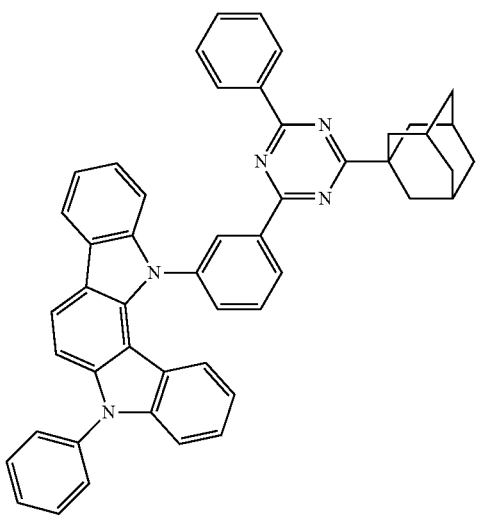

67

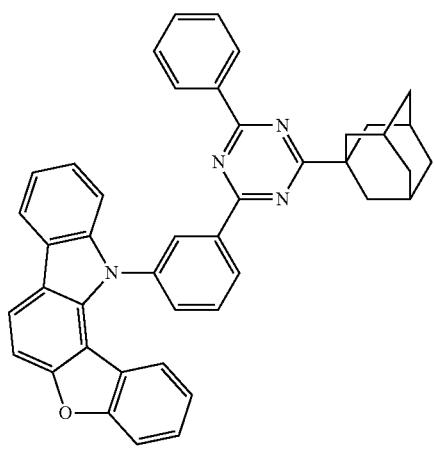

68

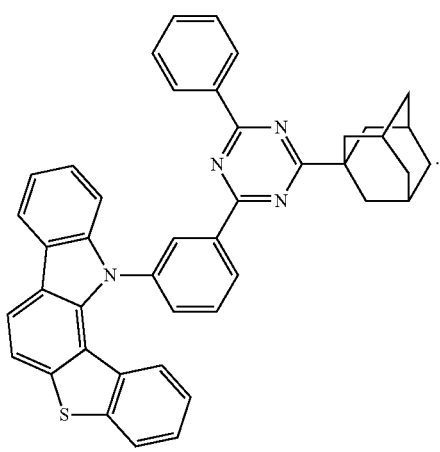

11. A compound represented by Formula 1:

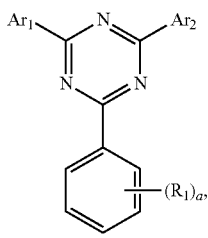

Formula 1 wherein, in Formula 1,
any one selected from $Ar_1$ and $Ar_2$ is a substituted or unsubstituted adamantyl group, and the other one selected from $Ar_1$ and $Ar_2$ is a substituted or unsubstituted adamantyl group, or a substituted or unsubstituted phenyl group, a is an integer of 1 to 5, $R_1$ is a hydrogen atom, a deuterium atom, a substituted or unsubstituted oxy group, a substituted or unsubstituted thio group, a substituted or unsubstituted alkyl group having 1 to 20 carbon atoms, a substituted or unsubstituted aryl group having 6 to 20 ring-forming carbon atoms, or a substituted or unsubstituted heteroaryl group having 2 to 20 ring-forming carbon atoms, and at least one $R_1$ is represented by Formula 2:

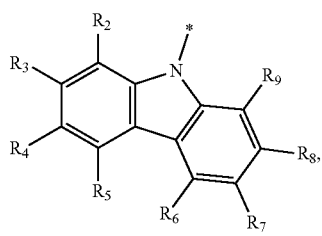

Formula 2 wherein, in Formula 2,
$R_2$ to $R_9$ are each independently a hydrogen atom, a deuterium atom, a substituted or unsubstituted oxy group, a substituted or unsubstituted thio group, a substituted or unsubstituted alkyl group having 1 to 20 carbon atoms, a substituted or unsubstituted aryl group having 6 to 20 ring-forming carbon atoms, or a substituted or unsubstituted heteroaryl group having 2 to 20 ring-forming carbon atoms, and at least one pair selected from $R_6$ and $R_7$, and $R_8$ and $R_9$ are bonded to each other to form a condensed heterocycle.

12. The compound of claim 11, wherein Formula 1 is represented by Formula 1-1 or Formula 1-2:

Formula 1-1

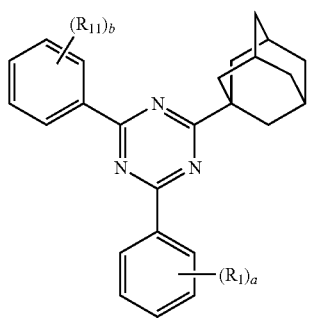

Formula 1-2

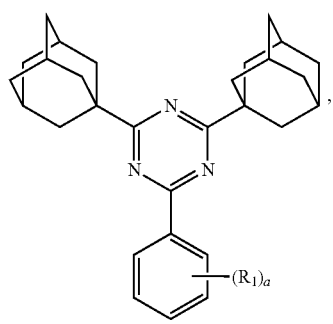

wherein, in Formulae 1-1 and 1-2, b is an integer of 0 to 5, $R_{11}$ is a hydrogen atom, a deuterium atom, a substituted or unsubstituted oxy group, a substituted or unsubstituted thio group, a substituted or unsubstituted alkyl group having 1 to 20 carbon atoms, a substituted or unsubstituted aryl group having 6 to 20 ring-forming carbon, or a substituted or unsubstituted heteroaryl group having 2 to 20 ring-forming carbon atoms, and a and $R_1$ are the same as defined in Formula 1.

13. The compound of claim 12, wherein Formula 1-1 is represented by Formula 1-1A or Formula 1-1B:

Formula 1-1A

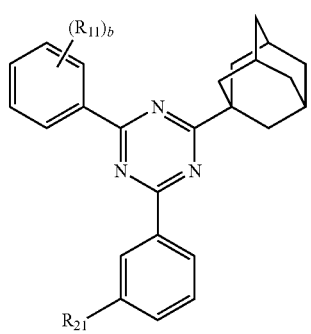

Formula 1-1B

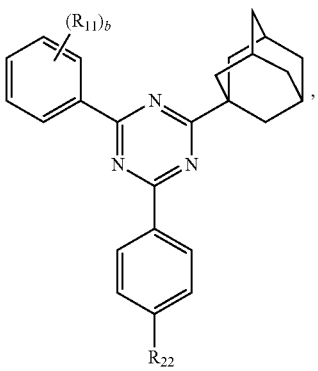

wherein, in Formulae 1-1A and 1-1B, b and $R_{11}$ are the same as defined in Formula 1-1, and $R_{21}$ and $R_{22}$ are each independently represented by Formula 2.

14. The compound of claim 12, wherein Formula 1-2 is represented by Formula 1-2A or Formula 1-2B:

Formula 1-2A

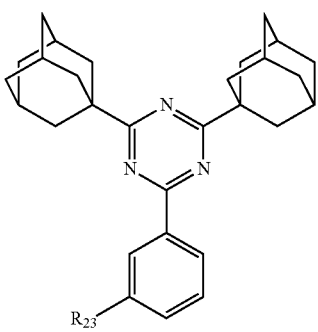

Formula 1-2B

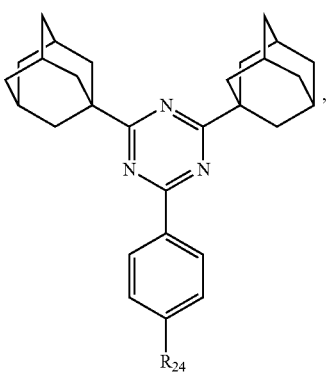

wherein, in Formulae 1-2A and 1-2B, $R_{23}$ and $R_{24}$ are each independently represented by Formula 2.

15. The compound of claim 11, wherein Formula 2 is represented by any one of Formulae 2-1 to 2-3:

Formula 2-1

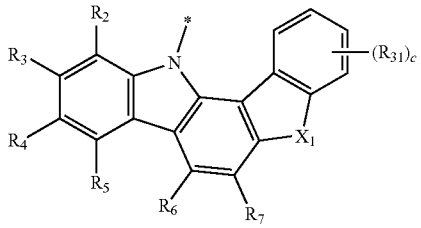

Formula 2-2

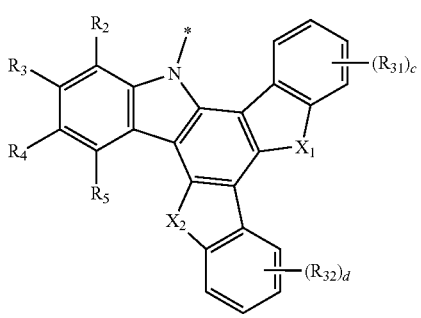

Formula 2-3

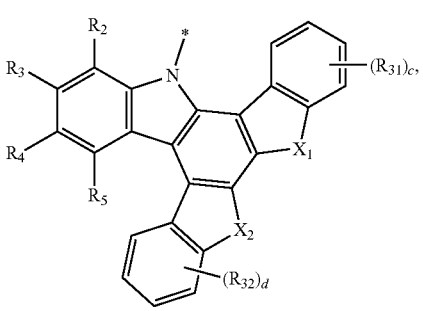

wherein, in Formulae 2-1 to 2-3, $X_1$ and $X_2$ are each independently $NR_{13}$, O, or S, $R_{13}$ is a hydrogen atom, a deuterium atom, a halogen atom, a substituted or unsubstituted alkyl group having 1 to 20 carbon atoms, an unsubstituted aryl group having 6 to 20 ring-forming carbon atoms, or an unsubstituted heteroaryl group having 2 to 20 ring-forming carbon atoms, c and d are each independently an integer of 0 to 4, $R_6$, $R_7$, $R_{31}$ and $R_{32}$ are each independently a hydrogen atom, a deuterium atom, a substituted or unsubstituted oxy group, a substituted or unsubstituted thio group, a substituted or unsubstituted alkyl group having 1 to 20 carbon atoms, a substituted or unsubstituted aryl group having 6 to 20 ring-forming carbon atoms, or a substituted or unsubstituted heteroaryl group having 2 to 20 ring-forming carbon atoms, and $R_2$ to $R_5$ are the same as defined in Formula 2.

16. The compound of claim 15, wherein Formula 2-1 is represented by any one of Formulae 2-1A to 2-1C:

Formula 2-1A

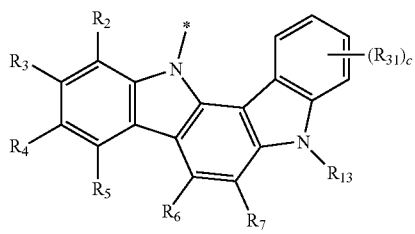

Formula 2-1B

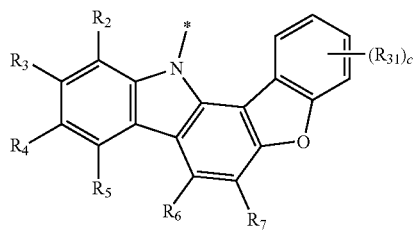

Formula 2-1C

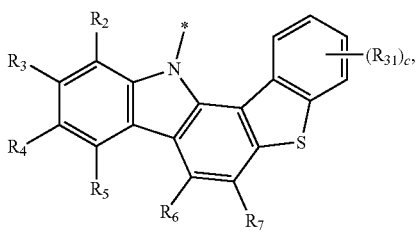

wherein, in Formulae 2-1A to 2-1C, $R_2$ to $R_7$, $R_{13}$, $R_{31}$, and c are the same as defined in Formula 2-1.

17. The compound of claim 15, wherein Formula 2-2 is represented by any one of Formulae 2-2A to 2-2C:

Formula 2-2A

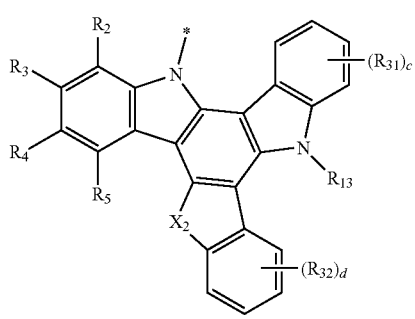

Formula 2-2B

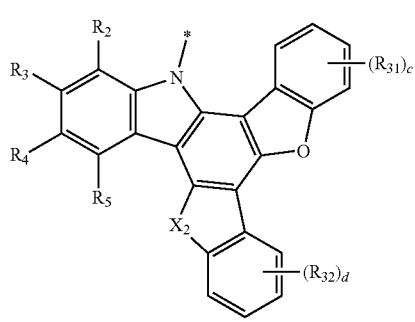

-continued

Formula 2-2C

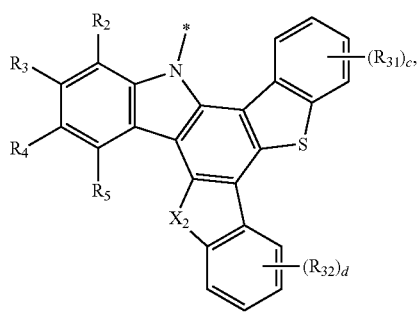

wherein, in Formulae 2-2A to 2-2C,

R₂ to R₅, R₁₃, R₃₁, R₃₂, c, d, and X₂ are the same as defined in Formula 2-2.

18. The compound of claim 15, wherein Formula 2-3 is represented by any one of Formulae 2-3A to 2-3:

Formula 2-3A

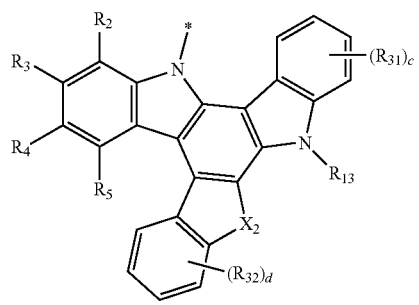

Formula 2-3B

Formula 2-3C

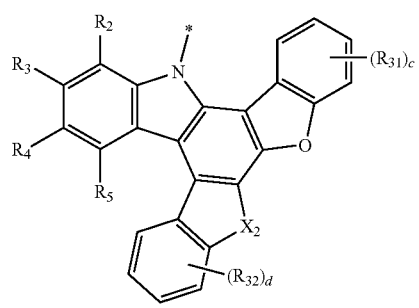

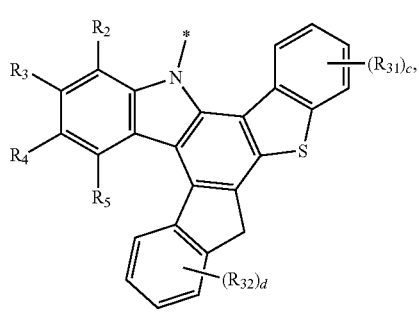

wherein, in Formulae 2-3A to 2-3C,

R₂ to R₅, R₁₃, R₃₁, R₃₂, c, d, and X₂ are the same as defined in Formula 2-3.

19. The compound of claim 11, wherein the compound represented by Formula 1 is a thermally activated delayed fluorescence material.

20. The compound of claim 11, wherein the compound represented by Formula 1 is any one of the compounds represented by Compound Group 1:

Compound Group 1

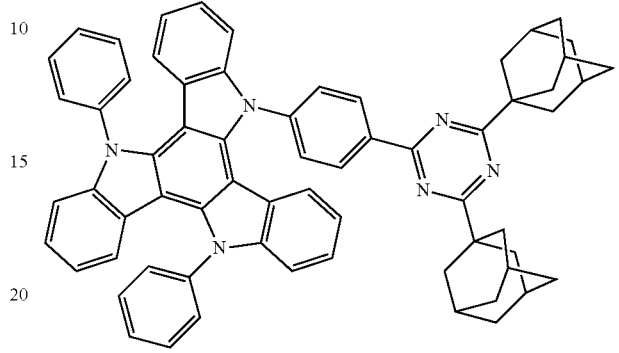

1

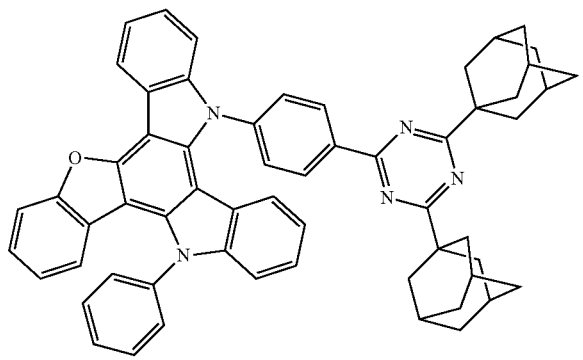

2

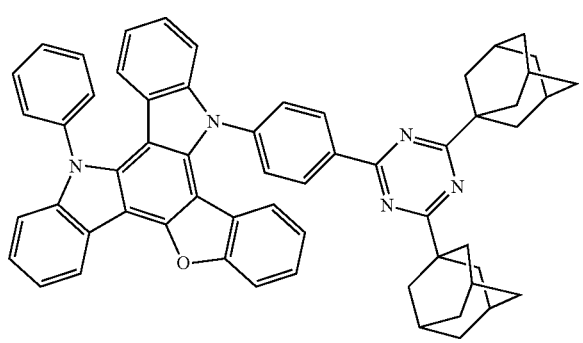

3

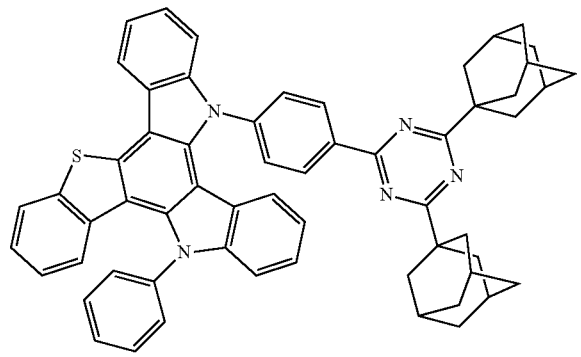

4

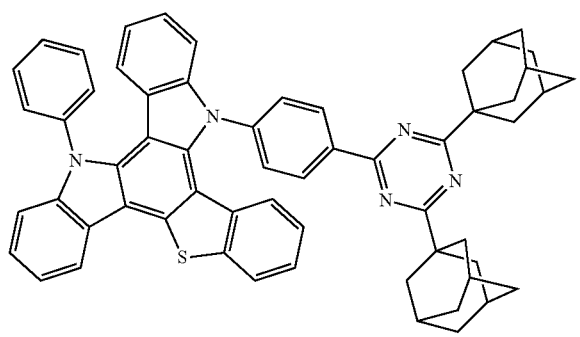
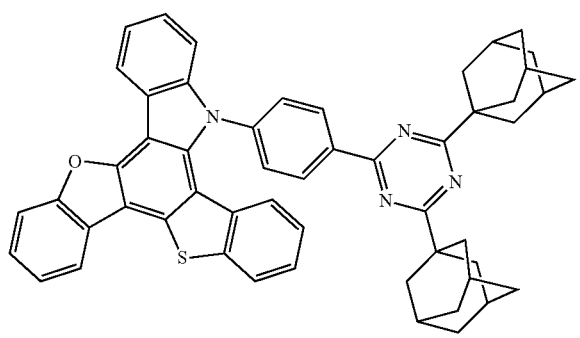
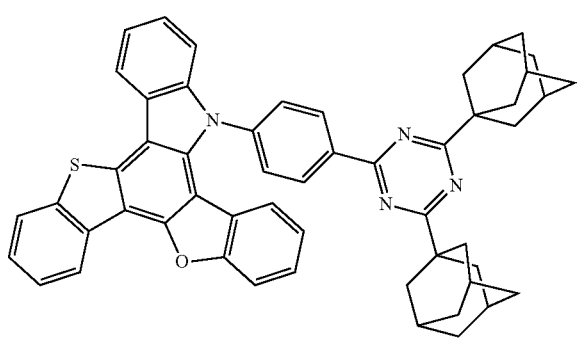
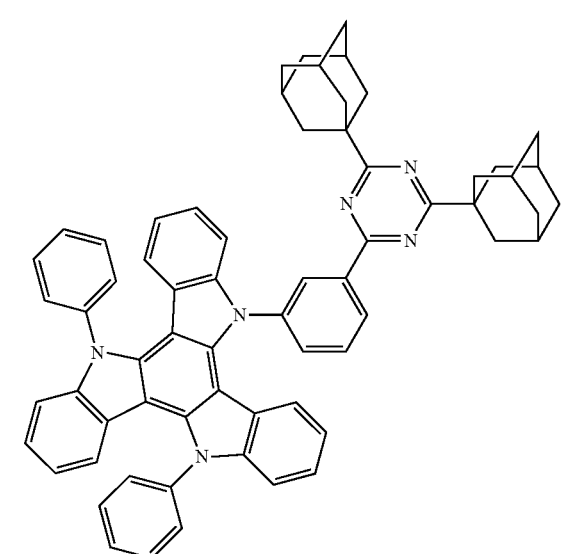
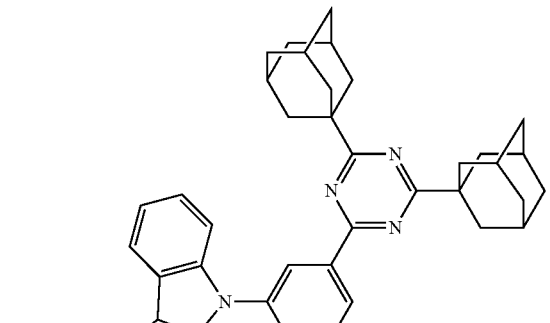
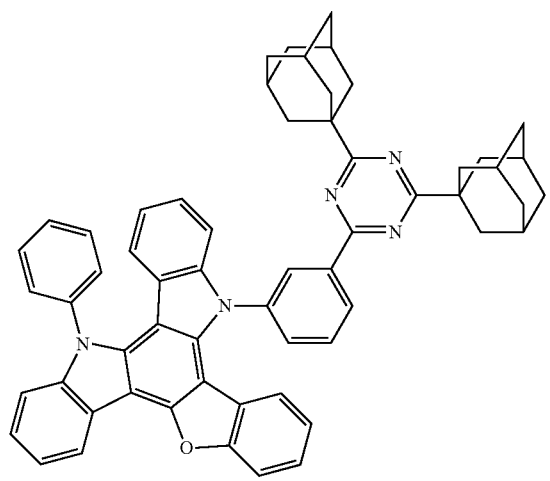
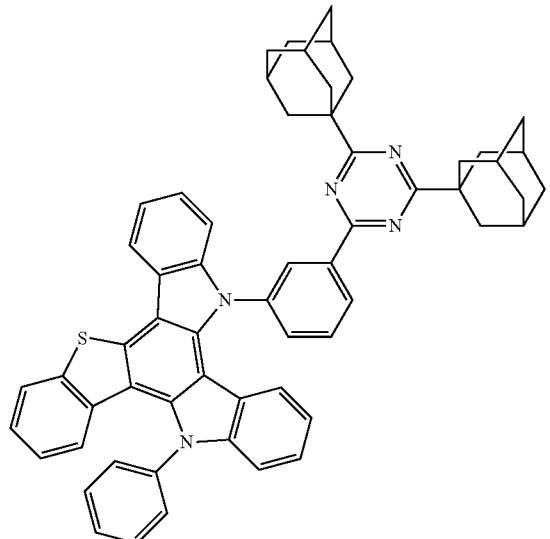

12
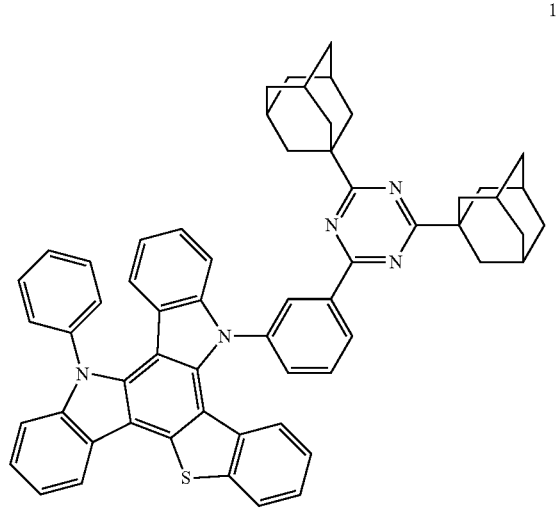
13
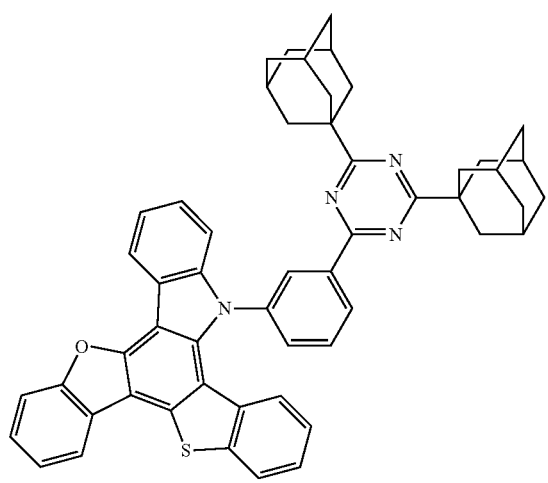
14
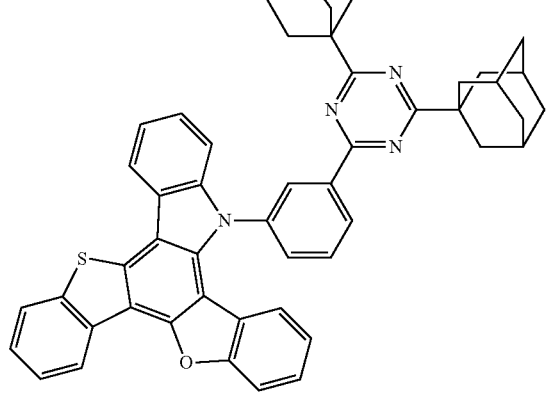
15
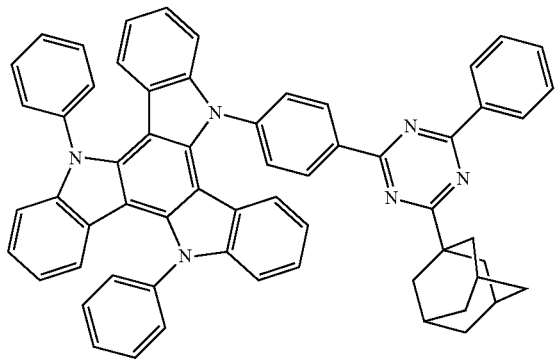
16
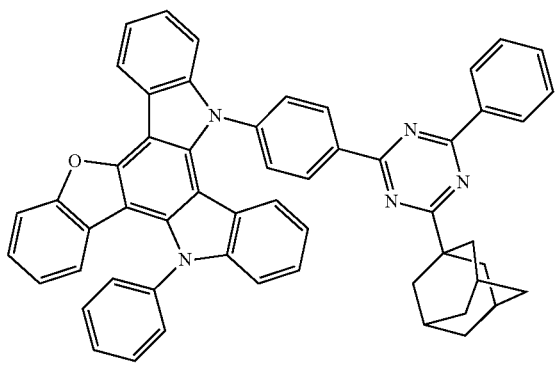
17
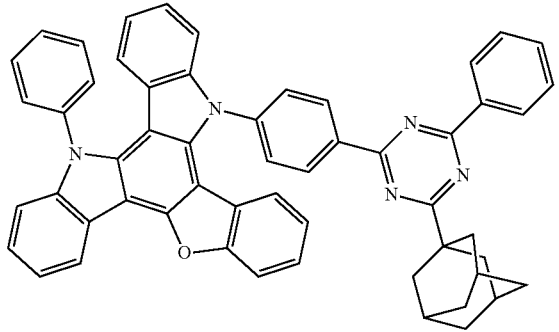
18
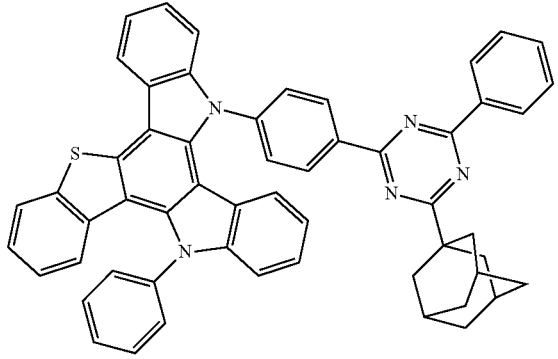

101
-continued
19
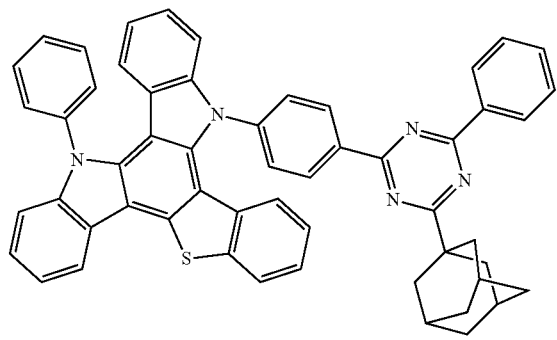
20
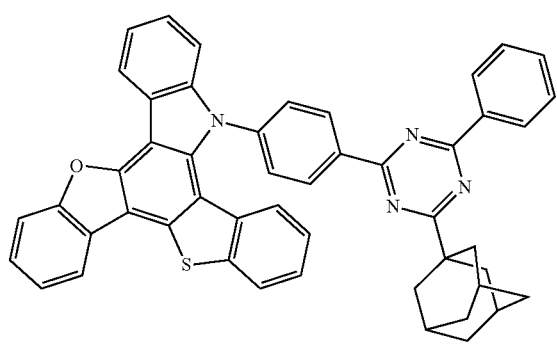
21
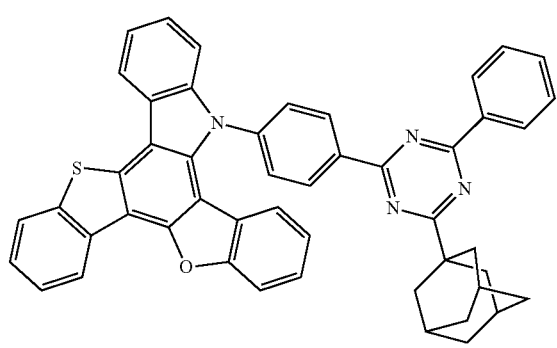
22
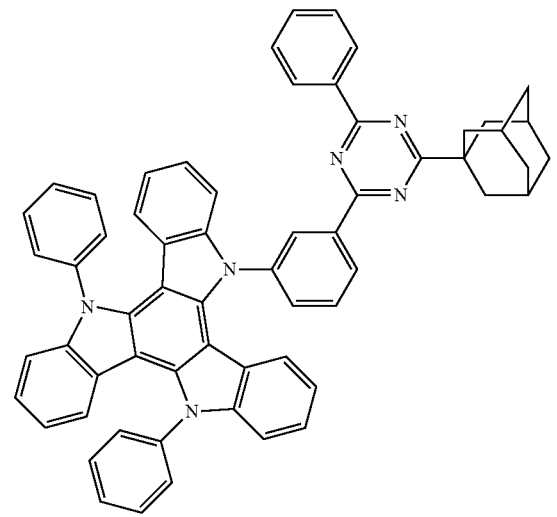
102
-continued
23
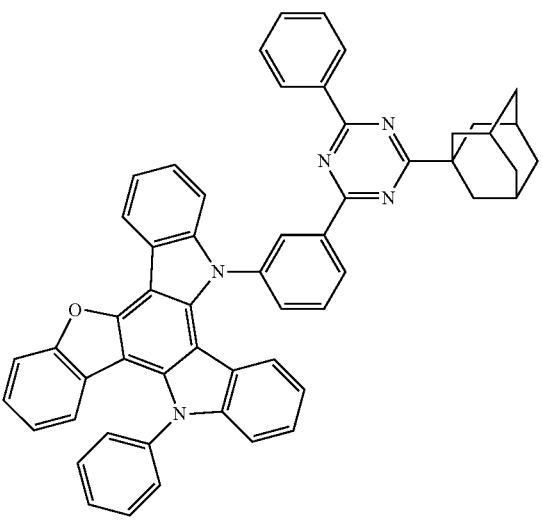
24
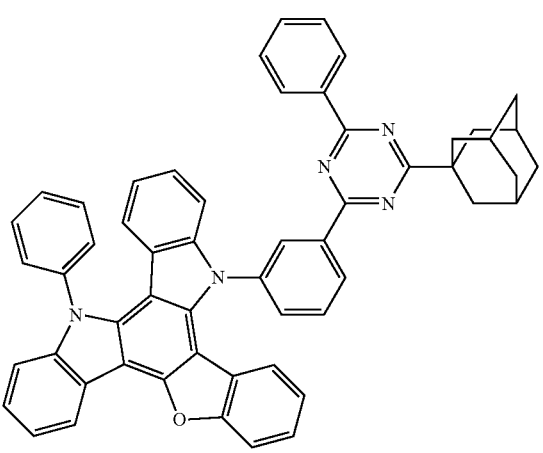
25
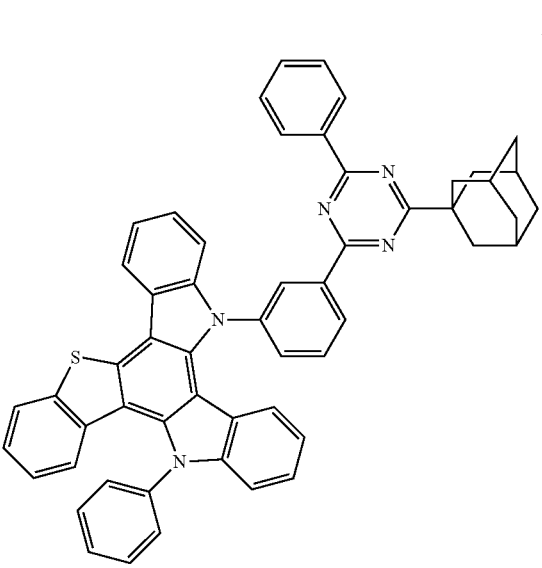

103
-continued
26
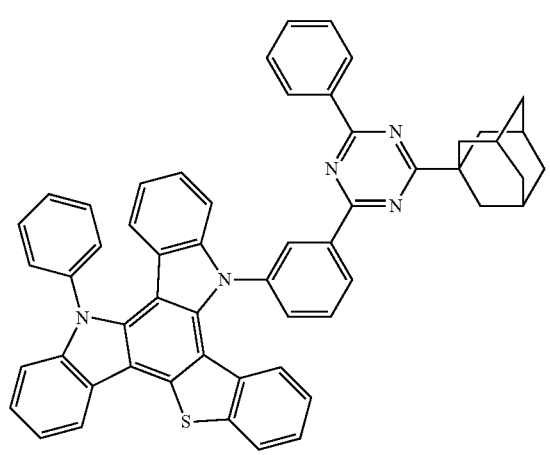
27
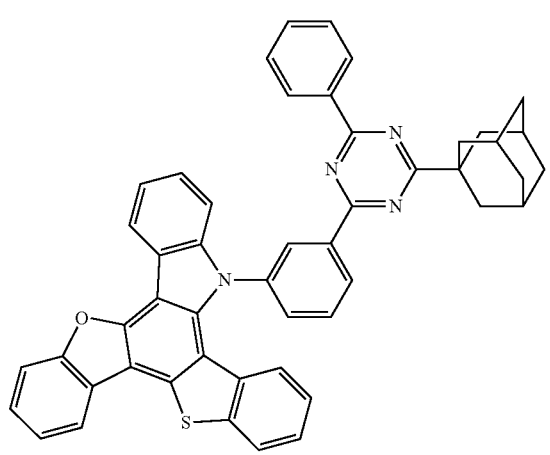
28
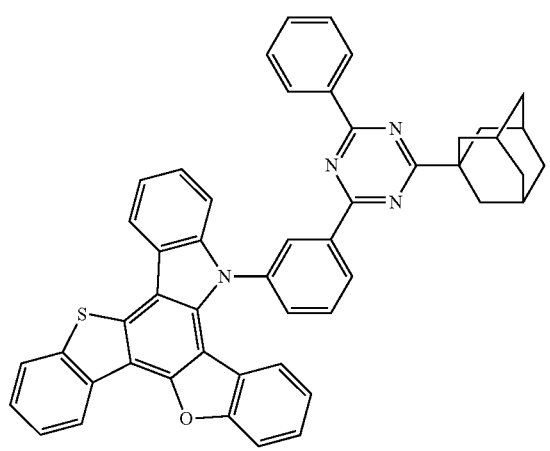
104
-continued
29
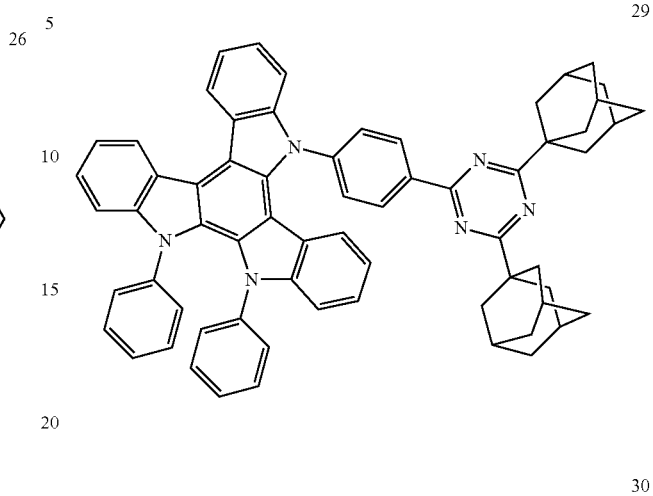
30
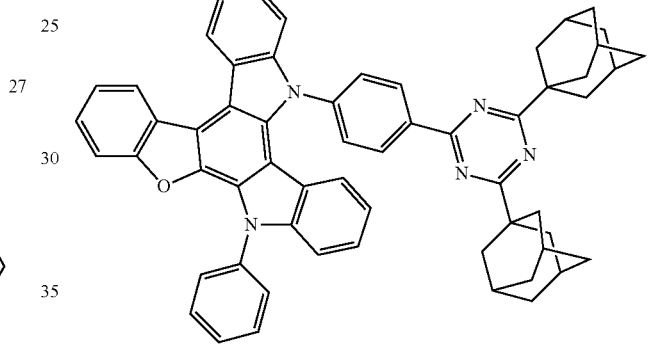
31
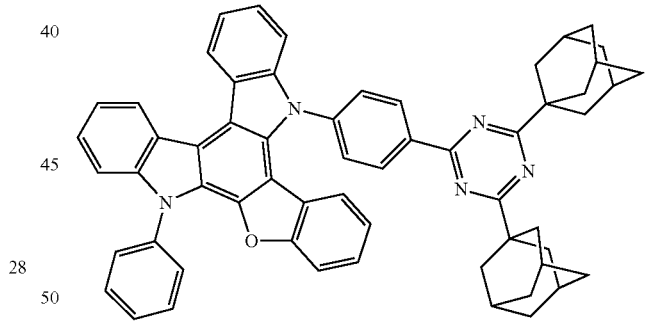
32
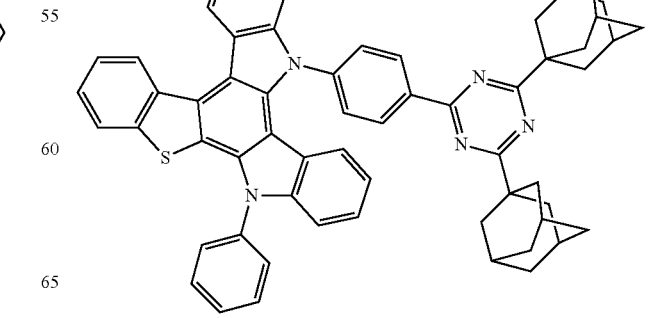

33
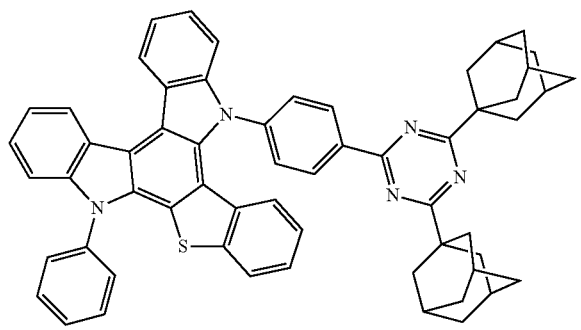
34
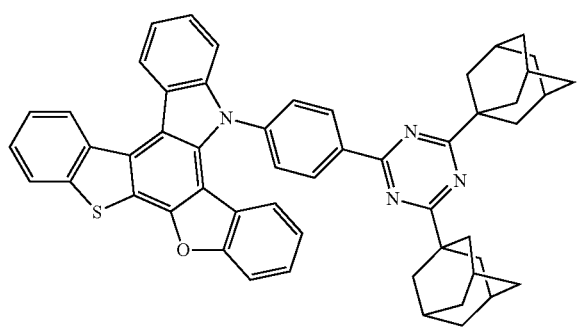
35
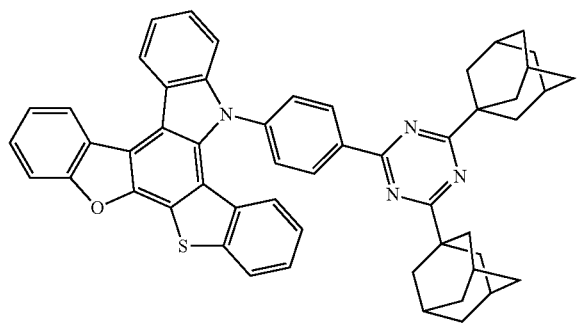
36
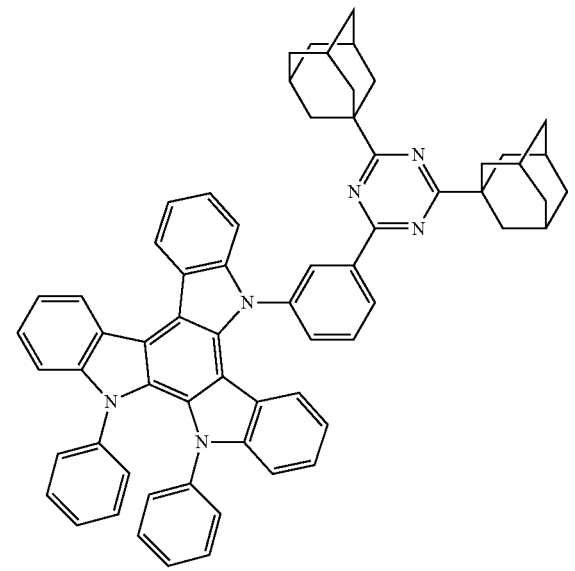
37
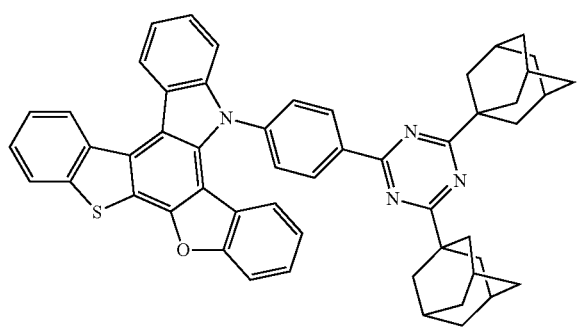
38
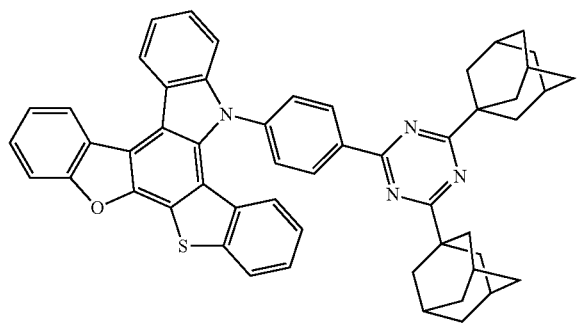
39
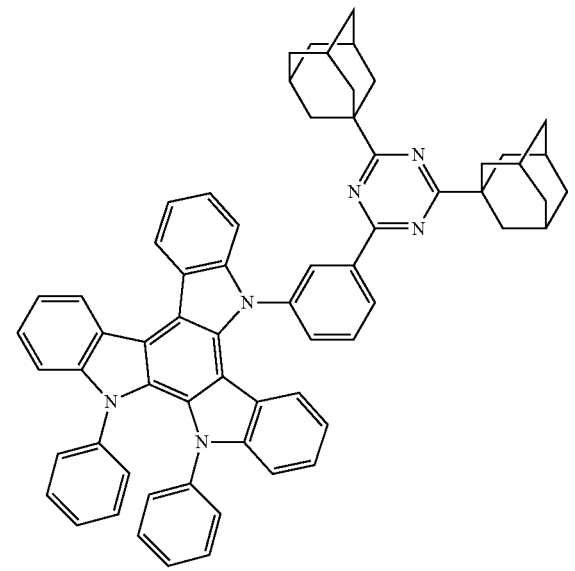

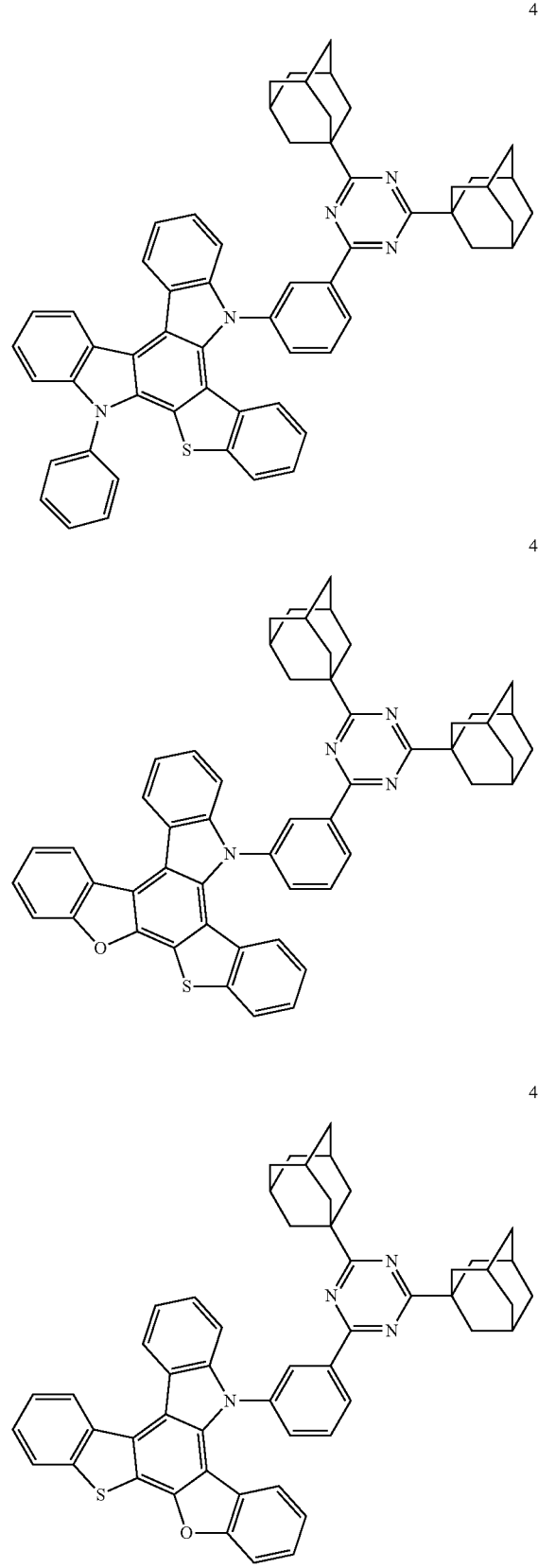
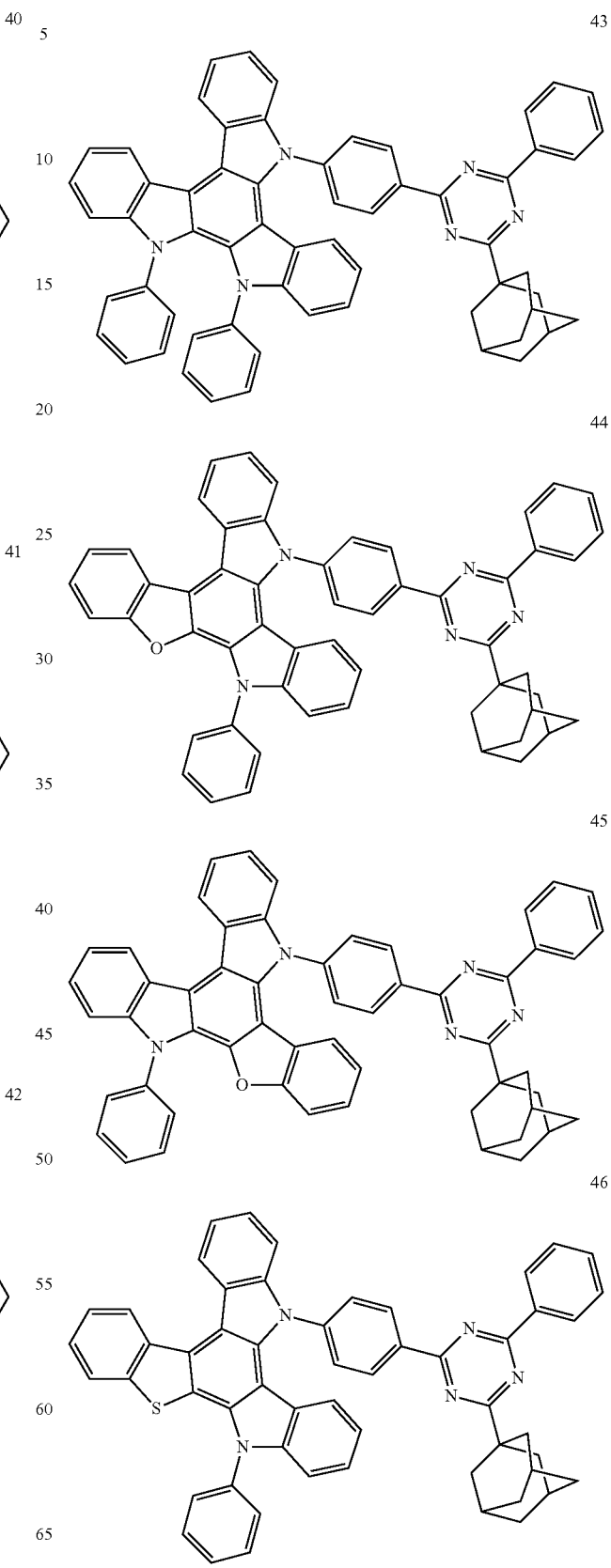

47
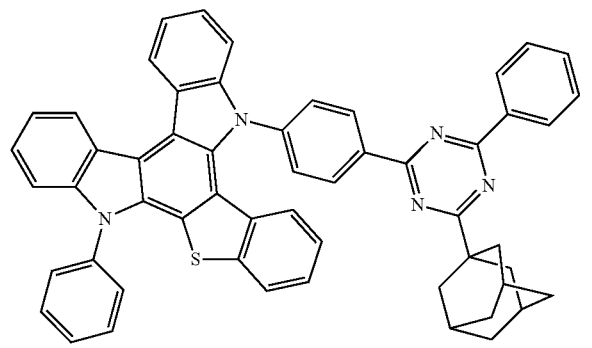
48
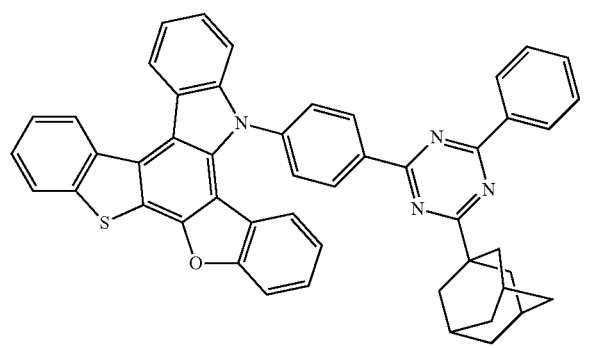
49
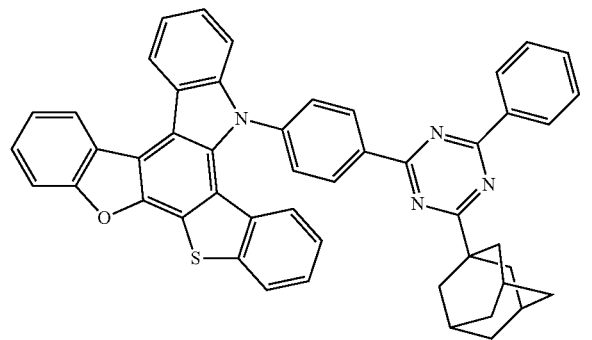
50
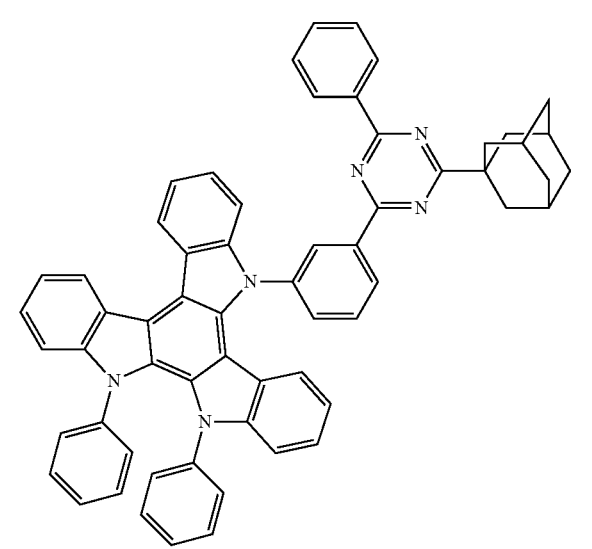
51
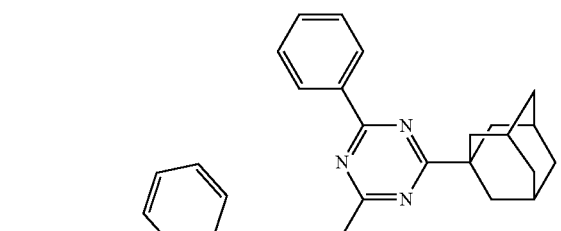
52
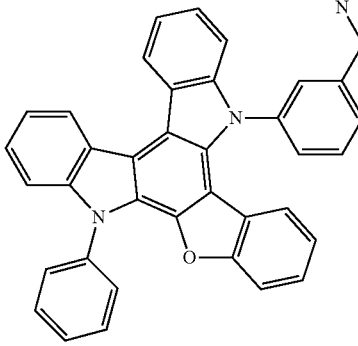
53
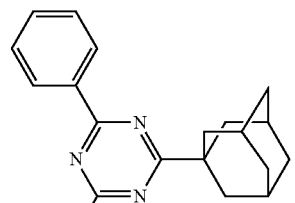

54
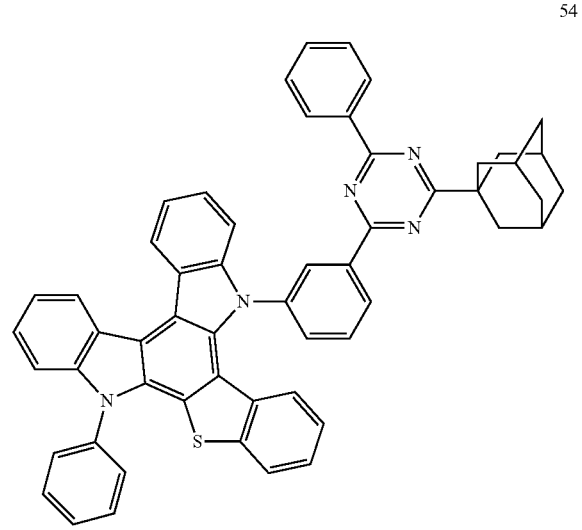
55
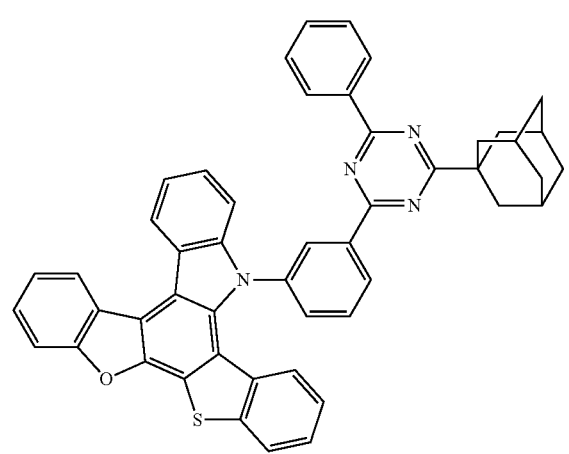
56
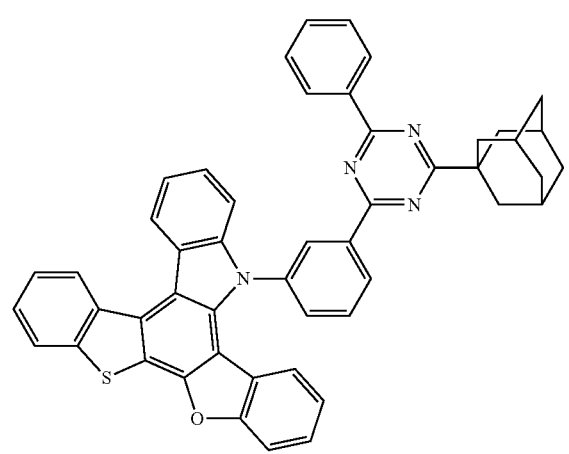
57
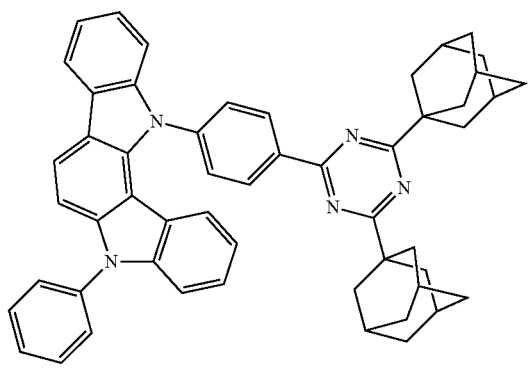
58
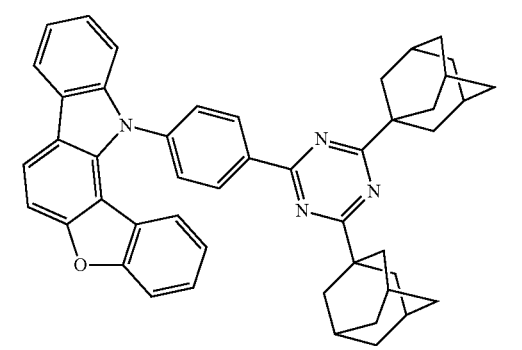
59
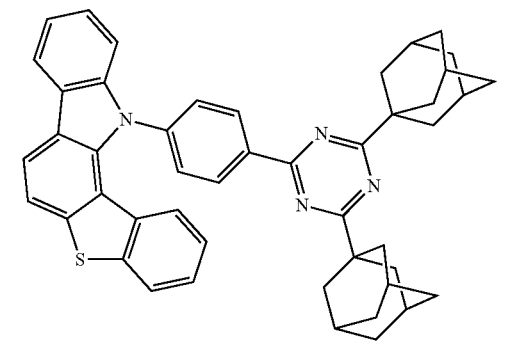
60
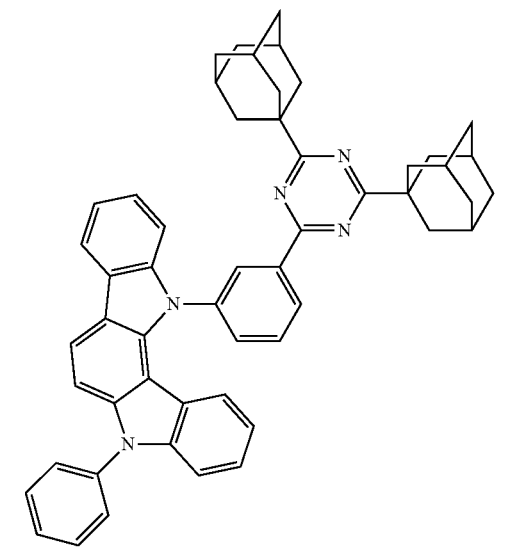

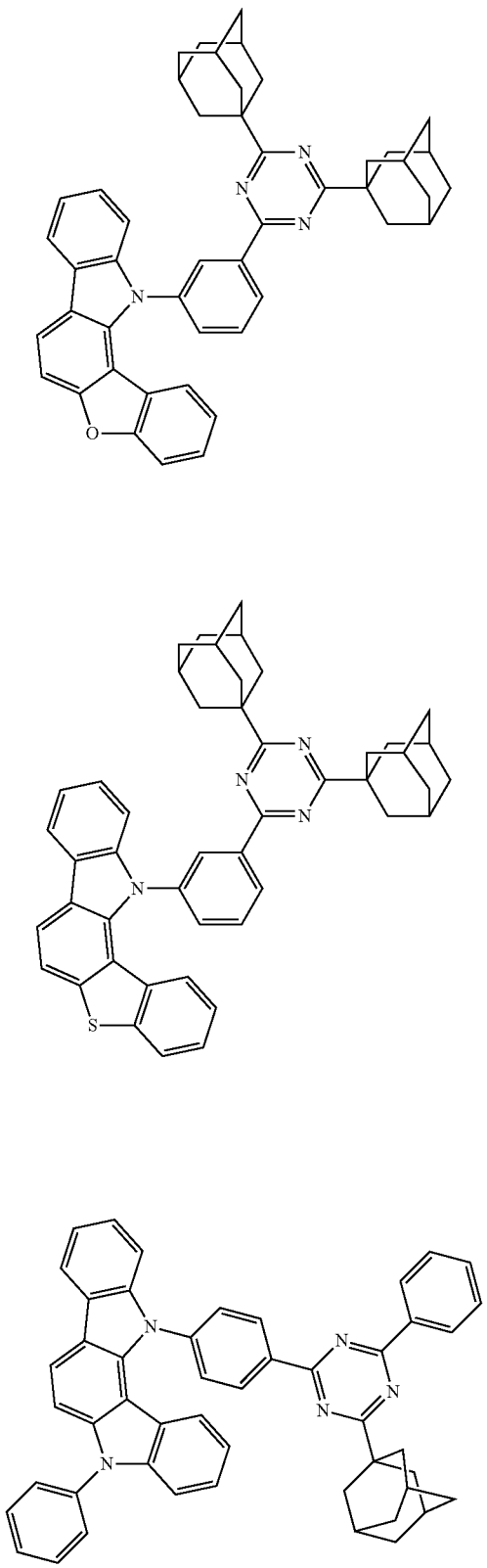
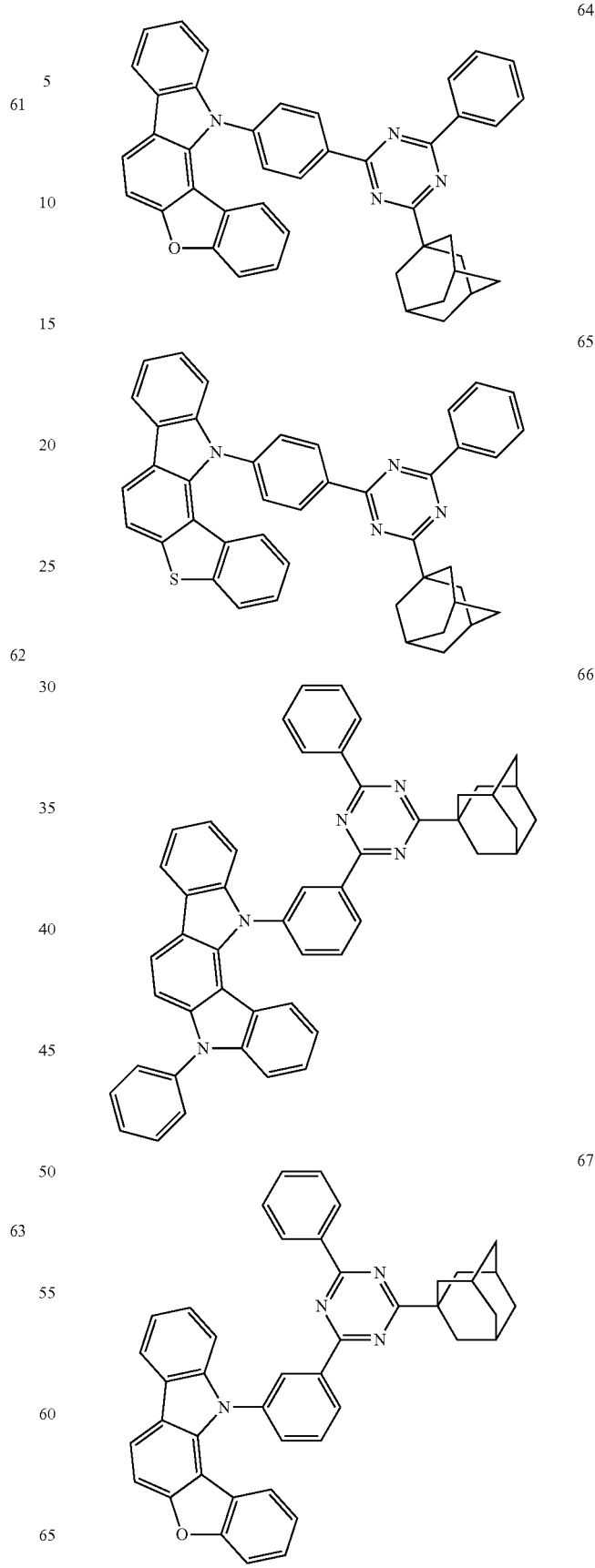

68
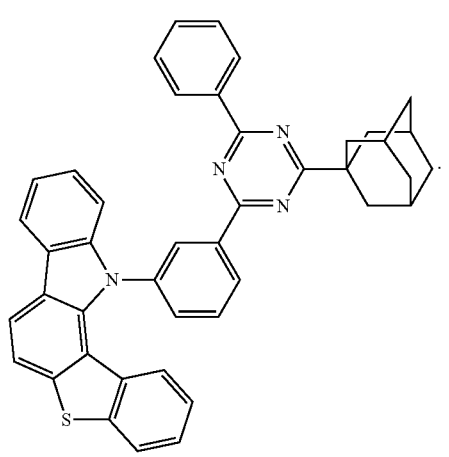
* * * * *

UNITED STATES PATENT AND TRADEMARK OFFICE
CERTIFICATE OF CORRECTION

PATENT NO. : 11,527,726 B2  
APPLICATION NO. : 16/928610  
DATED : December 13, 2022  
INVENTOR(S) : Ryuhei Furue et al.

Page 1 of 2

It is certified that error appears in the above-identified patent and that said Letters Patent is hereby corrected as shown below:

In the Claims

Column 67, Line 2, Claim 5 Delete "2-2" and insert --2-3--.

Column 68, Line 6, Claim 7 Delete "2-20:" and insert --2-2C:--.

Column 68, approx. Lines 35-45, Claim 7, Formula 2-2C Delete

" 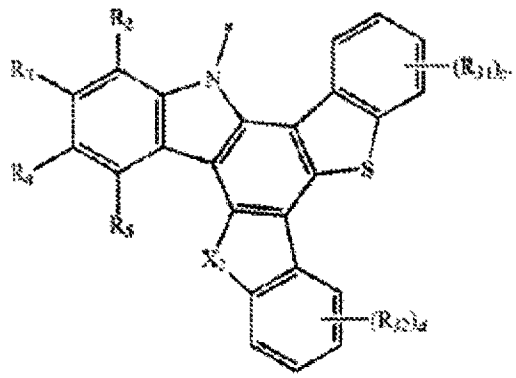 " and insert

-- 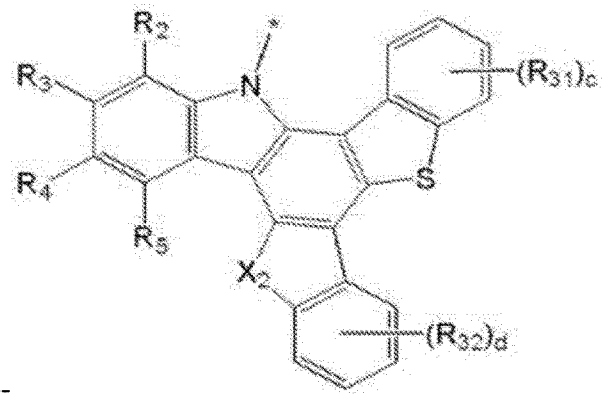 --.

Signed and Sealed this  
Twenty-eighth Day of March, 2023

*Katherine Kelly Vidal*

Katherine Kelly Vidal  
*Director of the United States Patent and Trademark Office*

CERTIFICATE OF CORRECTION (continued)
U.S. Pat. No. 11,527,726 B2

Column 68, Line 52, Claim 8 Delete "2-3:" and insert --2-3C:--.

Column 69, Line 35, Claim 8 Delete "2-30," and insert --2-3C,--.

Column 95, Line 21, Claim 18 Delete "2-3:" and insert --2-3C:--.

Column 95, approx. Lines 49-59, Claim 18, Formula 2-3C Delete " 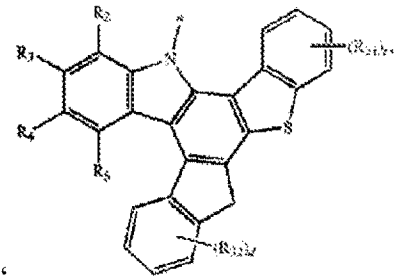 "

and insert -- 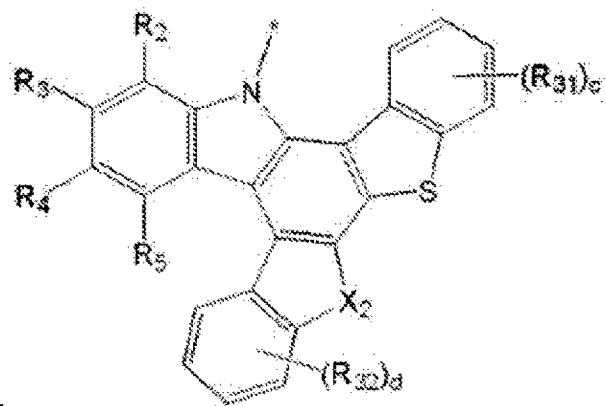 --.